US012796052B2

(12) United States Patent
Xu et al.

(10) Patent No.: US 12,796,052 B2
(45) Date of Patent: Nov. 10, 2026

(54) SEMICONDUCTOR DEVICES INCLUDING VERTICALLY-ORIENTED PILLARS

(71) Applicant: YANGTZE MEMORY TECHNOLOGIES CO., LTD., Wuhan (CN)

(72) Inventors: Wenxiang Xu, Wuhan (CN); Fandong Liu, Wuhan (CN); Wenyu Hua, Wuhan (CN); Ya Wang, Wuhan (CN); Dongmen Song, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 453 days.

(21) Appl. No.: 18/225,588

(22) Filed: Jul. 24, 2023

(65) Prior Publication Data

US 2024/0038856 A1 Feb. 1, 2024

Related U.S. Application Data

(60) Provisional application No. 63/393,756, filed on Jul. 29, 2022.

(30) Foreign Application Priority Data

Jul. 18, 2023 (CN) ......................... 202310886570.4

(51) Int. Cl.
*H10D 64/23* (2025.01)
*H10D 64/01* (2025.01)
(Continued)

(52) U.S. Cl.
CPC ........... *H10D 64/252* (2025.01); *H10D 64/01* (2025.01); *H10D 84/0149* (2025.01);
(Continued)

(58) Field of Classification Search
CPC . H01L 21/02428–0243; H01L 23/5283; H01L 21/76895; H01L 21/76898;
(Continued)

(56) References Cited

U.S. PATENT DOCUMENTS 5,783,479 A * 7/1998 Lin .................... H10D 30/0212
257/E21.44
6,383,882 B1 * 5/2002 Lee .................... H10D 64/0131
438/303

(Continued)

*Primary Examiner* — Maliheh Malek
(74) *Attorney, Agent, or Firm* — BAYES PLLC

(57) ABSTRACT

A semiconductor device includes a first vertically-oriented semiconductor pillar having one or more sidewalls, and a top surface, the first vertically-oriented semiconductor pillar having a first width, a first dielectric material abutted to the one or more sidewalls of the first vertically-oriented semiconductor pillar, and a first conductive structure having a first surface, and having a second width that is greater than the first width, the first conductive structure disposed such that a second portion of its first surface is in electrical contact with the top surface of the first vertically-oriented semiconductor pillar, wherein a first portion of the first surface of the first conductive structure extends laterally beyond the top surface of the first vertically-oriented semiconductor pillar, and the second portion of the first surface is disposed on the first dielectric material.

20 Claims, 45 Drawing Sheets

(51) Int. Cl.
*H10D 84/01* (2026.01)
*H10D 84/03* (2025.01)
*H10D 84/83* (2025.01)

(52) U.S. Cl.
CPC ....... *H10D 84/0151* (2025.01); *H10D 84/016* (2025.01); *H10D 84/038* (2025.01); *H10D 84/83* (2025.01)

(58) Field of Classification Search
CPC .. H01L 23/5226; H10D 64/252; H10D 64/01; H10D 84/0149; H10D 84/0151; H10D 84/016; H10D 84/038; H10D 84/83; H10D 84/837; H10B 12/05; H10B 12/00–50; G11C 11/401–4099; G11C 14/0009–0045; G11C 2211/4016; H10W 20/023; H10W 20/0698; H10W 20/42; H10W 20/435
See application file for complete search history.

(56) References Cited

U.S. PATENT DOCUMENTS

| | | | | |
|---|---|---|---|---|
| 7,112,498 | B2 * | 9/2006 | Jung | H10D 64/01308 438/303 |
| 8,692,373 | B2 * | 4/2014 | Lazzari | H10D 62/117 438/270 |
| 8,841,717 | B2 * | 9/2014 | Mikasa | H10B 12/485 257/E29.345 |
| 9,224,807 | B2 * | 12/2015 | Lazzari | H10D 62/117 |
| 9,425,283 | B2 * | 8/2016 | Kim | H10B 63/34 |
| 9,673,100 | B2 * | 6/2017 | Hung | H10D 30/6219 |
| 10,872,805 | B2 * | 12/2020 | Chang | H10D 64/017 |
| 11,170,834 | B2 * | 11/2021 | Mutch | G11C 11/221 |
| 11,672,128 | B2 * | 6/2023 | Mariani | H10B 53/30 257/295 |
| 12,035,536 | B2 * | 7/2024 | Servalli | H10B 51/50 |
| 12,167,586 | B2 * | 12/2024 | Servalli | H10B 12/315 |
| 2007/0228434 | A1 * | 10/2007 | Shimojo | G11C 11/22 257/296 |
| 2010/0270611 | A1 * | 10/2010 | Masuoka | H10D 30/025 257/329 |
| 2010/0308296 | A1 * | 12/2010 | Pirovano | H10B 63/80 438/329 |
| 2011/0001114 | A1 * | 1/2011 | Zanderighi | H10N 70/8828 438/584 |
| 2011/0073925 | A1 * | 3/2011 | Park | H10B 12/482 257/306 |
| 2013/0146958 | A1 * | 6/2013 | Kim | H10B 12/03 257/E29.345 |
| 2013/0320542 | A1 * | 12/2013 | Chang | H10B 12/482 438/653 |
| 2014/0061778 | A1 * | 3/2014 | Myung | H10B 12/053 257/329 |
| 2014/0183703 | A1 * | 7/2014 | Lazzari | H10D 62/117 257/618 |
| 2014/0306352 | A1 * | 10/2014 | Zhang | H10P 50/73 257/774 |
| 2015/0188040 | A1 * | 7/2015 | Zanderighi | H10B 63/32 257/5 |
| 2015/0228751 | A1 * | 8/2015 | Kim | H10B 63/34 438/586 |
| 2015/0332962 | A1 * | 11/2015 | Chen | H10D 30/0225 438/653 |
| 2016/0322468 | A1 * | 11/2016 | Lu | H10D 30/62 |
| 2017/0194211 | A1 * | 7/2017 | Lai | H10D 30/0223 |
| 2017/0373161 | A1 * | 12/2017 | Schroeder | H10D 30/024 |
| 2018/0076139 | A1 * | 3/2018 | Liu | H10W 20/033 |
| 2018/0197870 | A1 * | 7/2018 | Balakrishnan | H10B 53/30 |
| 2020/0381290 | A1 * | 12/2020 | Ramaswamy | H10D 1/716 |
| 2020/0411528 | A1 * | 12/2020 | Sung | H10B 12/036 |
| 2021/0098468 | A1 * | 4/2021 | Chen | H10B 10/12 |
| 2021/0210491 | A1 * | 7/2021 | Servalli | H10B 12/488 |
| 2022/0020756 | A1 * | 1/2022 | Mariani | H10B 53/30 |
| 2022/0157720 | A1 * | 5/2022 | Yang | H10D 84/0149 |
| 2023/0354584 | A1 * | 11/2023 | Han | H10B 12/482 |
| 2024/0072051 | A1 * | 2/2024 | Anderson | H10D 84/85 |
| 2024/0186319 | A1 * | 6/2024 | Hua | H10B 12/05 |
| 2024/0188272 | A1 * | 6/2024 | Kanazawa | H10B 10/12 |
| 2024/0349478 | A1 * | 10/2024 | Simsek-Ege | H10B 12/482 |
| 2024/0371651 | A1 * | 11/2024 | Huang | H10P 50/73 |
| 2025/0040125 | A1 * | 1/2025 | Tang | H10B 12/0387 |
| 2025/0126776 | A1 * | 4/2025 | Jia | H10B 12/00 |
| 2025/0287564 | A1 * | 9/2025 | Huo | H10B 12/05 |
| 2025/0294723 | A1 * | 9/2025 | Xu | H10B 12/053 |
| 2025/0294728 | A1 * | 9/2025 | Xu | H10B 12/053 |

* cited by examiner

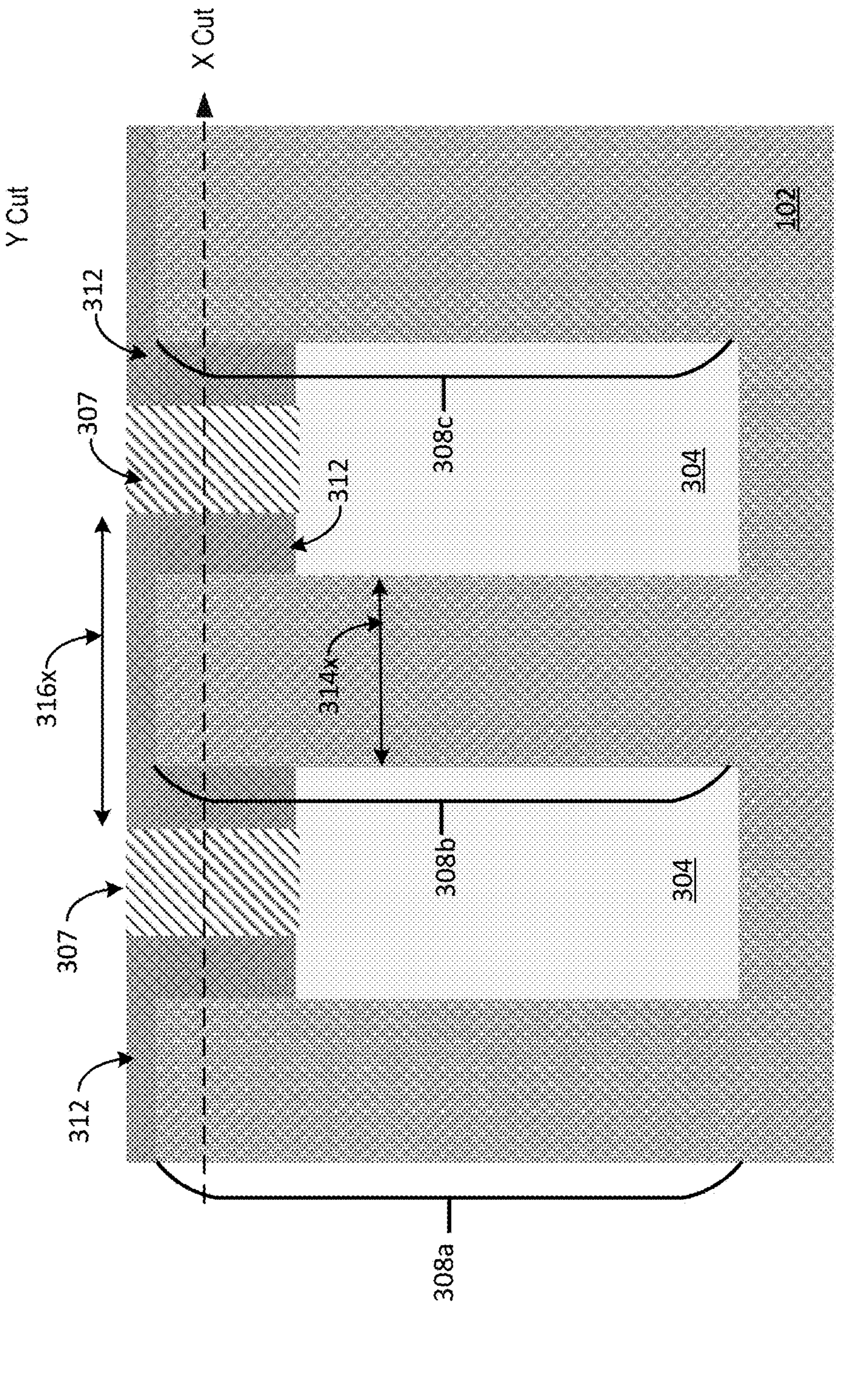
FIG. 3J
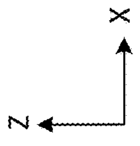

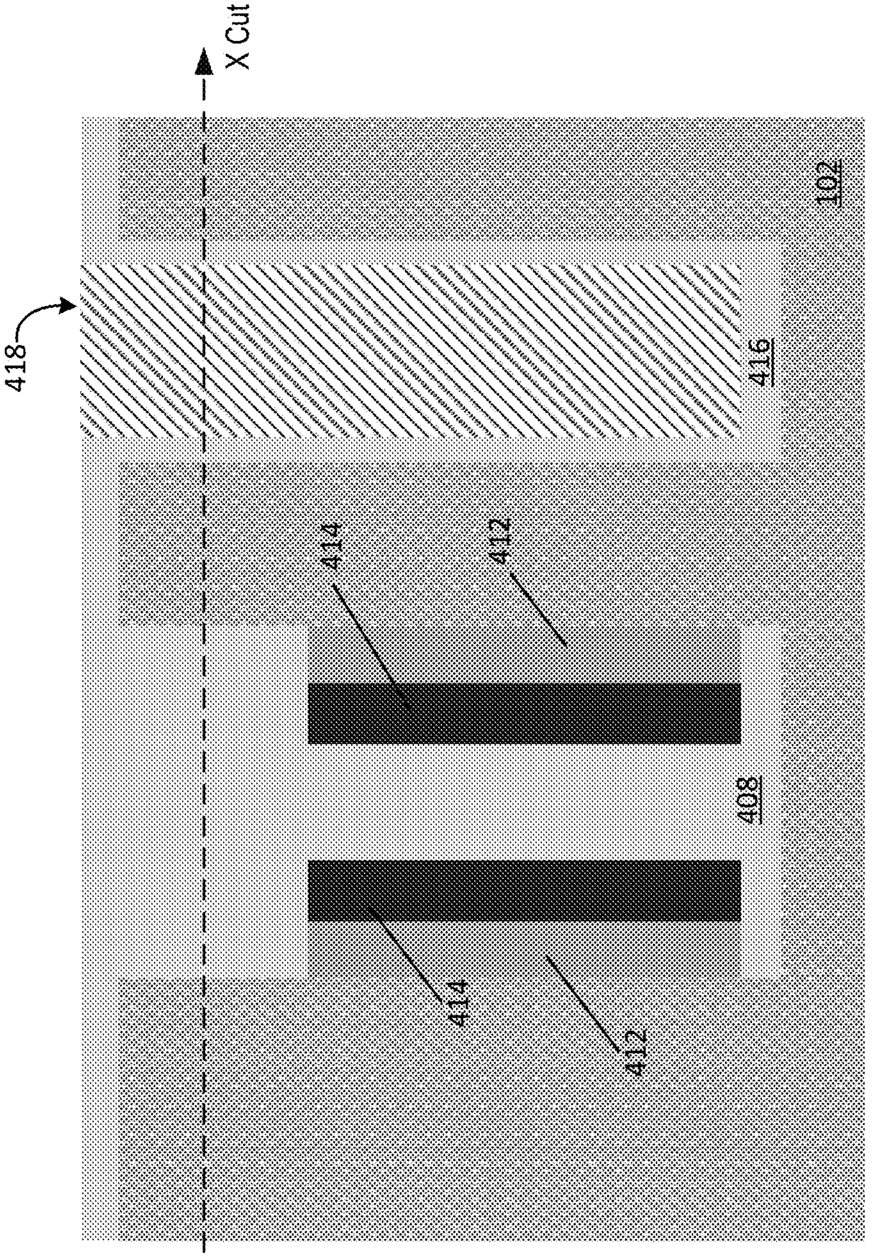
FIG. 4C
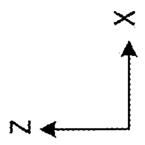

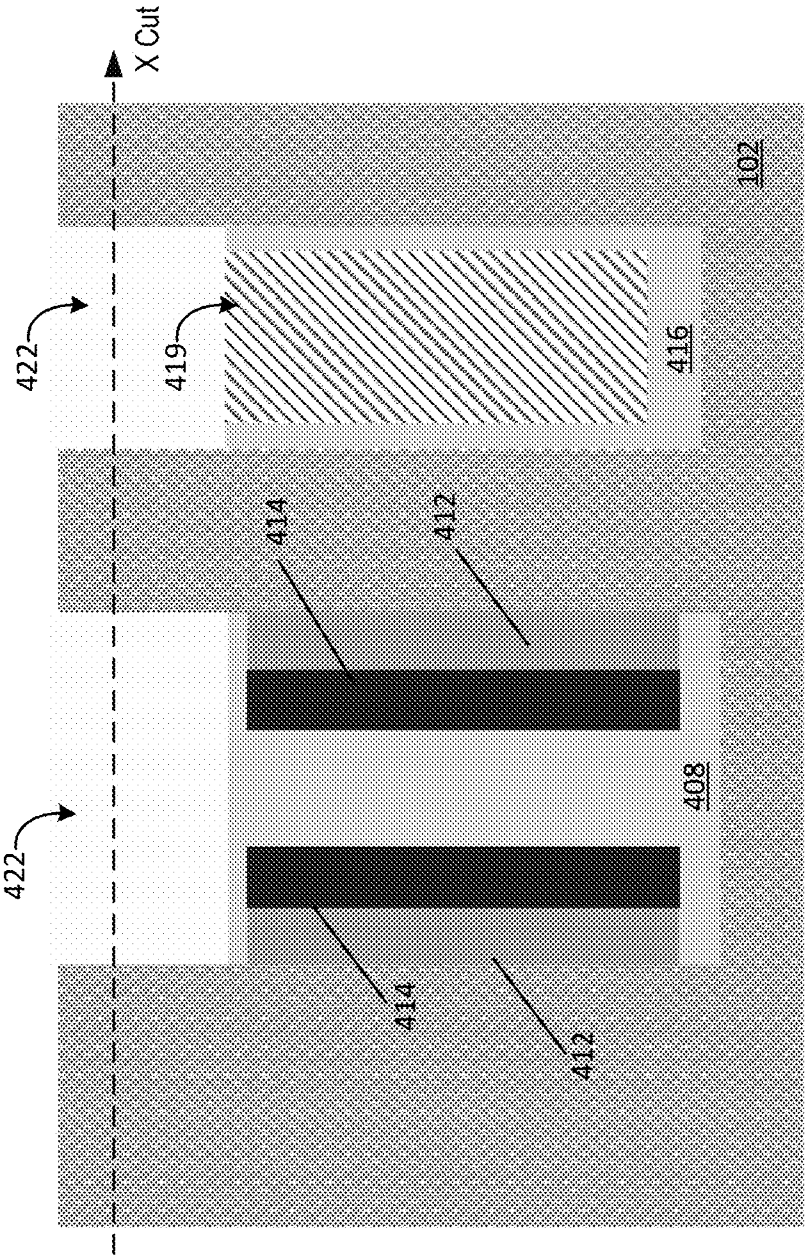
FIG. 4I
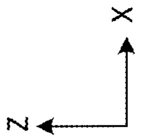

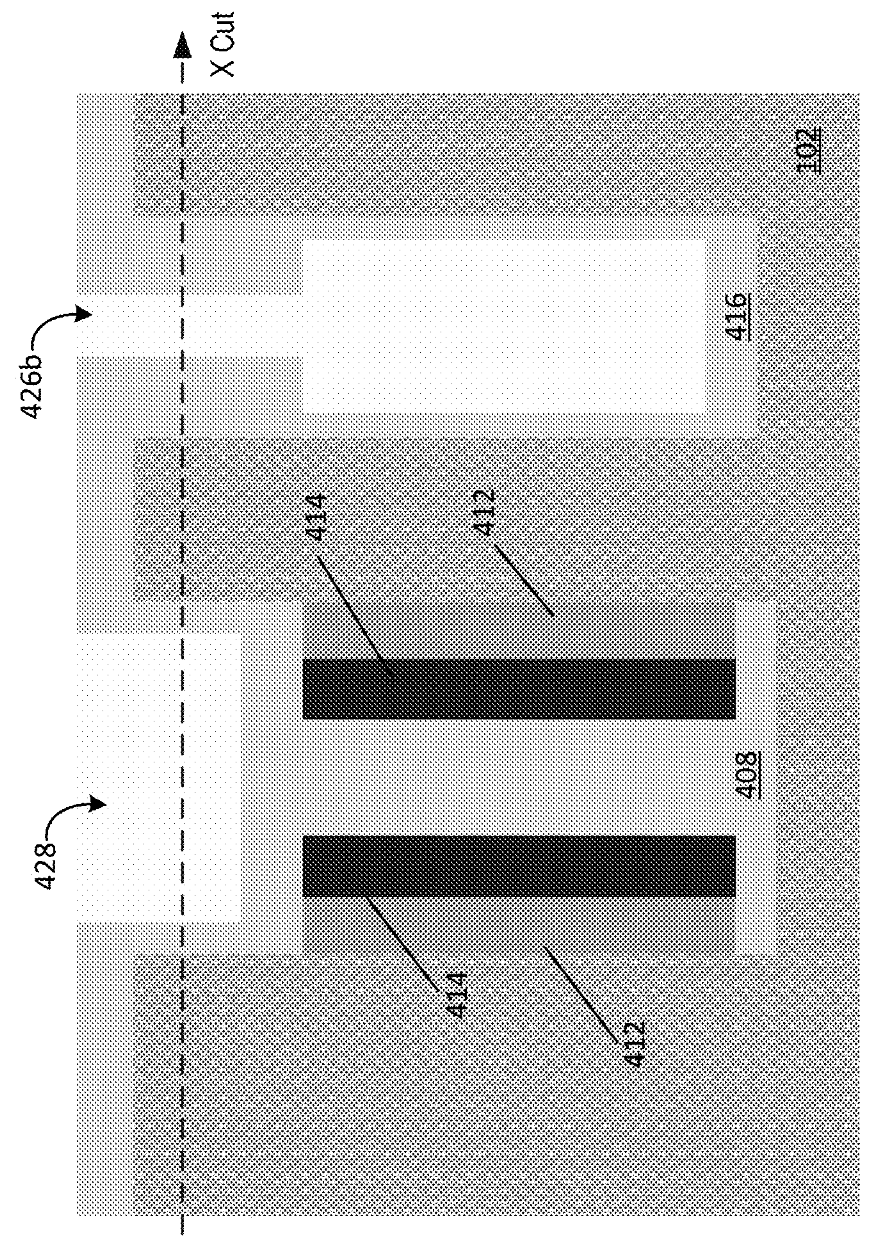
FIG. 4O
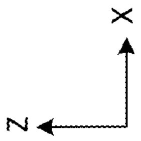

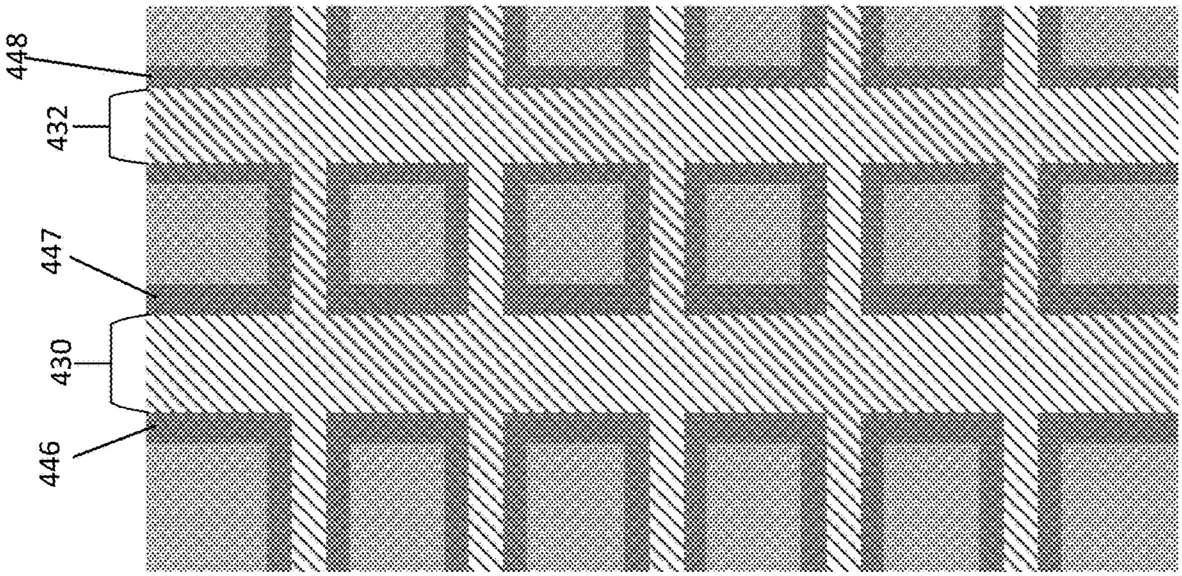
FIG. 4V
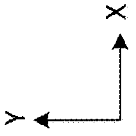

SEMICONDUCTOR DEVICES INCLUDING VERTICALLY-ORIENTED PILLARS

CROSS-REFERENCE TO RELATED APPLICATIONS

This application claims the benefit of priorities to C.N. Application No. 202310886570.4, filed on Jul. 18, 2023, and U.S. Provisional Application No. 63/393,756, filed on Jul. 29, 2022, both of which are incorporated herein by reference in their entireties.

BACKGROUND

This disclosure relates to semiconductor devices and methods of manufacturing semiconductor devices.

Many semiconductor devices, such as integrated circuits, include transistors and various interconnect lines. Transistors may be connected with each other and with other electrical components by interconnect lines. Since transistors and interconnect lines may be disposed at different levels, i.e., different distances from the substrate on which an integrated circuit is fabricated, it is necessary to conduct electrical signals vertically as well as horizontally. Structures referred to as vias may be used to provide an electrically conductive path between one level of an integrated circuit and another level. Interconnect lines and vias both have a resistance associated therewith, and the magnitude of these resistances depends on several factors including the materials from which they are fabricated, and the width, length, and thickness of these electrically conductive structures.

SUMMARY

According to one aspect of this disclosure, a structure includes a first vertically-oriented semiconductor pillar having one or more sidewalls, and a top surface, the first vertically-oriented semiconductor pillar having a first width, a first dielectric material abutted to the one or more sidewalls of the first vertically-oriented semiconductor pillar; and a first conductive structure having a first surface, and having a second width that is greater than the first width, the first conductive structure disposed such that a second portion of its first surface is in electrical contact with the top surface of the first vertically-oriented semiconductor pillar, wherein a first portion of first surface of the first conductive structure extends laterally beyond the top surface of the first vertically-oriented semiconductor pillar, and the second portion of the first surface is disposed on the first dielectric material.

In some implementations, the first vertically-oriented semiconductor pillar is integral with a semiconductor substrate.

In some implementations, the structure further includes a second vertically-oriented semiconductor pillar having one or more sidewalls, and a top surface, wherein the second vertically-oriented semiconductor pillar is abutted on at least one of its one or more sidewalls by at least the first dielectric material, wherein a first portion of a second conductive structure is disposed on the top surface of the second vertically-oriented semiconductor pillar, and is in electrical contact therewith, and wherein the first conductive structure includes a first metal silicide structure, and the second conductive structure comprises a second metal silicide structure.

In some implementations, the structure further includes a first dielectric plug disposed between the first metal silicide structure and the second metal silicide structure.

In some implementations, the first dielectric plug comprises silicon nitride.

In some implementations, the first metal silicide structure has an area that is greater than an area of the top surface of the first vertically-oriented semiconductor pillar, and the second metal silicide structure has an area that is greater than the top surface of the second vertically-oriented semiconductor pillar.

In some implementations, the first metal silicide structure has a resistivity that is less than a resistivity of the first vertically-oriented semiconductor pillar, and the second metal silicide structure has a resistivity that is less than a resistivity of the second vertically-oriented semiconductor pillar.

In some implementations, the structure further includes a first dielectric plug disposed on the first dielectric material.

According to another aspect of this disclosure, a structure includes a first vertically-oriented semiconductor pillar, a second vertically-oriented semiconductor pillar, and a third vertically-oriented semiconductor pillar, the first, second, and third vertically-oriented semiconductor pillars each having at least one sidewall, and each having a corresponding top surface, a first vertically-oriented gate structure disposed adjacent to the at least one sidewall of the first vertically-oriented semiconductor pillar, a first dielectric structure having a top surface, comprising a first dielectric material disposed adjacent to the first vertically-oriented gate structure, a second dielectric structure comprising a second dielectric material disposed adjacent to the top surface of the first dielectric structure, and a first metal silicide structure, a first portion of which is disposed above a first portion of the top surface of the first dielectric structure, and a second portion of which is in electrical contact with the first vertically-oriented semiconductor pillar.

In some implementations, the structure further includes a second vertically-oriented gate structure disposed adjacent to a second sidewall of the at least one sidewall of the second vertically-oriented semiconductor pillar, and a third dielectric structure comprising a first lining layer and a second lining layer, wherein the first lining layer is disposed adjacent to a first sidewall of the second vertically-oriented semiconductor pillar and is further disposed adjacent to a first sidewall of the third vertically-oriented semiconductor pillar, and the second lining layer is disposed adjacent to the first lining layer.

In some implementations, the first lining layer comprises the first dielectric material, and the second lining layer comprises the second dielectric material.

In some implementations, the first dielectric material comprises silicon oxide, and the second dielectric material comprises silicon nitride.

In some implementations, the second lining layer encloses an air gap.

In some implementations, the structure further includes a second metal silicide structure, a first portion of which is disposed above a second portion of the top surface of the first dielectric structure, and a second portion of which is disposed above a first portion of the third dielectric structure.

According to a further aspect of this disclosure, a structure includes a first vertically-oriented first sidewall, and a first vertically-oriented gate structure disposed adjacent to the first vertically-oriented first sidewall, a second vertically-oriented first sidewall, a second vertically-oriented second sidewall, a dielectric liner disposed on the second vertically-oriented first sidewall and on the second vertically-oriented second sidewall, a first metal silicide structure, a first portion of which is disposed over a first portion of a first region defined by a distance between the first vertically-oriented first sidewall and the first vertically-oriented second sidewall, the first metal silicide structure having a top surface, and a second metal silicide structure, a first portion of which is disposed over a second portion of the first region defined by a distance between the first vertically-oriented first sidewall and the first vertically-oriented second sidewall, and a second portion of which is disposed over a first portion of a second region defined by a distance between the second vertically-oriented first sidewall and a second vertically-oriented second sidewall, the second metal silicide structure having a top surface, wherein the first portion of the first region is adjacent to the first vertically-oriented first sidewall, the second portion of the first region is adjacent to the first vertically-oriented second sidewall, and the first portion of the second region is adjacent to the second vertically-oriented first sidewall.

In some implementations, the first vertically-oriented gate structure comprises a gate dielectric and a gate electrode, the dielectric liner comprises silicon oxide, and a dielectric plug is disposed between the first metal silicide structure and the second metal silicide structure.

In some implementations, the dielectric plug comprises silicon nitride.

In some implementations, the structure further includes an air gap sealer structure.

In some implementations, the air gap sealer structure comprises silicon nitride.

In some implementations, the structure further includes a semiconductor pillar having a top surface, and an area of the top surface of the semiconductor pillar is less than an area of the top surface of the second metal silicide structure.

According to a further aspect of this disclosure, a memory system includes a memory device, and a memory controller coupled to the memory device, wherein the memory device includes a first vertically-oriented first sidewall, and a first vertically-oriented gate structure disposed adjacent to the first vertically-oriented first sidewall, a second vertically-oriented first sidewall, a second vertically-oriented second sidewall, a first metal silicide structure, a first portion of which is disposed over a first portion of a first region defined by a distance between the first vertically-oriented first sidewall and the first vertically-oriented second sidewall, the first metal silicide structure having a top surface, and a second metal silicide structure, a first portion of which is disposed over a second portion of the first region defined by a distance between the first vertically-oriented first sidewall and the first vertically-oriented second sidewall, and a second portion of which is disposed over a first portion of a second region defined by a distance between the second vertically-oriented first sidewall and a second vertically-oriented second sidewall, the second metal silicide structure having a top surface, wherein the first portion of the first region is adjacent to the first vertically-oriented first sidewall, the second portion of the first region is adjacent to the first vertically-oriented second sidewall, and the first portion of the second region is adjacent to the second vertically-oriented first sidewall.

In some implementations, the memory device includes a plurality of memory cells, and each memory cell of the plurality of memory cells includes at least one vertically-oriented gate structure.

In some implementations, the at least one vertically-oriented gate structure of each memory cell of the plurality of memory cells includes a source/drain terminal having an enlarged metal silicide portion.

In some implementations, the memory cells are dynamic random access memory (DRAM) cells.

In some implementations, the memory controller comprises a DRAM controller.

In some implementations, the memory controller is further coupled to a host computer.

In one implementation, a method of making a semiconductor device includes forming an insulating structure on a substrate, the insulating structure having a plurality of intersecting rows and columns comprising a first dielectric material disposed in the substrate, wherein the plurality of intersecting rows and columns surround and are in contact with a corresponding plurality of semiconductor pillars, forming an isolation structure having a plurality of intersecting rows and columns including a second dielectric material disposed on the insulating structure, wherein the isolation structure is spaced apart from the semiconductor pillars, and forming a plurality of enlarging structures, each enlarging structure disposed on a top surface of a corresponding semiconductor pillar, adjacent to an upper side portion of the corresponding semiconductor pillar, and adjacent to the isolation structure, such that each enlarging structure is separated from every other enlarging structure.

In some implementations, the method further includes performing a silicidation operation, wherein each enlarging structure is converted into a metal silicide.

In some implementations, the first dielectric material and the second dielectric material have different etch characteristics.

In some implementations, the substrate includes a semiconductor material, and performing the silicidation operation further includes converting at least a portion of each of the plurality of the semiconductor pillars into the metal silicide.

In some implementations, the substrate includes a semiconductor material, the first dielectric material includes silicon oxide, and the second dielectric material includes silicon nitride.

In some implementations, each of the plurality of enlarging structures includes polycrystalline silicon. Polycrystalline silicon may also be referred to as polysilicon.

In some implementations, each of the plurality of enlarging structures comprises silicon germanium.

In some implementations, forming each of the plurality of enlarging structures includes epitaxially growing the plurality of enlarging structures.

In some implementations, the method further includes planarizing the epitaxially grown enlarging structures.

In some implementations, the forming the plurality of enlarging structures includes depositing a blanket layer of polycrystalline silicon, and planarizing the blanket layer of polycrystalline silicon such that a top surface of the polycrystalline silicon is nominally coplanar with the top surface of the isolation structure.

In another implementation, a method of making a semiconductor device includes forming a first trench in a substrate, the first trench having vertically-oriented sidewalls, forming a first vertically-oriented gate dielectric layer on a first sidewall of the first trench, forming a first vertically-oriented gate electrode on the first vertically-oriented gate dielectric layer, forming a second trench in the substrate parallel to the first trench, the second trench having vertically-oriented sidewalls, and disposing a layer of semiconductor material adjacent to a top surface of the substrate and adjacent to an upper portion of the first sidewall of the first trench, an upper portion of a second sidewall of the first trench, and an upper portion of a first sidewall of the second trench, wherein the semiconductor material adjacent to the upper portion of the first sidewall of the first trench is not in direct contact with the semiconductor material adjacent to the upper portion of the second sidewall of the first trench.

In some implementations, the method further includes forming a first insulating structure disposed in the second trench, the first insulating structure having a first liner layer of a first dielectric material, and a first plug having a first top surface and a bottom surface, the first plug including a second dielectric material, removing an upper portion of the first plug to form a lower portion of the first plug having a second top surface, forming a planarized layer of the first dielectric material over the substrate, removing a first portion of the planarized layer such that at least a portion of the second top surface is exposed, removing the lower portion of the first plug to form a first air gap, and forming a liner structure, a first portion of which is disposed within the first air gap to form a sealed second air gap, a second portion of which extends upwardly from the sealed second air gap.

In some implementations, the first trench is wider than the second trench, and the method further includes forming a second vertically-oriented gate dielectric layer on a second sidewall of the first trench, and forming a second gate electrode on the second vertically-oriented gate dielectric layer.

In some implementations, the method further includes converting the layer of semiconductor material to a metal silicide.

In some implementations, the method further includes converting a portion of the substrate adjacent to the layer of semiconductor material to the metal silicide.

In another implementation, a method for making a semiconductor device includes forming, on a semiconductor substrate, a first semiconductor pillar having a first top surface, the first semiconductor pillar having a first width and a first height, forming an isolation structure adjacent to the first semiconductor pillar, wherein the isolation structure has a lower portion and an upper portion, a width of the upper portion being less than a width of the lower portion, forming a layer of semiconductor material on an upper side portion of the first semiconductor pillar such that a width of the layer of semiconductor material on the upper side portion of the first semiconductor pillar is defined by a distance between the upper side portion of the first semiconductor pillar and the upper portion of the isolation structure, and performing a silicidation operation to convert the layer of semiconductor material to a metal silicide.

In some implementations, the upper portion of the isolation structure includes a first material, the lower portion of the isolation structure comprises a second material, and the first material is different from the second material.

In some implementations, forming the layer of semiconductor material includes depositing a layer of polycrystalline silicon.

In some implementations, forming the layer of semiconductor material includes epitaxially growing a layer of monocrystalline silicon.

In some implementations, the method further includes forming a sealed air gap having a silicon nitride liner structure.

These illustrative implementations are mentioned not to limit or define the present disclosure, but to provide examples to aid understanding thereof. Additional implementations are discussed in the Detailed Description, and further description is provided there.

BRIEF DESCRIPTION OF THE DRAWINGS

The accompanying drawings, which are incorporated herein and form a part of the specification, illustrate implementations of the present disclosure and, together with the description, further serve to explain the principles of this disclosure and to enable a person skilled in the pertinent art to make and use implementations of the present disclosure. It is noted that the features in the drawings are for illustrative purposes and are not necessarily drawn to scale.

FIG. 3J is a cross-sectional view showing the structure of FIG. 3H after polysilicon has been deposited over the structure of FIG. 3H, including over the semiconductor posts and over the top and sidewalls of the silicon nitride plugs, in accordance with this disclosure.

FIG. 4C is a cross-sectional view of a second intermediate structure formed during the process of manufacturing a structure in accordance with this disclosure.

FIG. 4I is a cross-sectional view of a fifth intermediate structure formed during a dielectric recess operation of the process of manufacturing a structure in accordance with this disclosure.

FIG. 4O is a cross-sectional view of an eighth intermediate structure showing the structure of FIG. 4M after silicon nitride removal.

FIG. 4V is a top view of the structure of FIG. 4U taken across the X-cut line.

Figure 1:
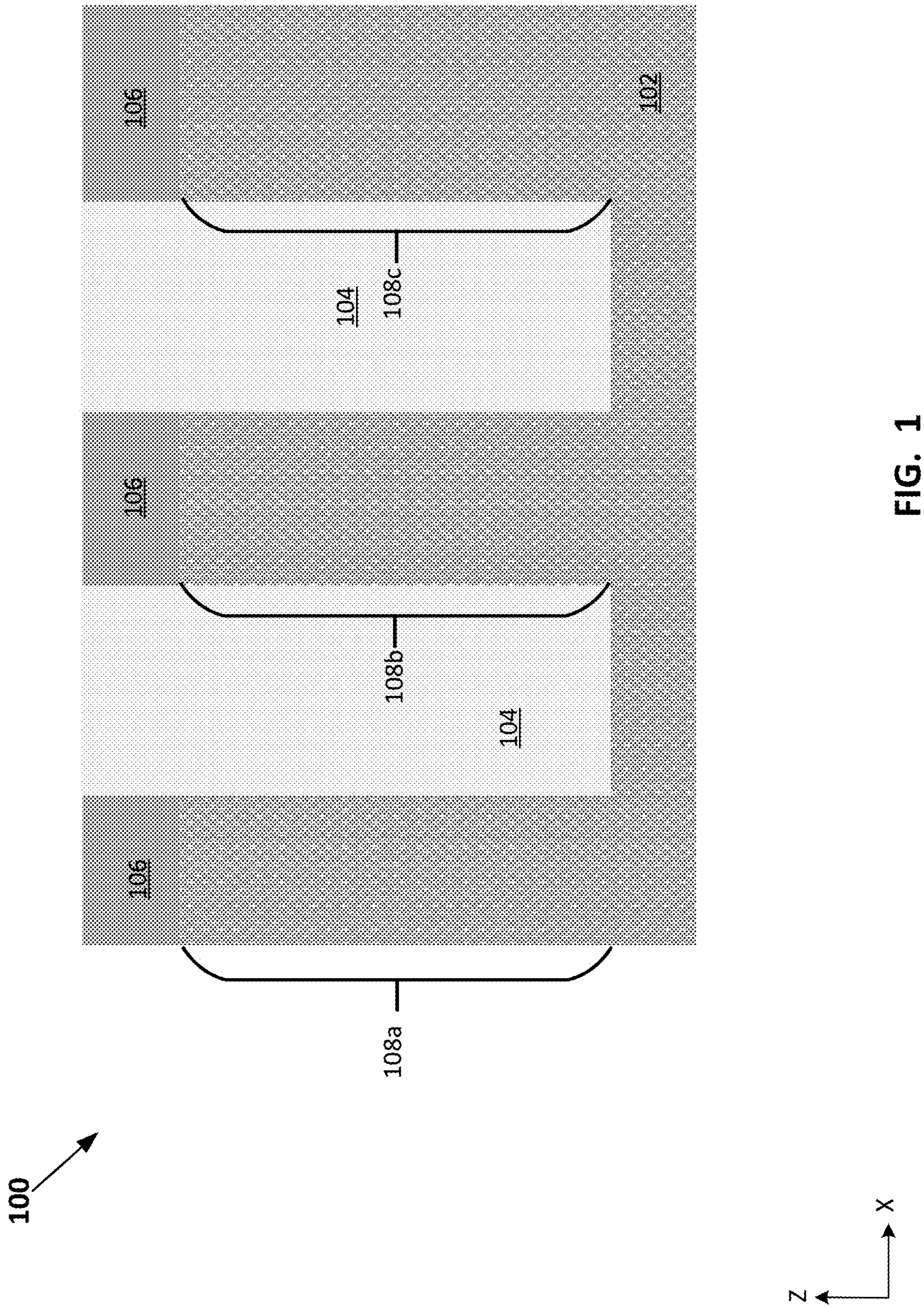
FIG. 1 is a cross-sectional representation of a portion of a semiconductor substrate having dielectric-filled trenches and vertically-oriented semiconductor posts, with the semiconductor posts each having a silicided top surface.

The present disclosure will be described with reference to the accompanying drawings.

DETAILED DESCRIPTION

Most field effect transistors (FETs) on integrated circuits have been fabricated in a planar arrangement, that is parallel to, and in contact with, a wafer substrate. However, modern semiconductor processes are often used to fabricate vertically-oriented FETs. Vertically-oriented FETs are nominally perpendicular to the wafer substrate, but still need to be in contact with a semiconductor "body" in which a FET's electrically conductive channel may be formed in response to an appropriate voltage applied to its gate terminal. The semiconductor body of a vertically-oriented FET may be provided by a vertically-oriented semiconductor structure such as a post, a pillar, or a fin, for example. A FET's gate dielectric may be formed on the vertically-oriented semiconductor structure, and the FET's gate electrode may be formed on the gate dielectric.

In some semiconductor manufacturing processes, the vertically-oriented semiconductor structure may be integral to the wafer substrate, that is one end of the vertically-oriented semiconductor structure is rooted in the wafer substrate, and the opposite end of the vertically-oriented semiconductor structure is disposed a distance away from the wafer substrate. That distance may be referred to as the "height" of a semiconductor post, or pillar, or fin.

To implement electrical circuitry on an integrated circuit having FETs, there is a need to connect to the gate terminal and to the source/drain terminals of FETs. Connection to at least one of a vertically-oriented FET's source/drain terminals, is typically made by a contact or via structure disposed between the vertically oriented semiconductor structure and an interconnect line.

As semiconductor manufacturing processes have advanced, the physical dimensions, i.e., the size, of various components and structures on integrated circuits have become smaller and smaller. In turn, these smaller dimensions may result in at least an increase in the resistance of contacts or vias to vertically-oriented semiconductor structures.

Various illustrative examples and implementations are presented herein to facilitate the understanding of the structures of, and methods for producing, enlarged electrically conductive regions, such as but not limited to, metal silicide regions. Such enlarged metal silicide regions may be useful at least for reducing contact resistance when making connections to a vertically-oriented semiconductor structure such as a semiconductor "post," "pillar," or "fin," for example.

It is noted that references in the specification to "one implementation," "an implementation," "an example implementation," "some implementation," etc., indicate that the implementation described may include a particular feature, structure, or characteristic, but every implementation may not necessarily include the particular feature, structure, or characteristic. Moreover, such phrases do not necessarily refer to the same implementation. Further, when a particular feature, structure or characteristic is described in connection with an implementation, it would be within the knowledge of a person skilled in the pertinent art to effect such feature, structure or characteristic in connection with other implementations whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the acronym "FET" refers to a field effect transistor. Although a FET is a four-terminal device when the semiconductor body is included, a simplified three-terminal FET model can be used herein for describing the circuit connection of a FET. In a three-terminal FET model, the FET has a gate terminal, a source terminal, and a drain terminal.

As used herein, the acronym "CMOS" refers to Complementary Metal Oxide Semiconductor. "CMOS process" refers to a semiconductor manufacturing process that produces both n-channel field effect transistors and p-channel field effect transistors on the same substrate. "CMOS circuit" refers to an electrical circuit that includes both an n-channel field effect transistor and a p-channel field effect transistor.

As used herein, the acronym "S/D" refers to source/drain.

Various implementations in accordance with this disclosure provide an improved interface between a semiconductor post (or pillar) and a via, where an enlarged conductive structure, such as a metal silicide region, is disposed on the semiconductor post (or pillar) and presents a larger interface region for a via than a conductive structure that is constrained to the size of the post (or pillar) alone.

FIG. 1 shows a metal silicide region disposed on a semiconductor post (or pillar) where the dimensions of the metal silicide region are constrained by the dielectric-filled trenches that are adjacent to the semiconductor post (or pillar).

FIG. 1 shows a structure 100 having a plurality of semiconductor posts with a silicide layer disposed on top of each semiconductor post. As shown in FIG. 1, the x and y dimensions of the metal silicide layer are nominally the same as the x and y dimensions of the semiconductor posts in structure 100. However, as semiconductor manufacturing processes advance, the dimensions of such semiconductor posts become smaller and smaller. And since structure 100 leads to the formation of silicide layers that are correspondingly smaller, the contact resistance of connections between the semiconductor posts and various interconnect levels increases, which in turn adversely affects circuit performance.

FIG. 1 is a cross-sectional representation of structure 100 including a portion of a semiconductor substrate 102 having dielectric-filled trenches 104 and vertically-oriented semiconductor posts 108*a*, 108*b*, 108*c*, with semiconductor posts 108*a*, 108*b*, 108*c* each having a silicided top layer 106, or more particularly a layer of silicide disposed at the top end (i.e., non-substrate end) of semiconductor posts 108*a*, 108*b*, 108*c*. Silicided top layers 106 may be a metal silicide such as, but not limited to, titanium silicide, tungsten silicide, cobalt silicide, nickel silicide, or molybdenum silicide, for example. Having a silicided top layer on each of semiconductor posts 108*a*, 108*b*, 108*c* is useful for reducing the contact resistance for connections to one or more of semiconductor posts 108*a*, 108*b*, 108*c*. Semiconductor posts 108*a*, 108*b*, 108*c* may also be referred to as "pillars." In some implementations of structure 100, dielectric-filled trenches 104 are filled with a dielectric material such as, but not limited to, silicon dioxide. Semiconductor substrate 102 may be, but is not limited to, a silicon substrate, a silicon germanium substrate, or a silicon carbide substrate, for example.

Figure 2A:
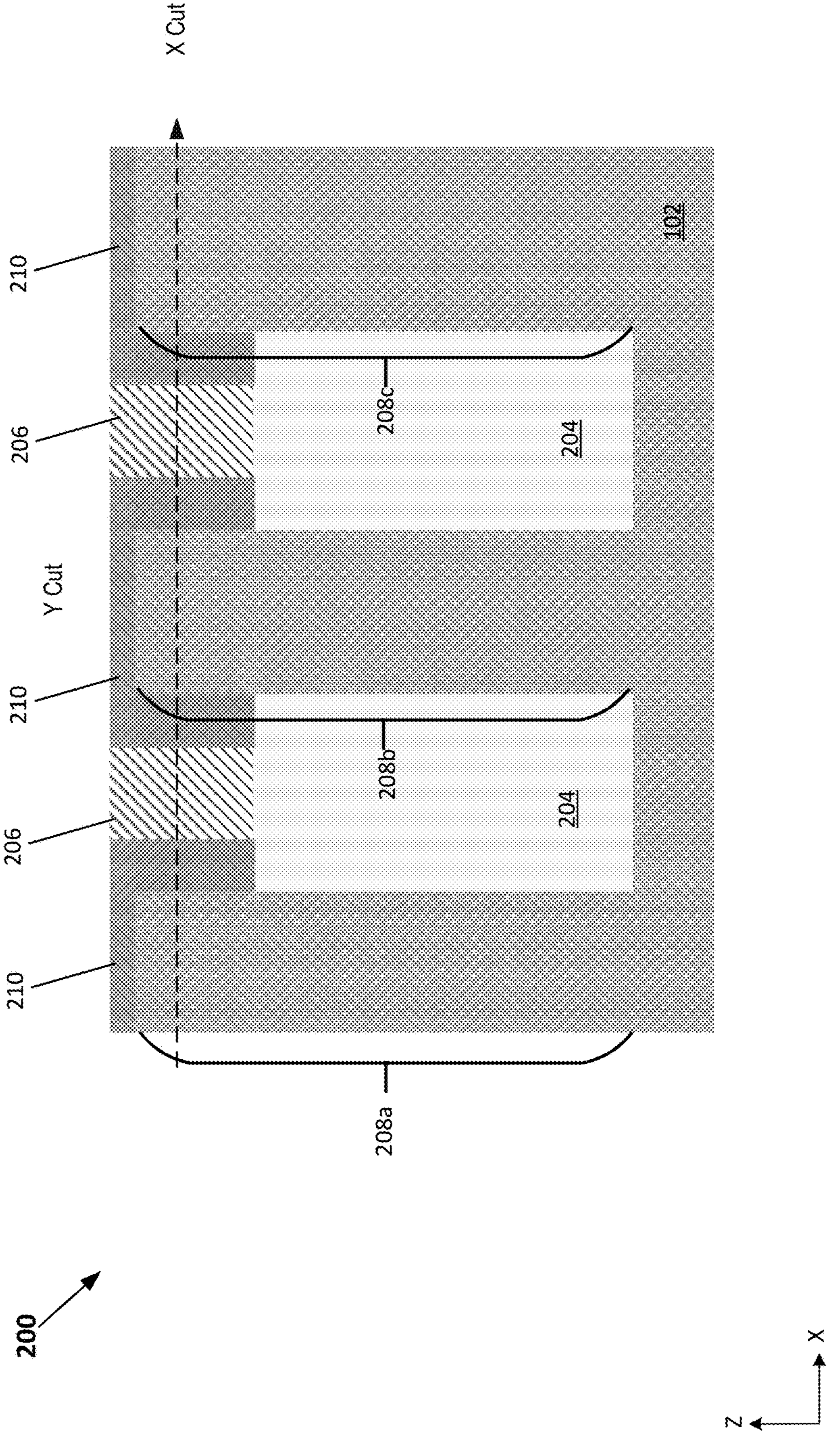
FIG. 2A is a cross-sectional view of a structure that has vertically-oriented semiconductor posts with the top surface and upper portions of the semiconductor posts sidewalls are covered with a material to provide a greater volume than the semiconductor post alone for the formation of a silicide in accordance with this disclosure.

FIG. 2A shows a structure 200 that may be used to overcome the contact resistance issues of structure 100 by providing an enlarged region of semiconductor material at a top end (i.e., not the substrate end) of a semiconductor post (or pillar) wherein the enlarged region can be converted to a metal silicide. As described further below, structure 200 provides a region of semiconductor material having x and y dimensions larger than the x and y dimensions of the semiconductor posts (or pillars). The enlarged region of semiconductor material is enabled by removing a portion of the dielectric filling in the trenches surrounding a semiconductor post (or pillar). In other words, the constraints on the size of the metal silicide region shown in FIG. 1, have been removed in structure 200 of FIG. 2A. Subsequently, the enlarged region of semiconductor material may be converted to a metal silicide having x and y dimensions greater than the x and y dimensions of the semiconductor post (or pillar).

FIG. 2A is a cross-sectional view of structure 200 that has trenches partially filled with a first dielectric material 204, and vertically-oriented semiconductor posts (or pillars) 208*a*, 208*b*, 208*c*, the sidewalls of which provide the trench boundaries. Semiconductor posts (or pillars) are integral with semiconductor substrate 102. In this illustrative implementation, the height (z-direction) of semiconductor posts 208*a*, 208*b*, 208*c* is greater than the height (z-direction) of first dielectric material 204. A dielectric structure 206, formed of a second dielectric material, is disposed on a top surface of first dielectric material 204. As shown in FIG. 2A, dielectric structure 206 is spaced apart from the sidewalls of semiconductor posts 208*a*, 208*b*, 208*c*. In various implementations, and as discussed in greater detail below, the etch characteristics of first dielectric material 204 are different from the etch characteristics of the second dielectric material.

Still referring to FIG. 2A, a semiconductor material 210 is disposed over the top surfaces of semiconductor posts 208*a*, 208*b*, 208*c* and along their sidewalls in the space bounded by (1) the sidewalls of semiconductor posts 208*a*, 208*b*, 208*c*, (2) the top surface of first dielectric material 204, and (3) the sidewalls of dielectric structure 206. In this illustrative implementation, semiconductor material 210 is planarized. Planarization of semiconductor material 210 may be achieved by any suitable means, including but not limited to chemical-mechanical polishing (CMP) or an etch-back process. Semiconductor material 210 may be, but is not limited to, polycrystalline silicon, epitaxially-grown silicon, or silicon germanium, to name a few examples.

Figure 2B:
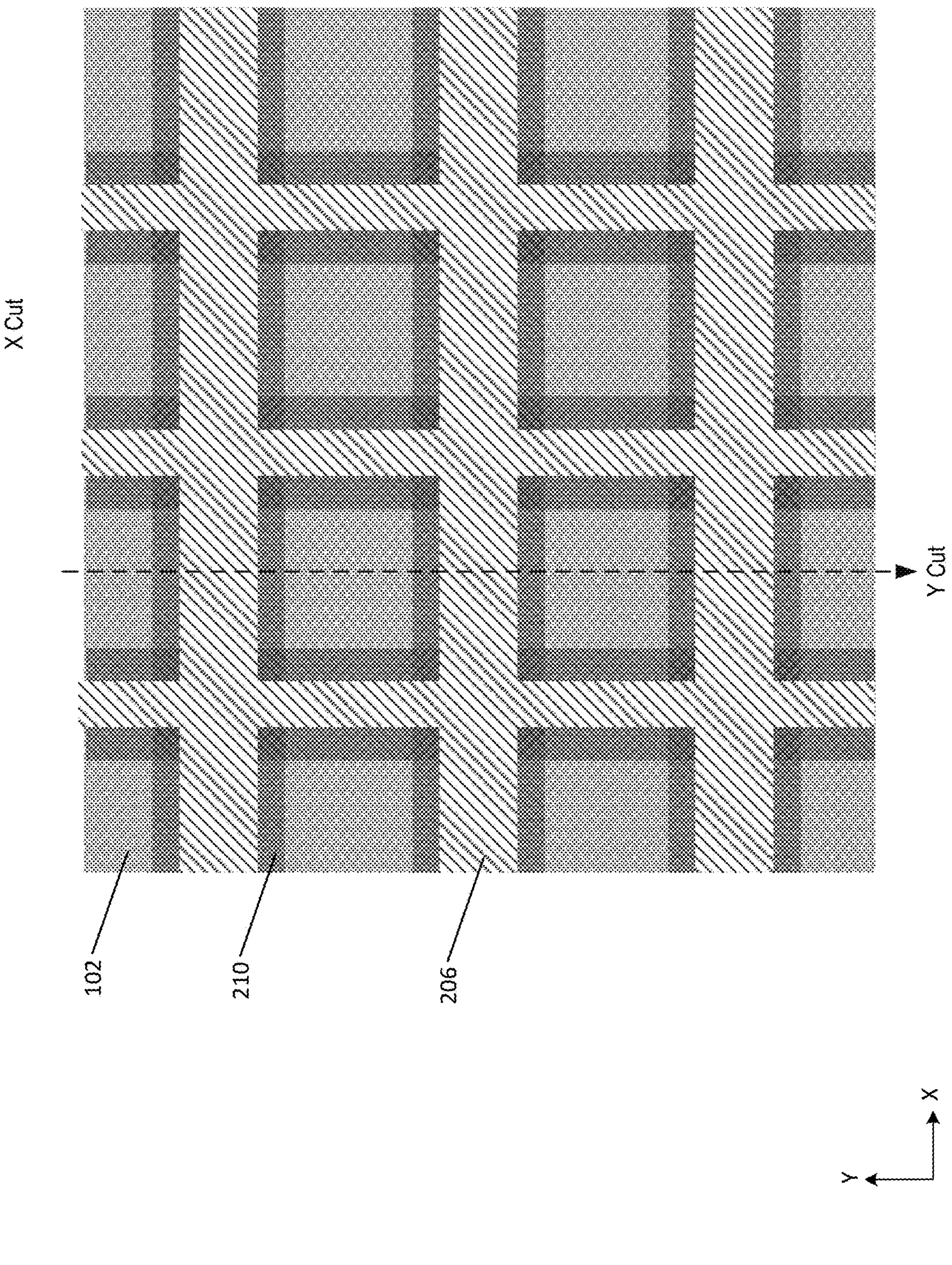
FIG. 2B is a top view taken across the X-cut line of the structure of FIG. 2A.

FIG. 2B is a top view taken across the X-cut line of the structure of FIG. 2A. FIG. 2B shows that, in some implementations, semiconductor posts (or pillars) may be arranged in a two-dimensional array, where each one has semiconductor material 210 disposed around at least an upper portion thereof.

Figure 3A:
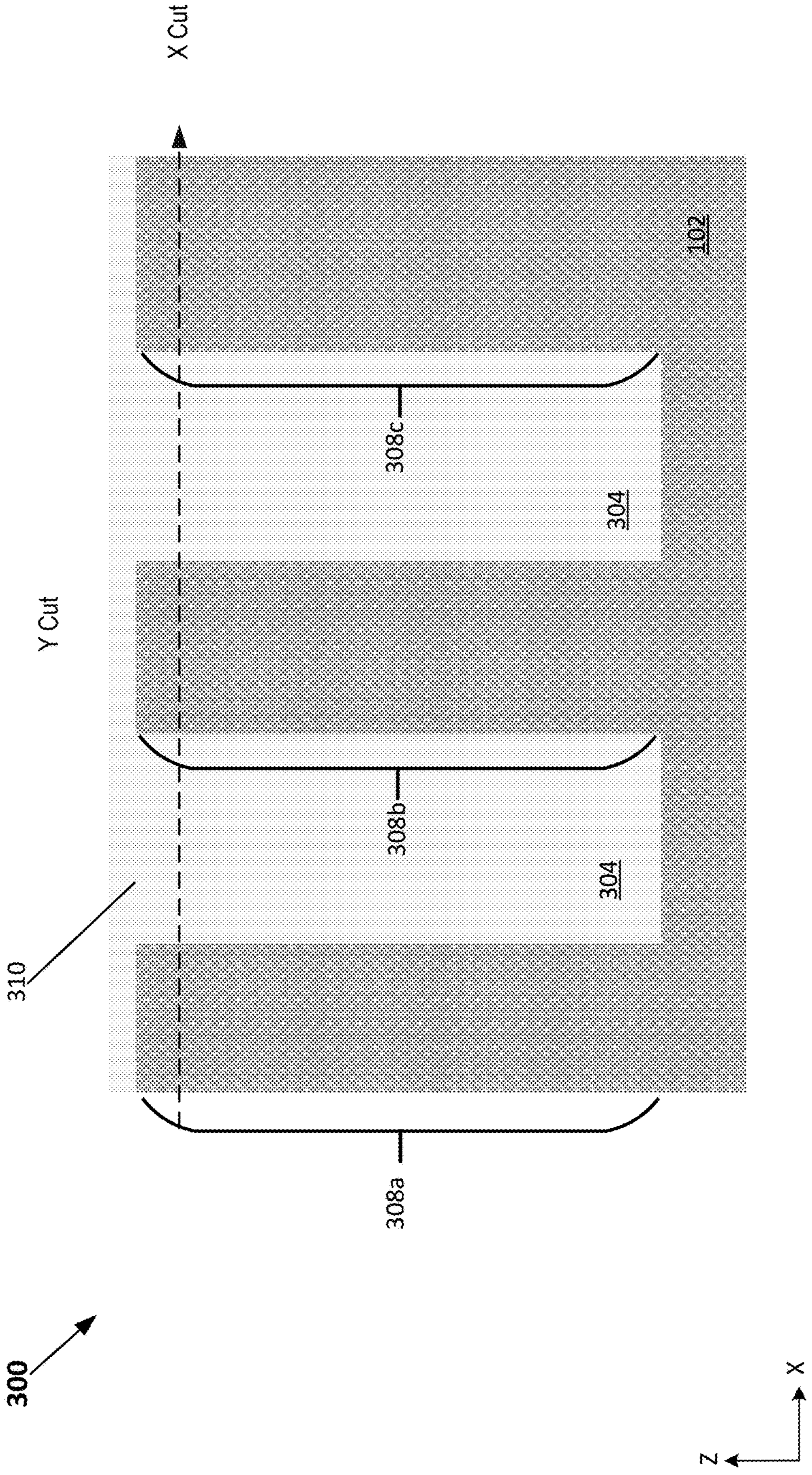
FIG. 3A is a cross-sectional view of a portion of a semiconductor substrate having dielectric-filled trenches and vertically-oriented semiconductor posts, with the dielectric also covering the top surfaces of the posts, in accordance with this disclosure.

FIGS. 3A-3O illustrate various intermediate structures formed during an illustrative method of making a structure having enlarged metal silicide regions in accordance with this disclosure. It is noted that methods in accordance with this disclosure are compatible with CMOS processes.

FIG. 3A is a cross-sectional view of a structure 300 that is a portion of a semiconductor substrate 102 having dielectric-filled trenches 304, and vertically-oriented semiconductor posts (or pillars) 308*a*, 308*b*, 308*c*, with a first dielectric material 310 filling trenches 304, and also covering the top surfaces of semiconductor posts (or pillars) 308*a*, 308*b*, 308*c*, in accordance with this disclosure. In this illustrative implementation, semiconductor posts (or pillars) 308*a*, 308*b*, 308*c*, are integral with semiconductor substrate 102.

Figure 3B:
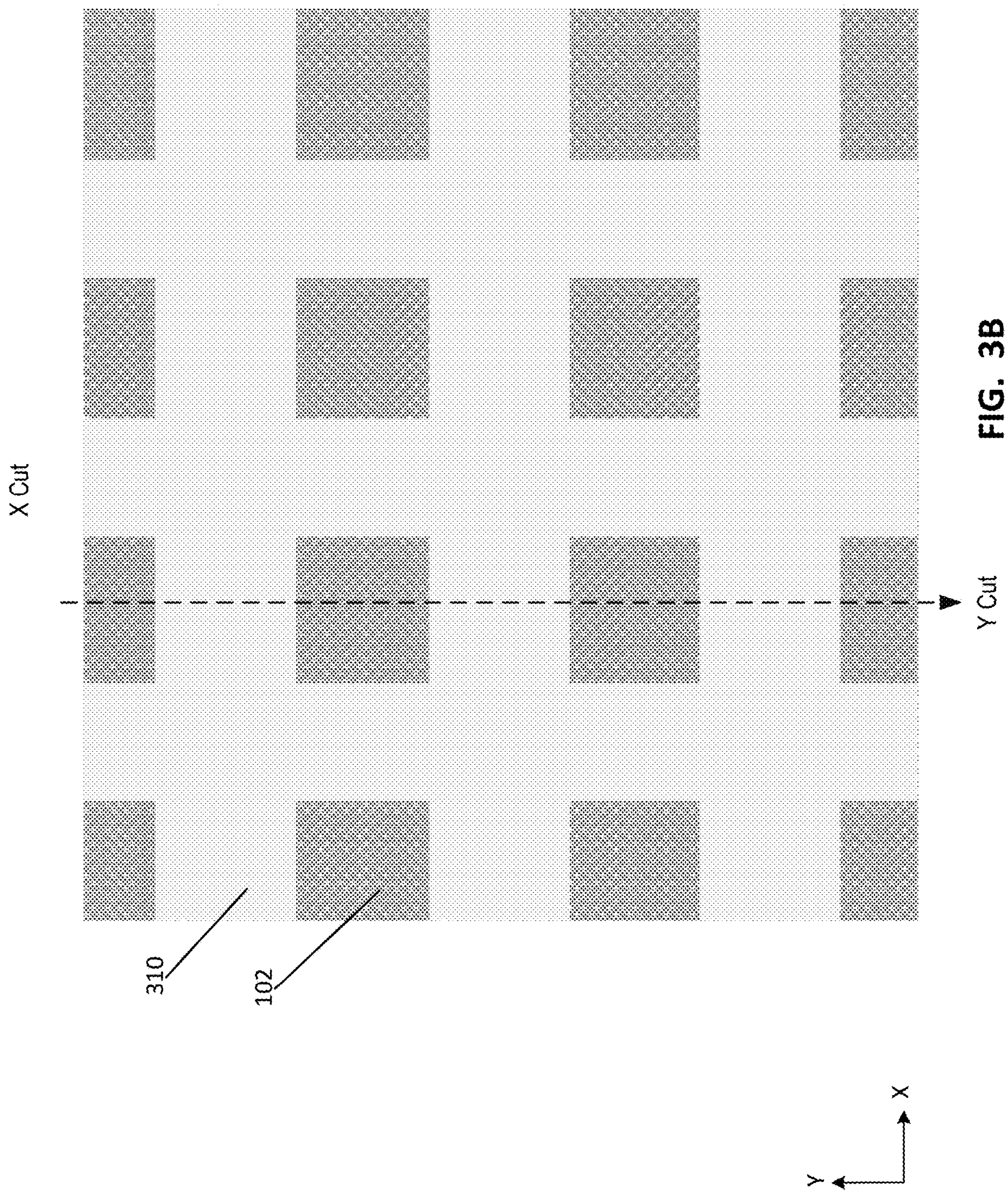
FIG. 3B is a top view taken across the X-cut line of the structure of FIG. 3A.

FIG. 3B is a top view taken across the X-cut line of the structure of FIG. 3A. FIG. 3B shows that, in some implementations, semiconductor posts (or pillars) may be arranged in a two-dimensional array in the x-y plane.

Figure 3C:
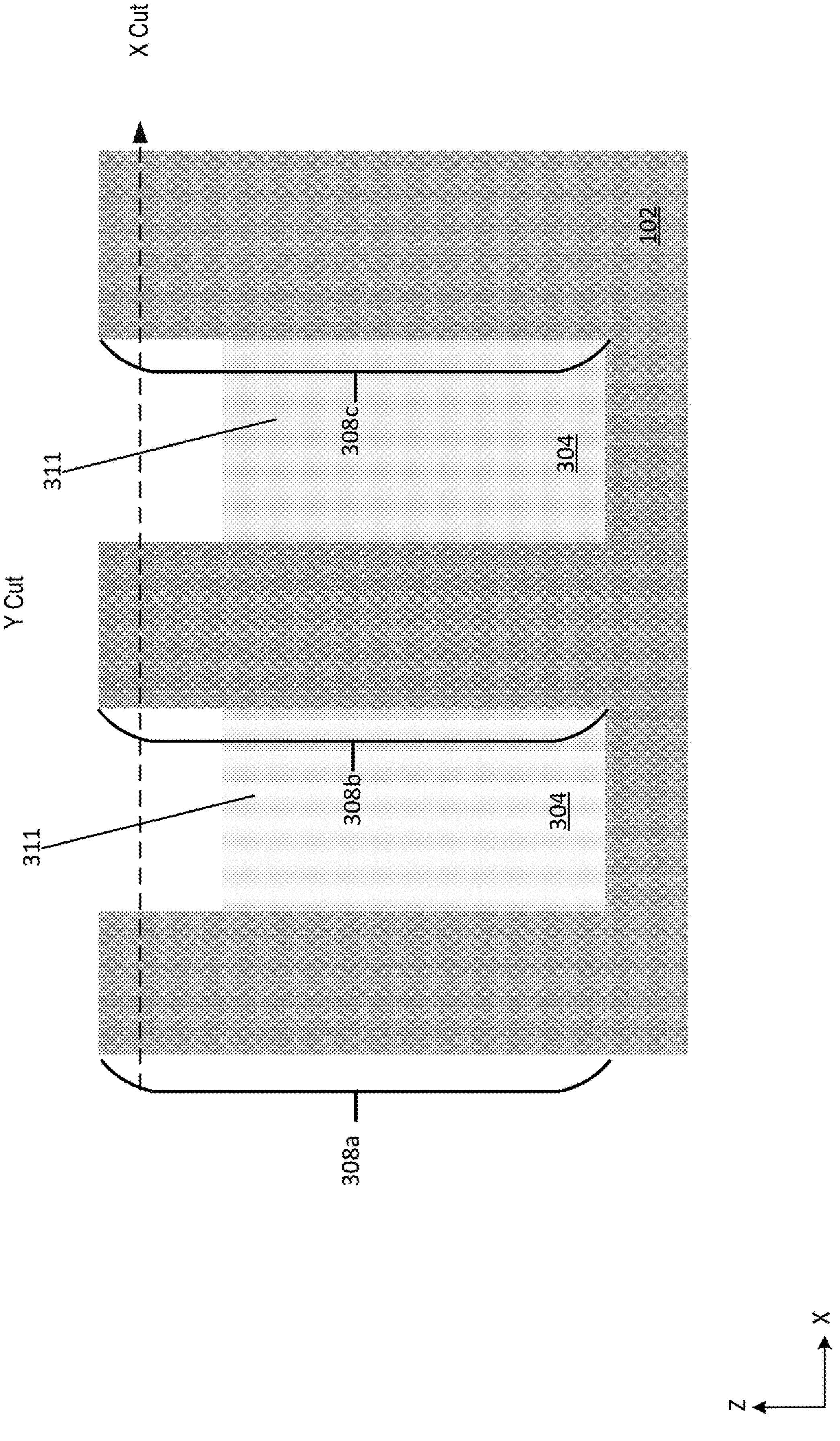
FIG. 3C is a cross-sectional view showing the structure of FIG. 3A after a portion of the dielectric has been removed, in accordance with this disclosure.

FIG. 3C is a cross-sectional view showing the structure of FIG. 3A after a portion of first dielectric material 310 has been removed, in accordance with this disclosure. It can be seen in FIG. 3C that, after the aforementioned portion of first dielectric material 310 has been removed, the top surfaces and upper side portions of semiconductor posts (or pillars) 308*a*, 308*b*, 308*c*, have been exposed. After the removal of the portion of first dielectric material 310, trenches 304 are left with dielectric structures 311, which are made of the first dielectric material in this illustrative implementation.

Figure 3D:
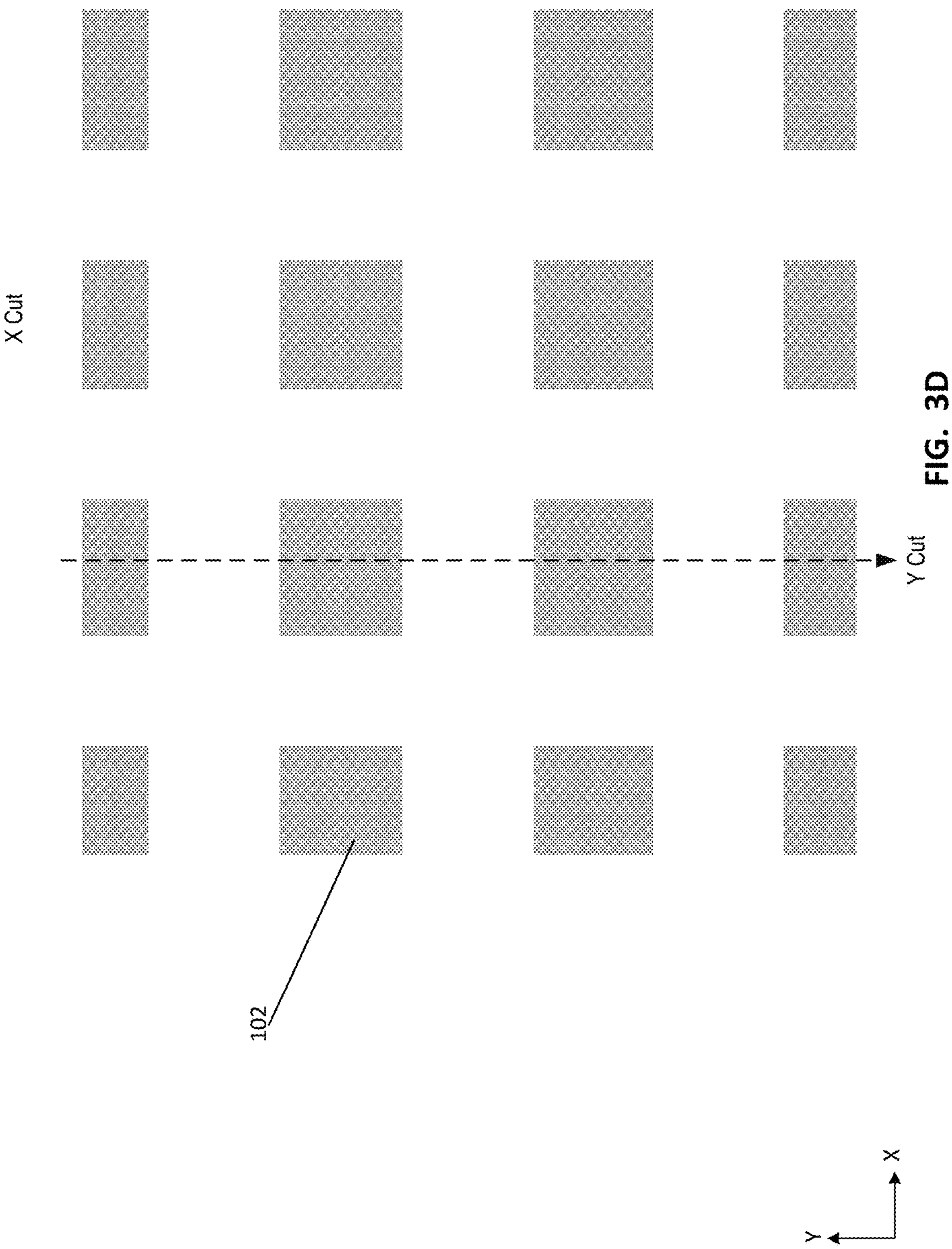
FIG. 3D is a top view taken across the X-cut line of the structure of FIG. 3C.

FIG. 3D is a top view taken across the X-cut line of the structure of FIG. 3C, as shown in FIG. 3C.

Figure 3E:
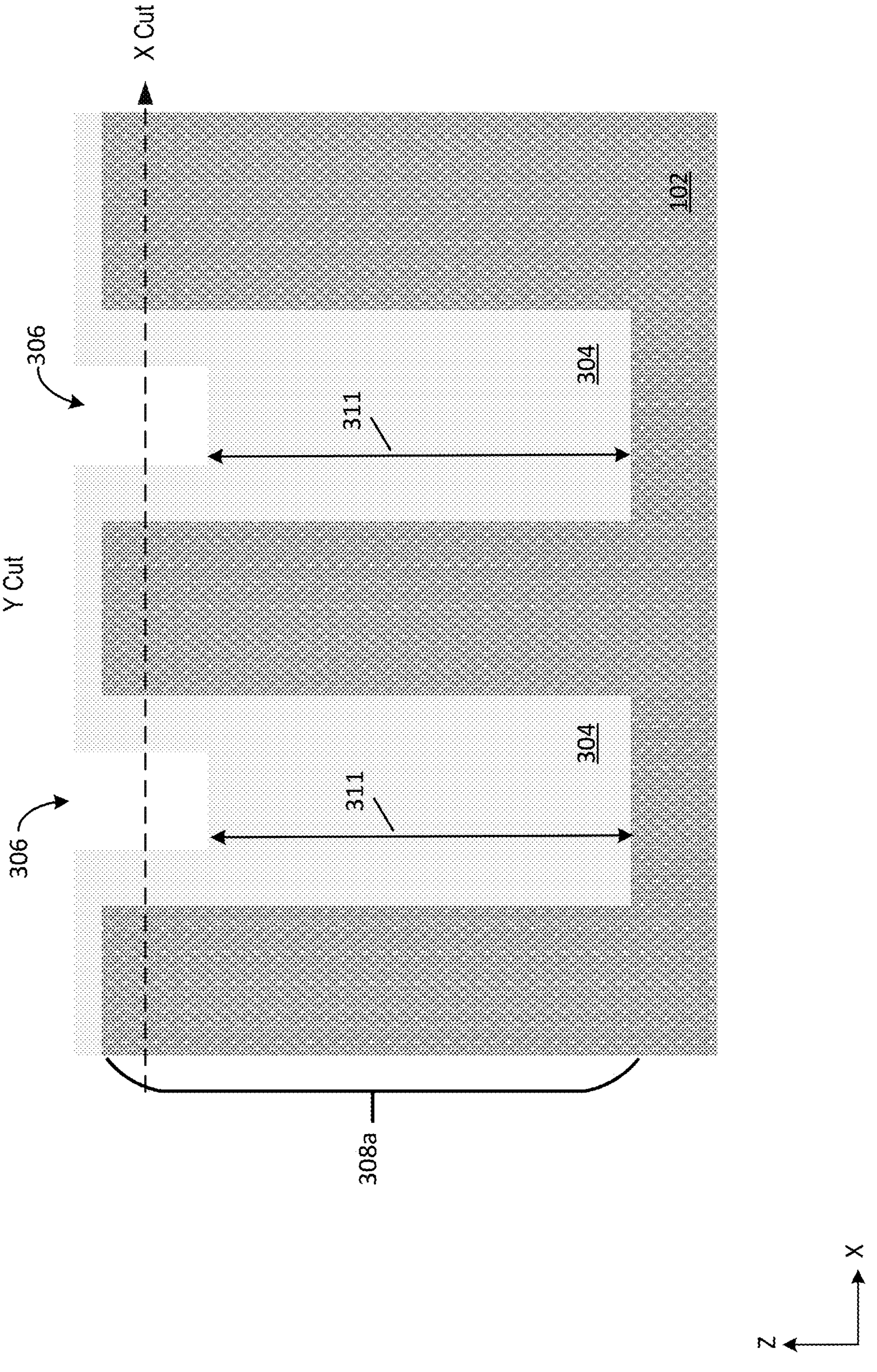
FIG. 3E is a cross-sectional view showing the structure of FIG. 3C after a conformal deposition of dielectric material forms a dielectric trench structure within the upper portion of the dielectric that is within the semiconductor trenches, in accordance with this disclosure.

FIG. 3E is a cross-sectional view showing the structure of FIG. 3C after a conformal deposition of dielectric material forms a dielectric trench structure within the upper portion of the dielectric that is within the semiconductor trenches, in accordance with this disclosure. Referring to FIGS. 3A, 3C, and 3E together, it can be seen that the portion of dielectric material removed from structure 300 of FIG. 3A to form the structure of FIG. 3C, is partially replaced by the aforementioned conformal deposition of dielectric material. In some implementations, the conformally deposited dielectric material is the same dielectric material as that of dielectric structure 311. Although the conformal deposition recovers the top surfaces and upper side surfaces of the semiconductor posts (or pillars), a dielectric trench 306 is formed above each dielectric structure 311 and spaced apart from the upper side portions of the semiconductor posts (or pillars).

Figure 3F:
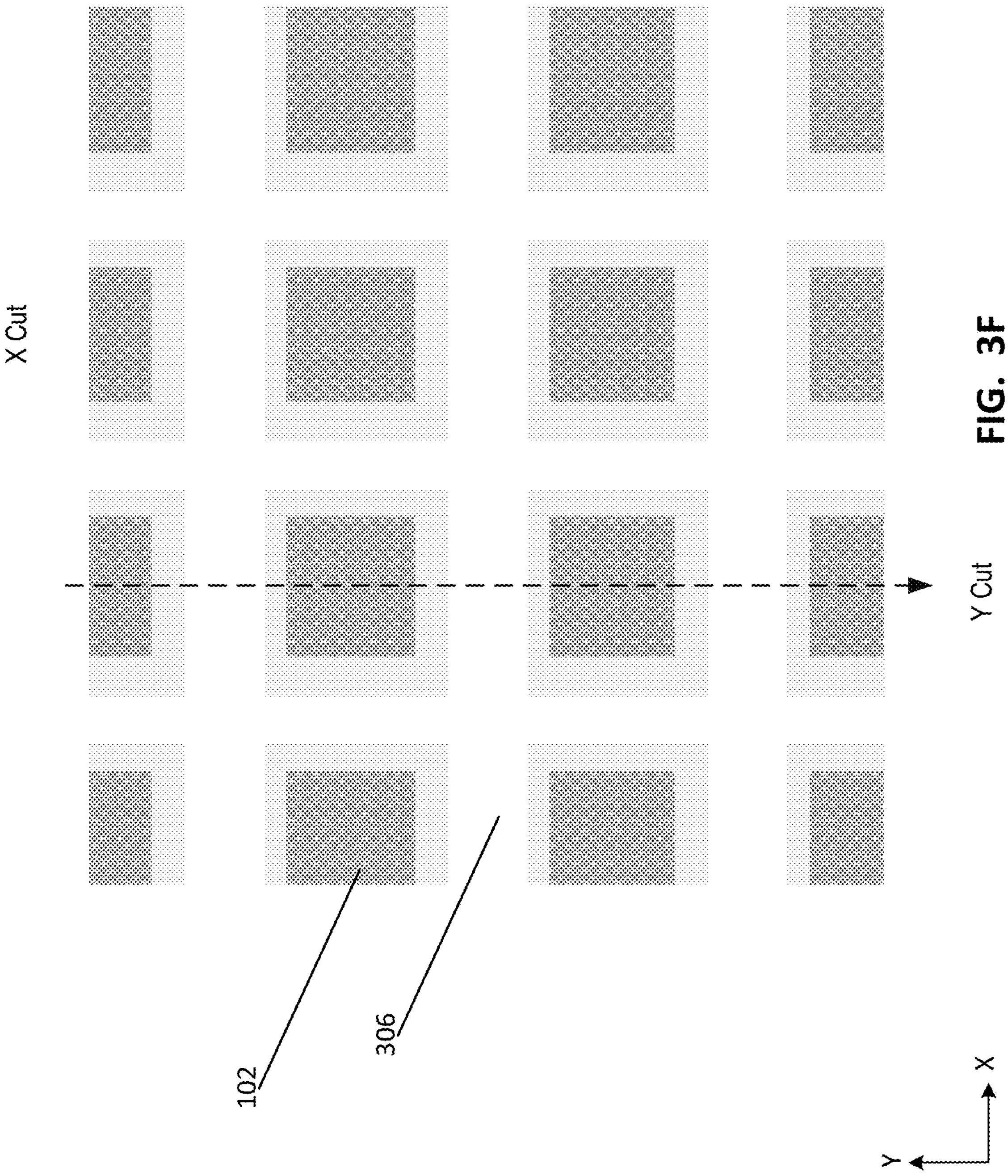
FIG. 3F is a top view taken across the X-cut line of the structure of FIG. 3E.

FIG. 3F is a top view taken across the X-cut line of the structure of FIG. 3E as shown in FIG. 3E. The arrangement of semiconductor substrate 102 and dielectric trenches 306 in the x-y plane can be seen in FIG. 3F.

Figure 3G:
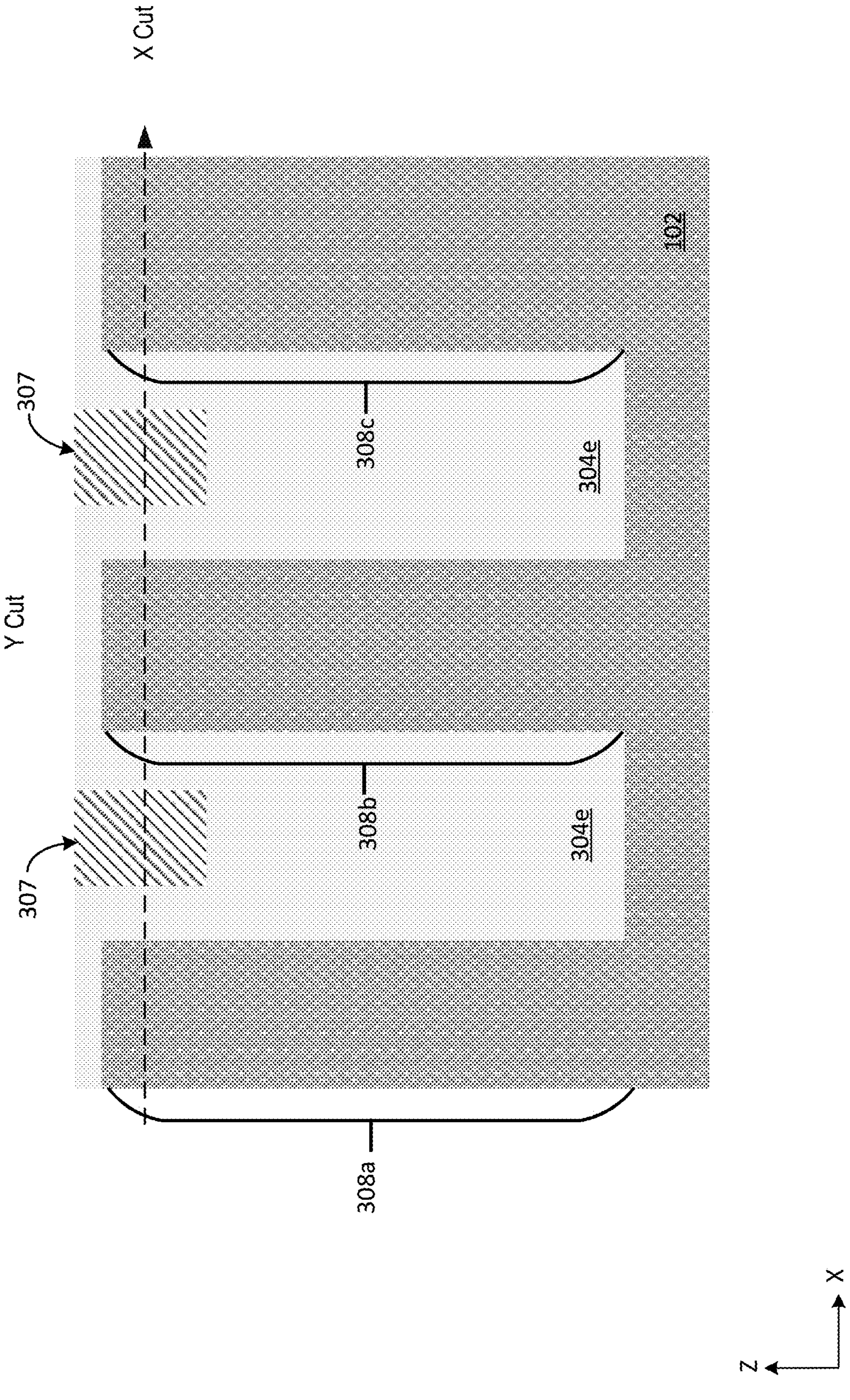
FIG. 3G is a cross-sectional view showing the structure of FIG. 3E after silicon nitride plugs disposed in the dielectric trenches are formed, in accordance with this disclosure.

FIG. 3G is a cross-sectional view showing the structure of FIG. 3E after silicon nitride plugs 307 disposed in the dielectric trenches are formed, in accordance with this disclosure. In some implementations, silicon nitride plugs 307 are formed by first depositing a layer of silicon nitride to at least fill each dielectric trench 306, and then planarizing the silicon nitride layer so that individual silicon nitride plugs 307 are left. In alternative implementations, materials other than silicon nitride may be used to form the plugs shown in FIG. 3G. The material, or materials, selected as an alternative to silicon nitride should have etch characteristics that are different from the etch characteristics of the dielectric material conformally deposited, as shown in FIG. 3E. In that way, the conformally deposited dielectric material may be removed by selective etching while leaving plugs in place.

Figure 3H:
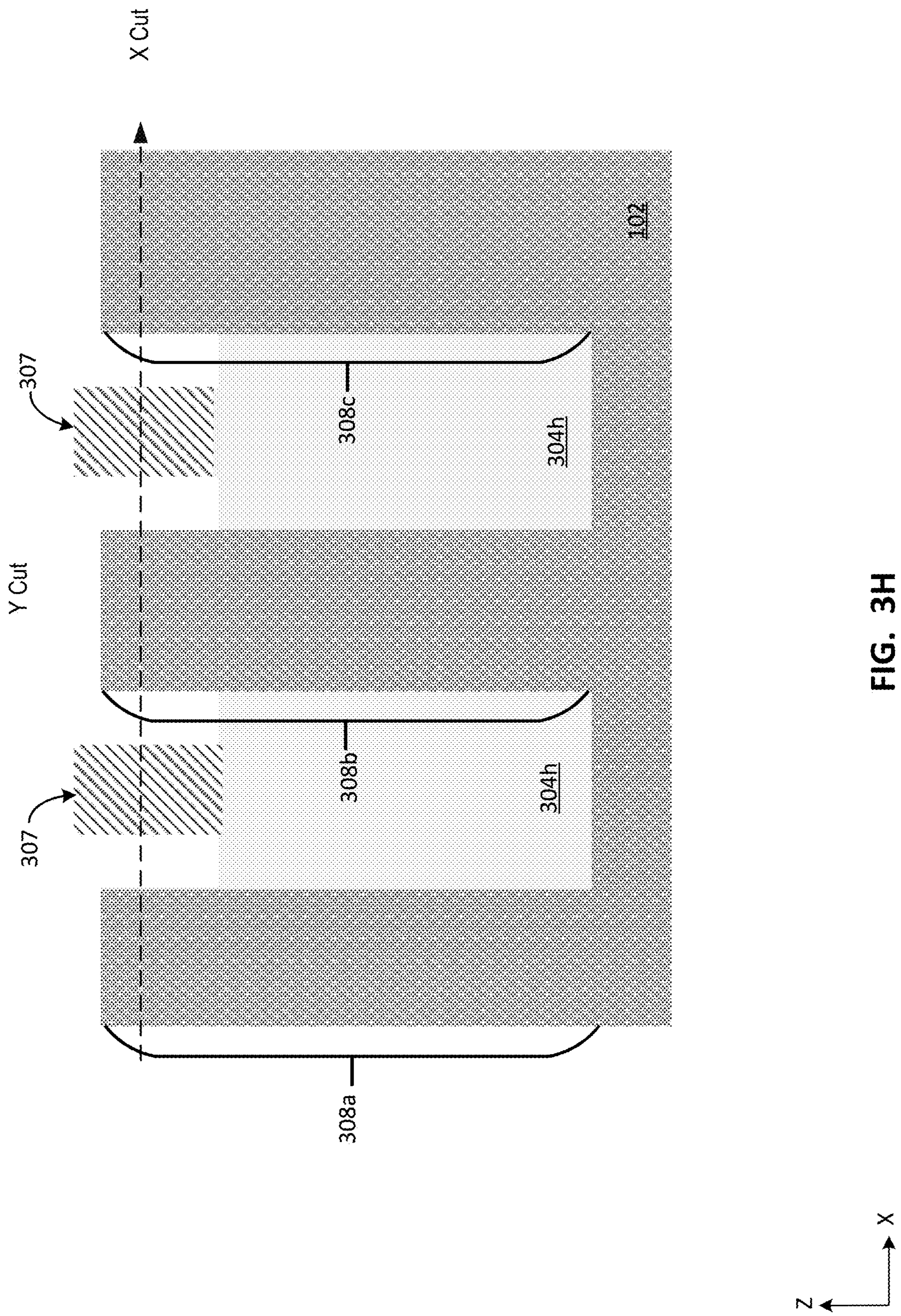
FIG. 3H is a cross-sectional view showing the structure of FIG. 3G after dielectric material has been removed from the top surface and the sidewall surfaces of the silicon nitride plugs, in accordance with this disclosure.

FIG. 3H is a cross-sectional view showing the structure of FIG. 3G after dielectric material has been removed from the top surface and the upper sidewall surfaces of the semiconductor posts (or pillars) 308*a*, 308*b*, 308*c*, in accordance with this disclosure. As referenced above, the etch characteristics of the silicon nitride are different from the etch characteristics of the dielectric material conformally deposited, as shown in FIG. 3E. Because the etch characteristics of these materials are different, the conformally deposited dielectric material may be removed by etching while leaving silicon nitride plugs 307 in place.

Figure 3I:
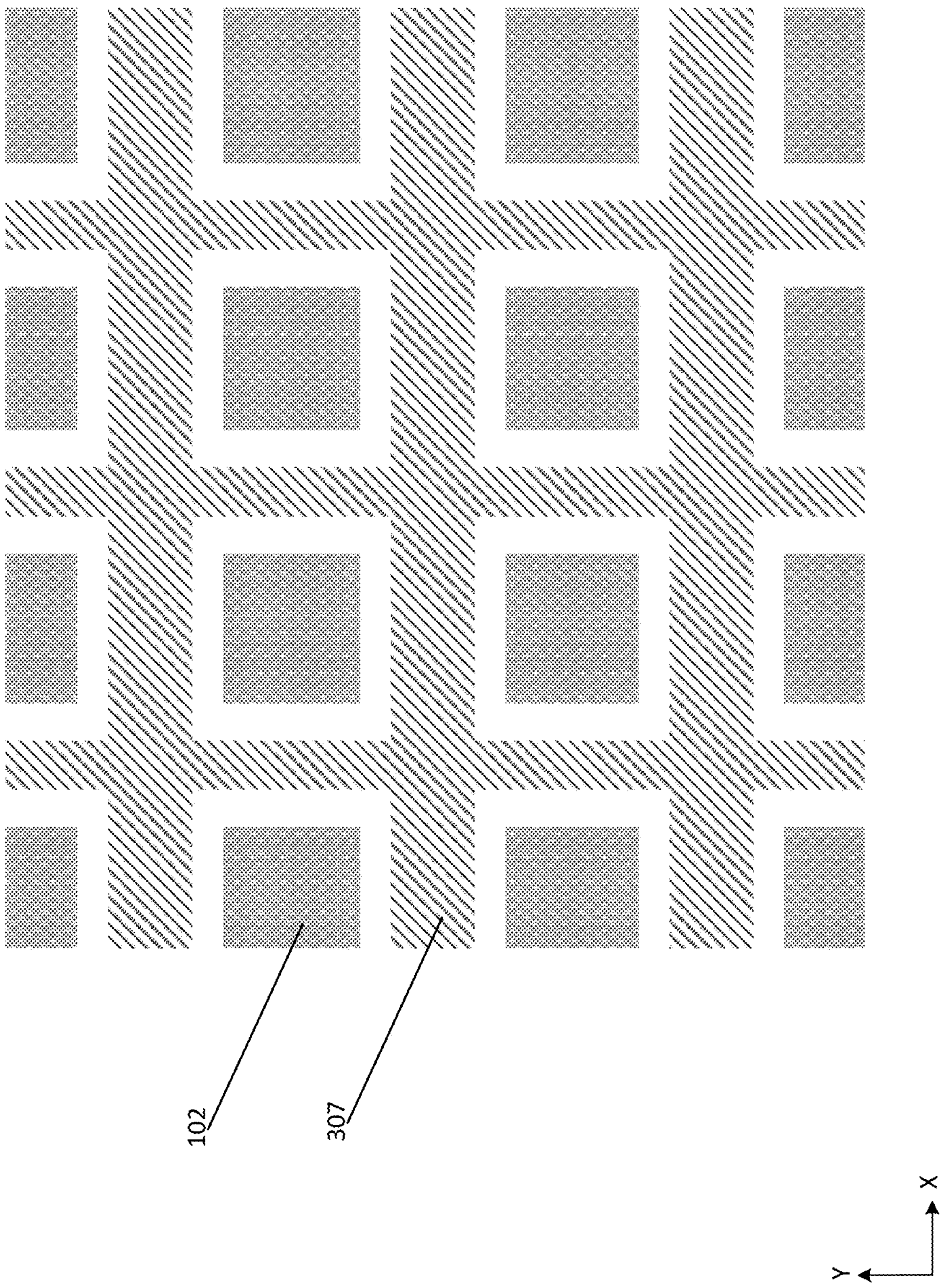
FIG. 3I is a top view taken across the X-cut line of the structure of FIG. 3H, as shown in FIG. 3H.

FIG. 3I is a top view taken across the X-cut line of the structure of FIG. 3H, as shown in FIG. 3H. The arrangement of semiconductor substrate 102 and silicon nitride plugs 307 in the x-y plane can be seen in FIG. 3I.

FIG. 3J is a cross-sectional view showing the structure of FIG. 3H after (1) a semiconductor material has been deposited over the structure of FIG. 3H, including over the semiconductor posts (or pillars) 308*a*, 308*b*, 308*c*, and over the top and sidewalls of silicon nitride plugs 307; and (2) the deposited semiconductor material has been planarized, in accordance with this disclosure. In this illustrative implementation, the semiconductor material is polycrystalline silicon. In some alternative implementations, the layer of semiconductor material may be epitaxially grown rather than deposited. And, in some alternative implementations, a semiconductor material other than silicon may be used, such as, but not limited to, silicon germanium or germanium, for example.

Still referring to the illustrative implementation of FIG. 3J, it can be seen that depositing and planarizing the layer of semiconductor material (polycrystalline silicon in this example) results in enlargement structures 312, which are disposed on the top surface and upper sidewalls of semiconductor posts (or pillars) 308*a*, 308*b*, 308*c*. Enlargement structures may also be referred to as enlarging structures. It is noted that alternative implementations may use semiconductor materials other than polycrystalline silicon to form enlargement structures 312, such as but not limited to, epitaxially-grown single-crystal silicon, or deposited silicon germanium, for example. Enlargement structures 312 are electrically isolated from each other by silicon nitride plugs 307. With reference to FIG. 3J, it can be seen that semiconductor post (or pillar) 308*b* has a width 314*x* in the x-direction, which is less than a width 316*x* in the x-direction of enlargement structure 312 that is disposed on semiconductor post (or pillar) 308*b*. Width 316*x* is greater than width 314*x* because the semiconductor material of enlargement structure 312 extends into trenches 304 that surround semiconductor post (or pillar) 308*b*. In subsequent processing operations, described below, the enlargement structure will be converted from a semiconductor material to a metal silicide. Of course, if the semiconductor material of the enlargement structure was germanium, then the conversion would be to a metal germanicide rather than a metal silicide.

Figure 3K:
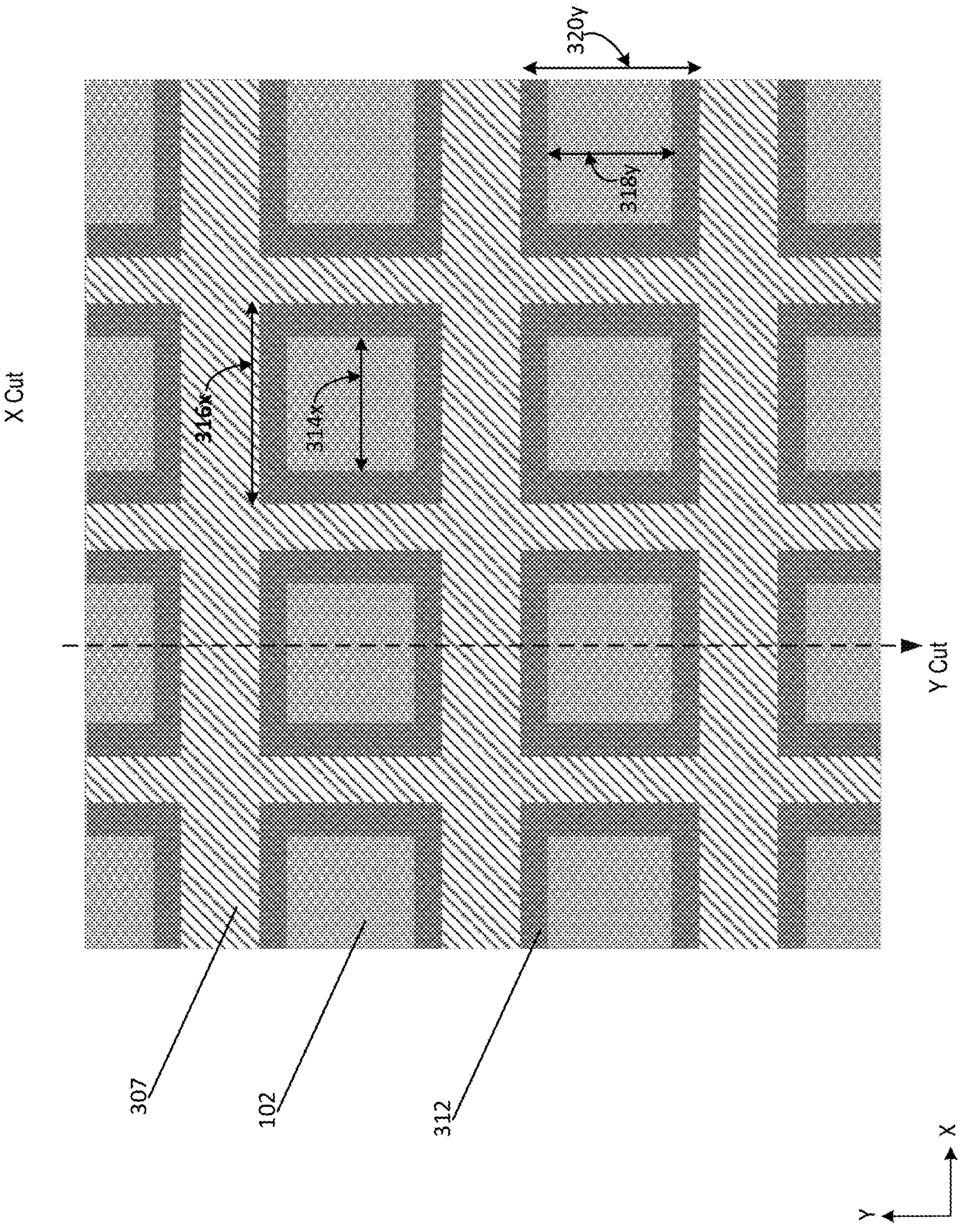
FIG. 3K is a top view taken across the X-cut line of the structure of FIG. 3J, as shown in FIG. 3J.

FIG. 3K is a top view taken across the X-cut line of the structure of FIG. 3J as shown in FIG. 3J. This view shows that the semiconductor enlargement structures 312 are wider in the x-direction than the semiconductor posts (or pillars) as represented by widths 316*x* versus 314*x*. Likewise, this view shows that the semiconductor enlargement structures 312 are wider in the y-direction than the semiconductor posts (or pillars) as represented by widths 320*y* versus 318*y*. Width 320*y* is greater than width 318*y* because the semiconductor material of enlargement structure 312 extends into trenches 304 that surround semiconductor posts (or pillars).

Figure 3L:
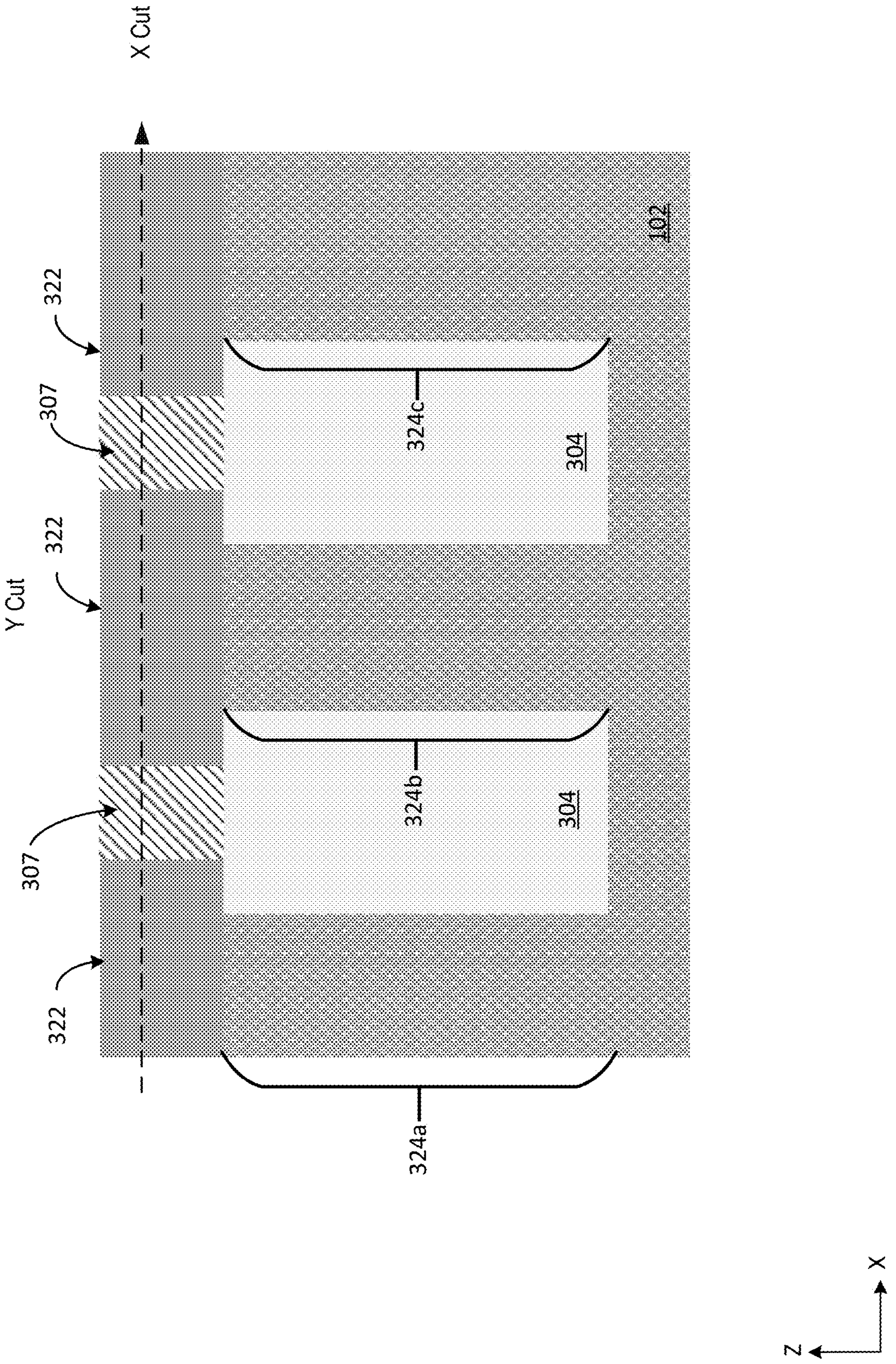
FIG. 3L is a cross-sectional view showing the structure of FIG. 3J after a silicidation reaction forms a silicide layer that consumes the polysilicon layer and an upper portion of the semiconductor posts, in accordance with this disclosure.

FIG. 3L is a cross-sectional view showing the structure of FIG. 3J after a silicidation reaction forms a silicide layer that consumes the polysilicon layer and an upper portion of the semiconductor posts, in accordance with this disclosure. As noted above, in alternative implementations the semiconductor layer that participates in the silicidation reaction, may consist of materials other than polycrystalline silicon. Because the silicidation process in this illustrative implementation consumes an upper portion of semiconductor posts 308*a*, 308*b*, and 308*c*, the height of these posts is reduced, and these are shown as reduced height semiconductor posts 324*a*, 324*b*, and 324*c*. In alternative implementations, the silicidation process may be designed to consume all or part of the semiconductor enlargement structure 312 and not consume portions of underlying semiconductor posts 308*a*, 308*b*, 308*c*. Such alternative implementations may be achieved by, for example, ensuring that the relative thicknesses of the reactants, i.e., the semiconductor layer and the metal layer, are chosen so that the silicidation reaction exhausts its reactants before the underlying semiconductor posts 308*a*, 308*b*, 308*c* react with the layer of metal that is deposited over at least the semiconductor enlargement structures 312.

Still referring to FIG. 3L, prior to the heating that is part of the silicidation process, a layer of a metal is deposited over the top surface of the semiconductor enlargement structures 312 and silicon nitride plugs 307. The deposited metal is then reacted at a high temperature with the underlying semiconductor material. In this illustrative implementation, the underlying semiconductor material is polycrystalline silicon. The deposited metal may be any suitable metal for forming a metal silicide including, but not limited to, titanium, tungsten, cobalt, and nickel, for example.

Figure 3M:
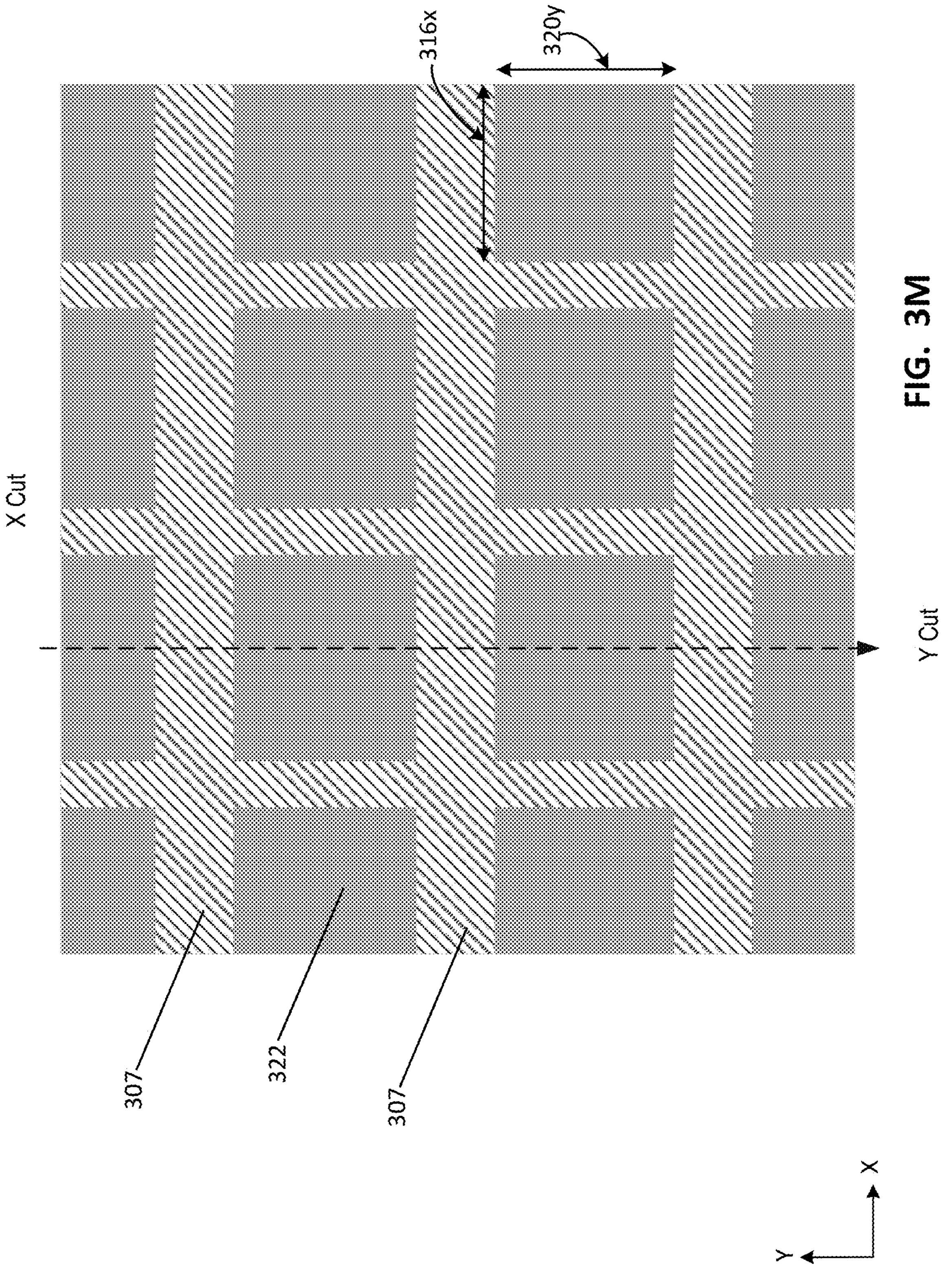
FIG. 3M is a top view taken across the X-cut line of the structure of FIG. 3L, as shown in FIG. 3L.

FIG. 3M is a top view taken across the X-cut line of the structure of FIG. 3L, as shown in FIG. 3L. This view shows that metal silicide regions 322 are separated from each other in both the x-direction and the y-direction by silicon nitride in this illustrative implementation. It is noted that metal silicide regions 322 may be separated from each other by dielectric material other than silicon nitride in alternative implementations. In this illustrative implementation, as discussed above in connection with FIG. 3H, silicon nitride is chosen to allow the selective etch of the conformally deposited dielectric layer adjacent to the silicon nitride plugs while leaving the silicon nitride plugs in place.

Figure 4A:
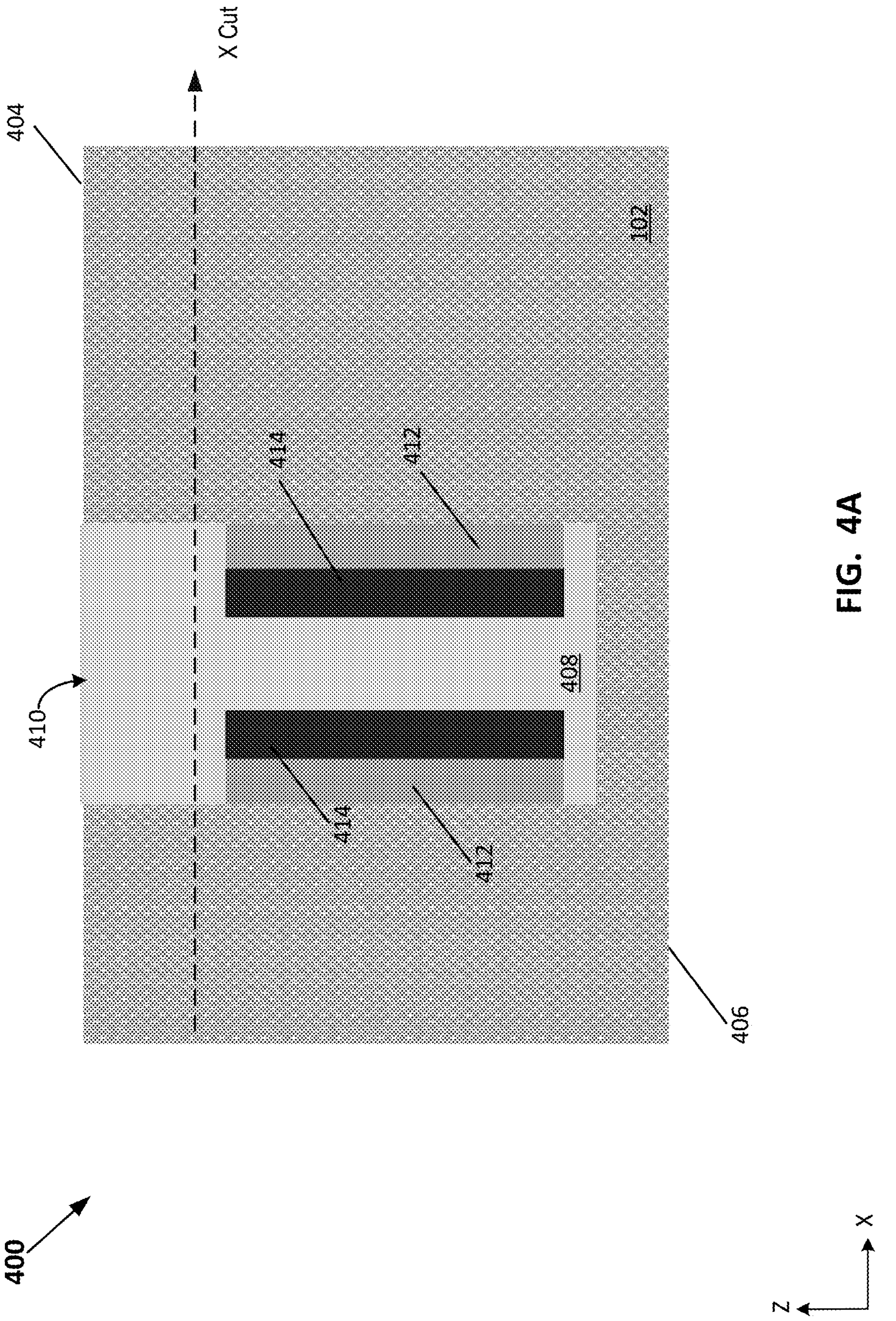
FIG. 4A is a cross-sectional view of a first intermediate structure formed during the process of manufacturing a structure in accordance with this disclosure.
Figure 4B:
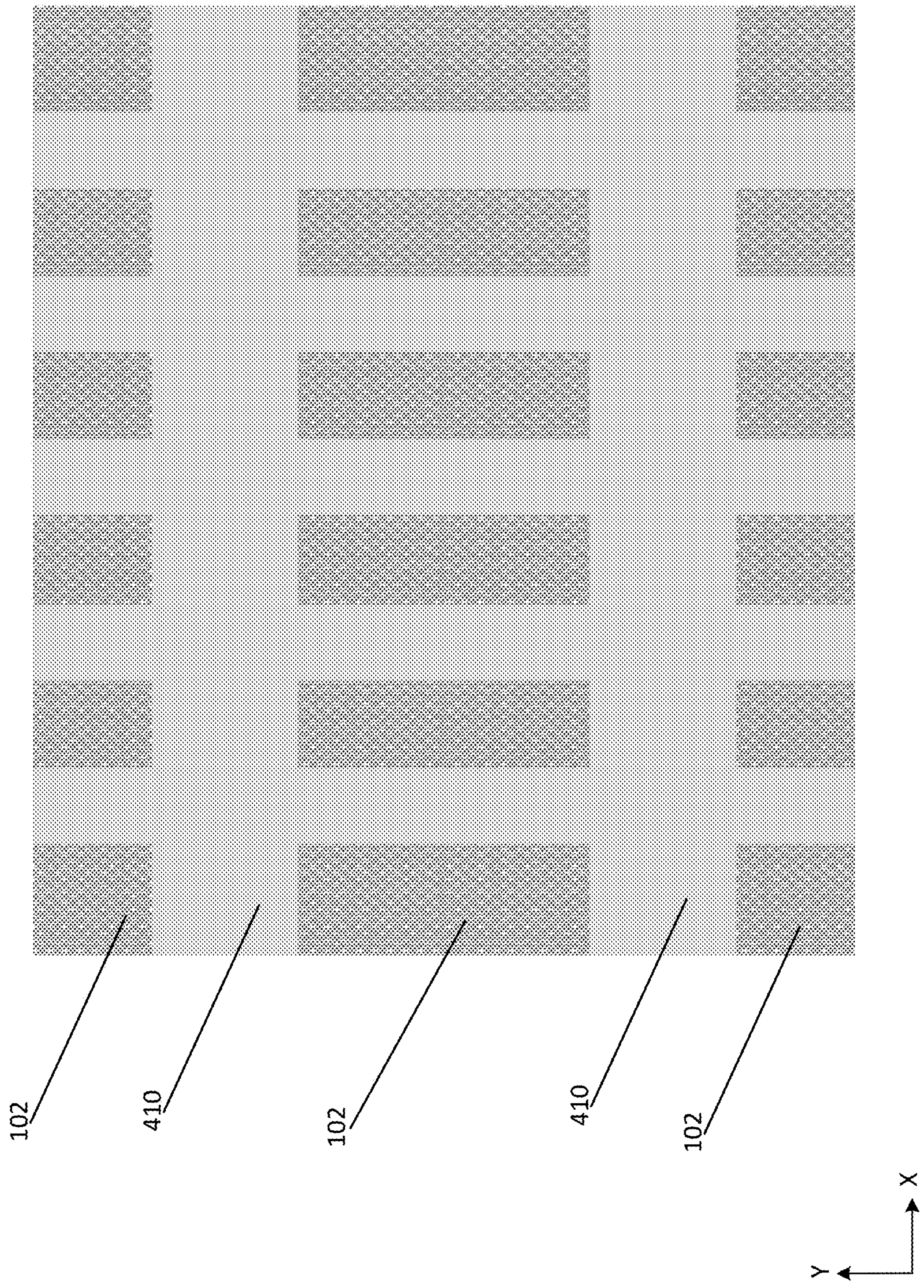
FIG. 4B is a top view of the structure of FIG. 4A taken across the X-cut line.
Figure 4D:
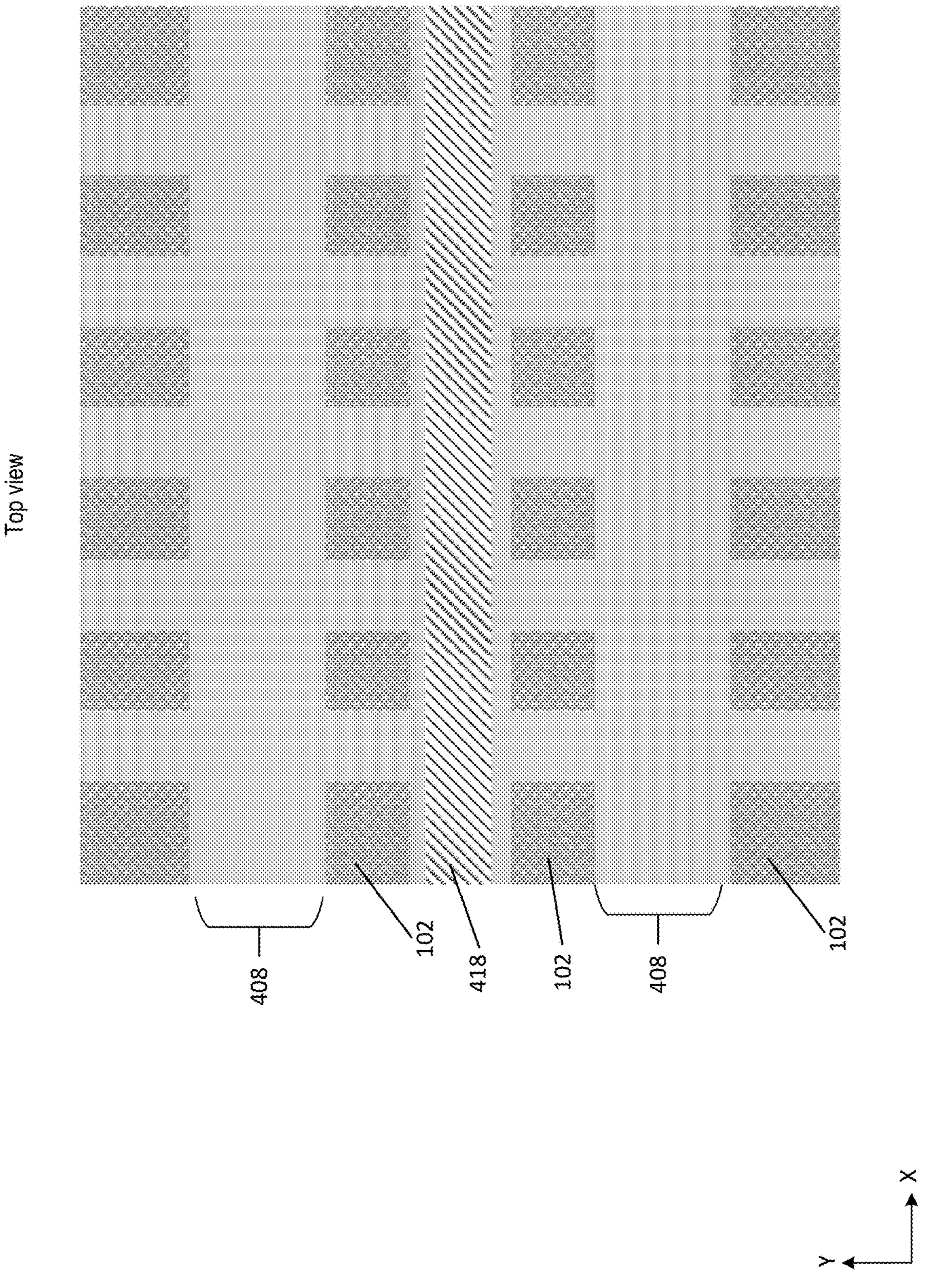
FIG. 4D is a top view taken across the X-cut line of the structure of FIG. 4C.
Figure 4E:
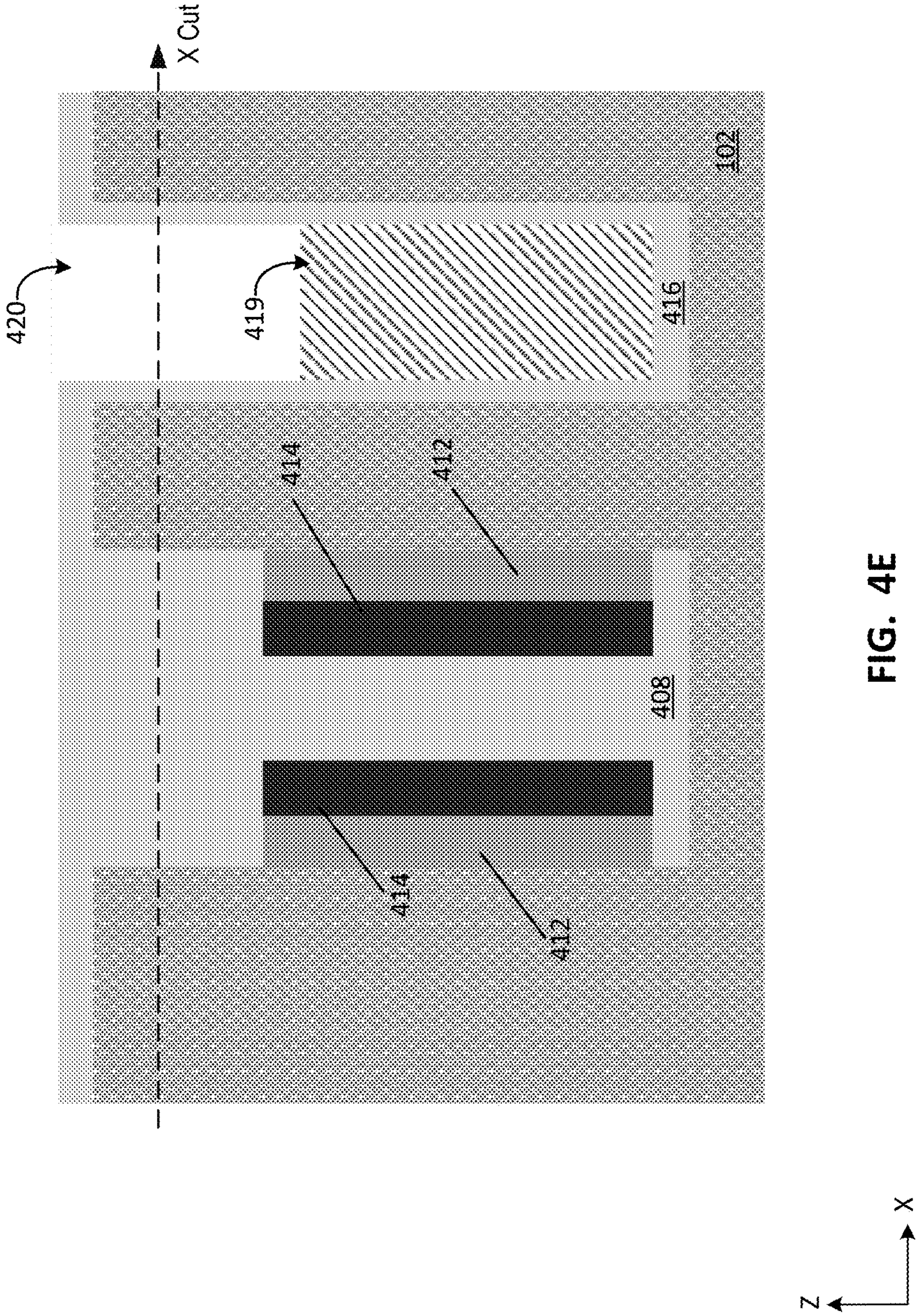
FIG. 4E is a cross-sectional view of a third intermediate structure formed during the process of manufacturing a structure in accordance with this disclosure, wherein a portion of a silicon nitride trench filler has been removed.
Figure 4F:
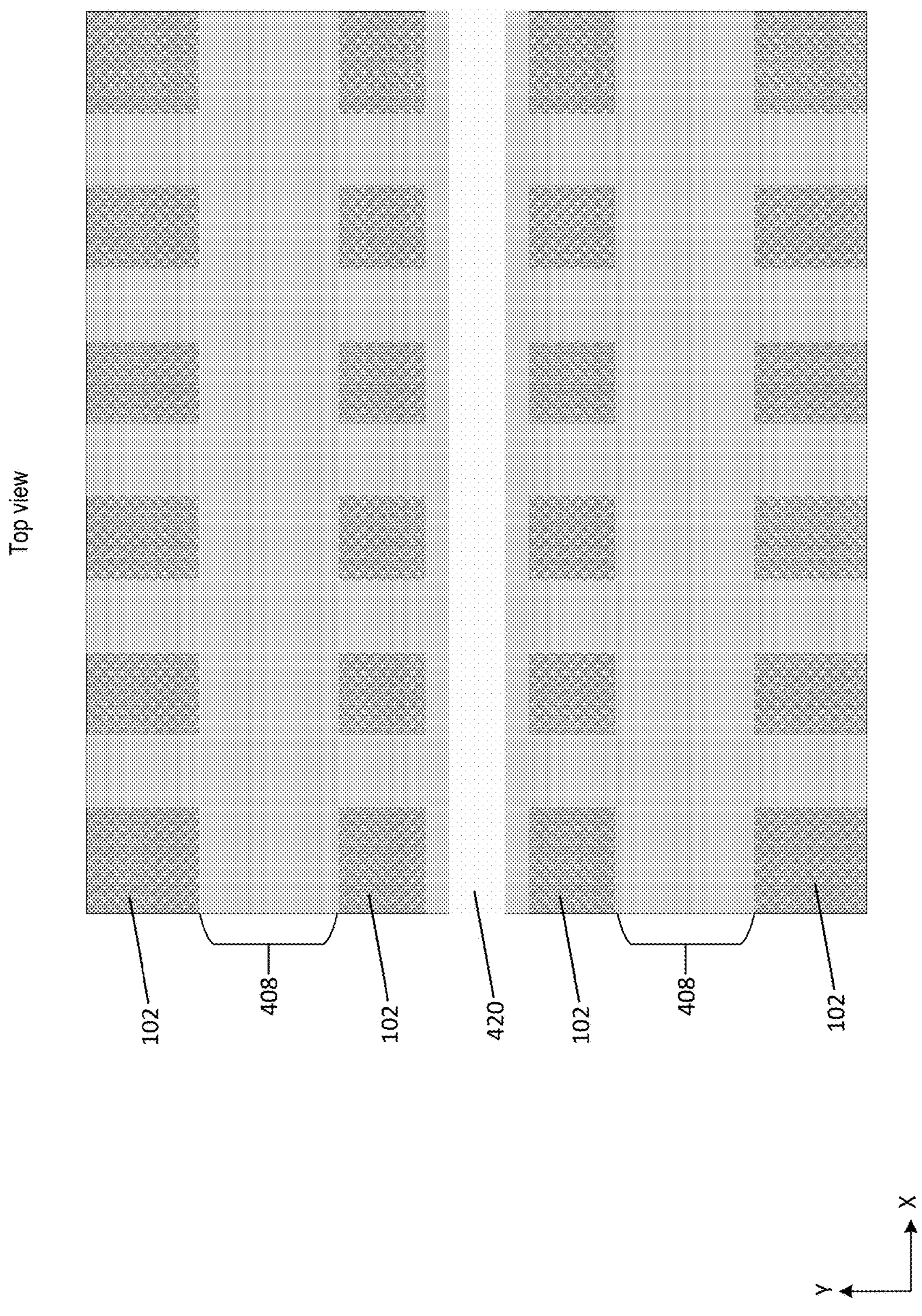
FIG. 4F is a top view taken across the X-cut line of the structure of FIG. 4E.
Figure 4G:
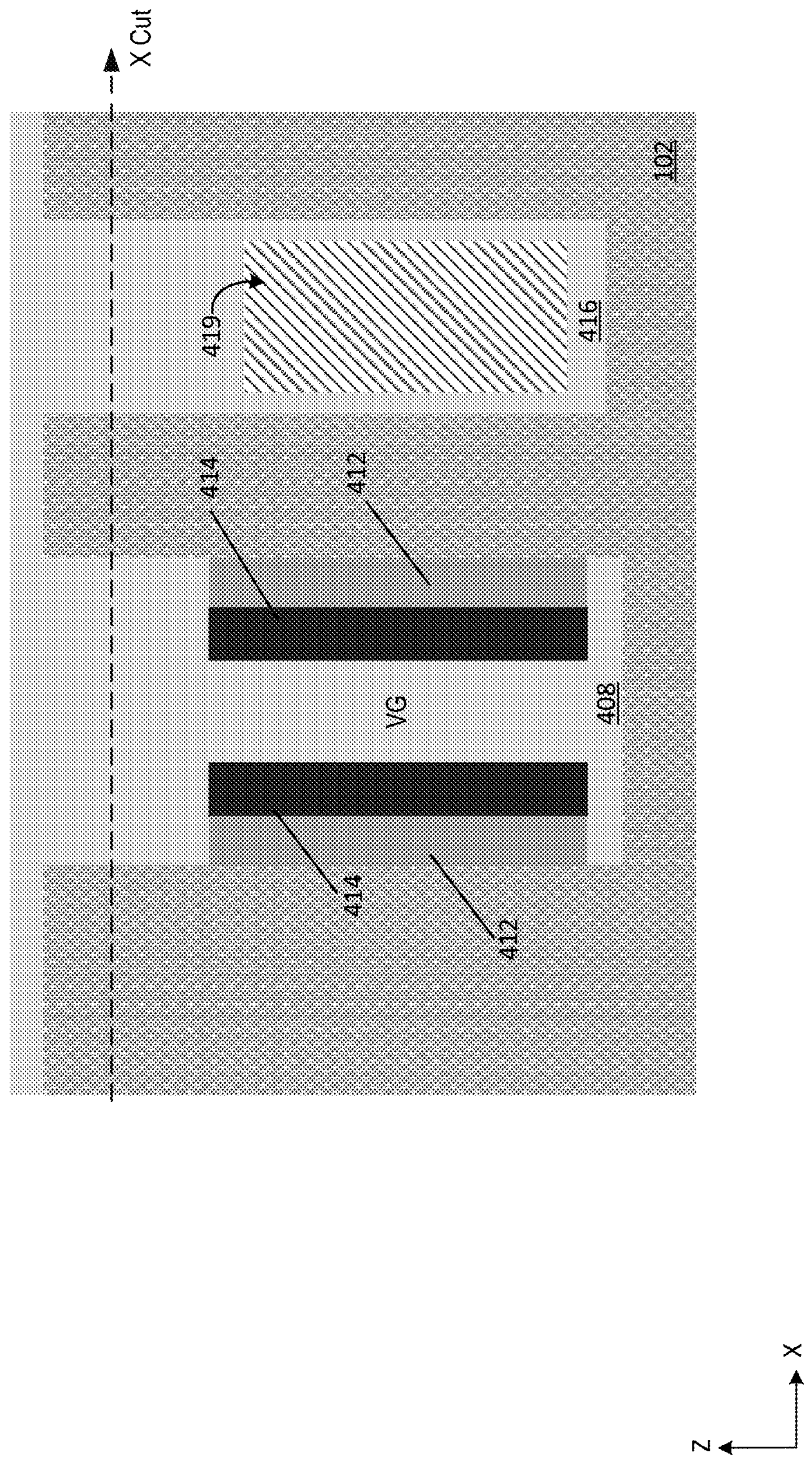
FIG. 4G is a cross-sectional view of a fourth intermediate structure formed during the process of manufacturing a structure in accordance with this disclosure, wherein the space created by the removal of a portion of the silicon nitride trench filler is filled with a dielectric material.
Figure 4H:
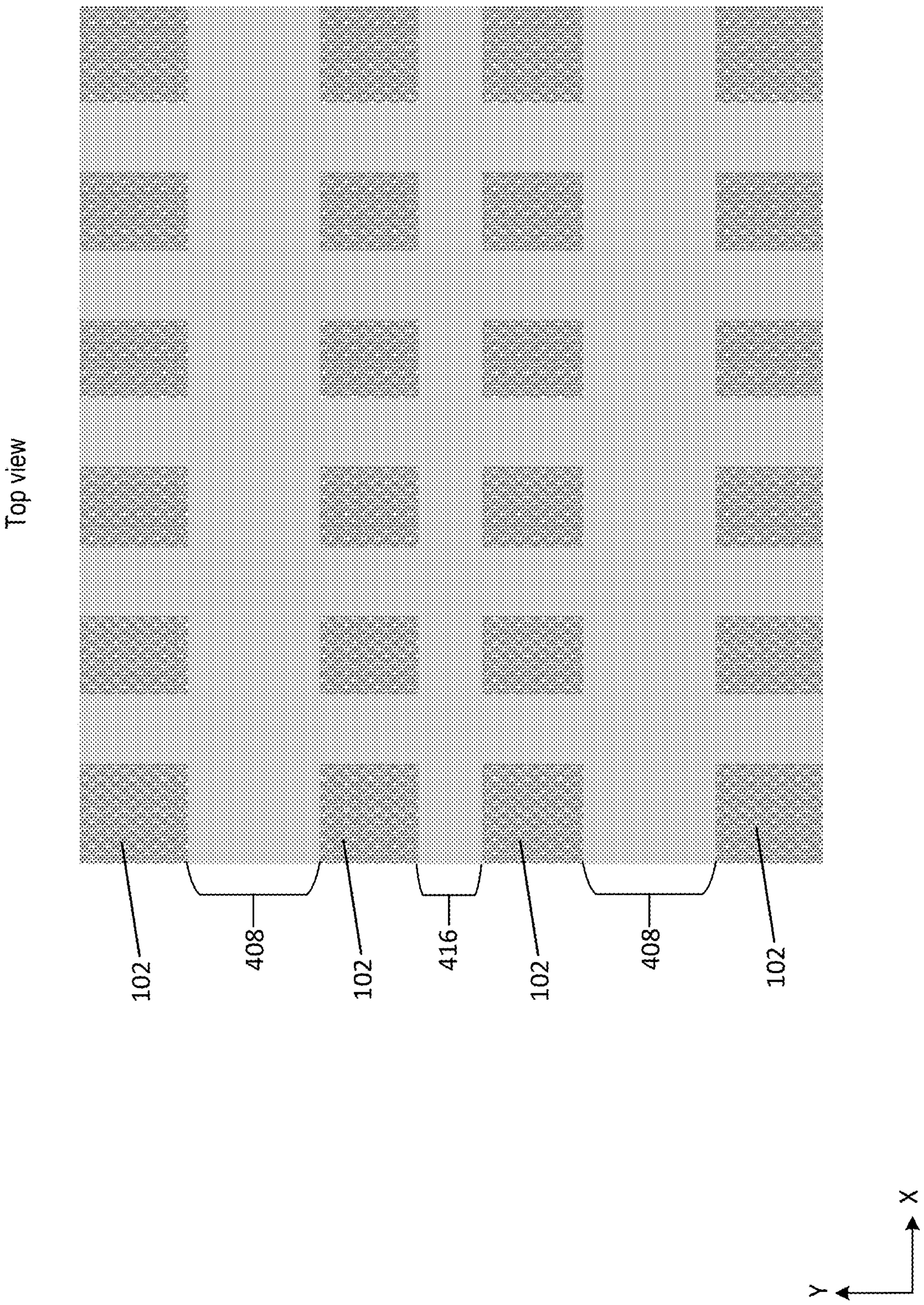
FIG. 4H is a top view of the structure of FIG. 4G taken across the X-cut line.
Figure 4J:
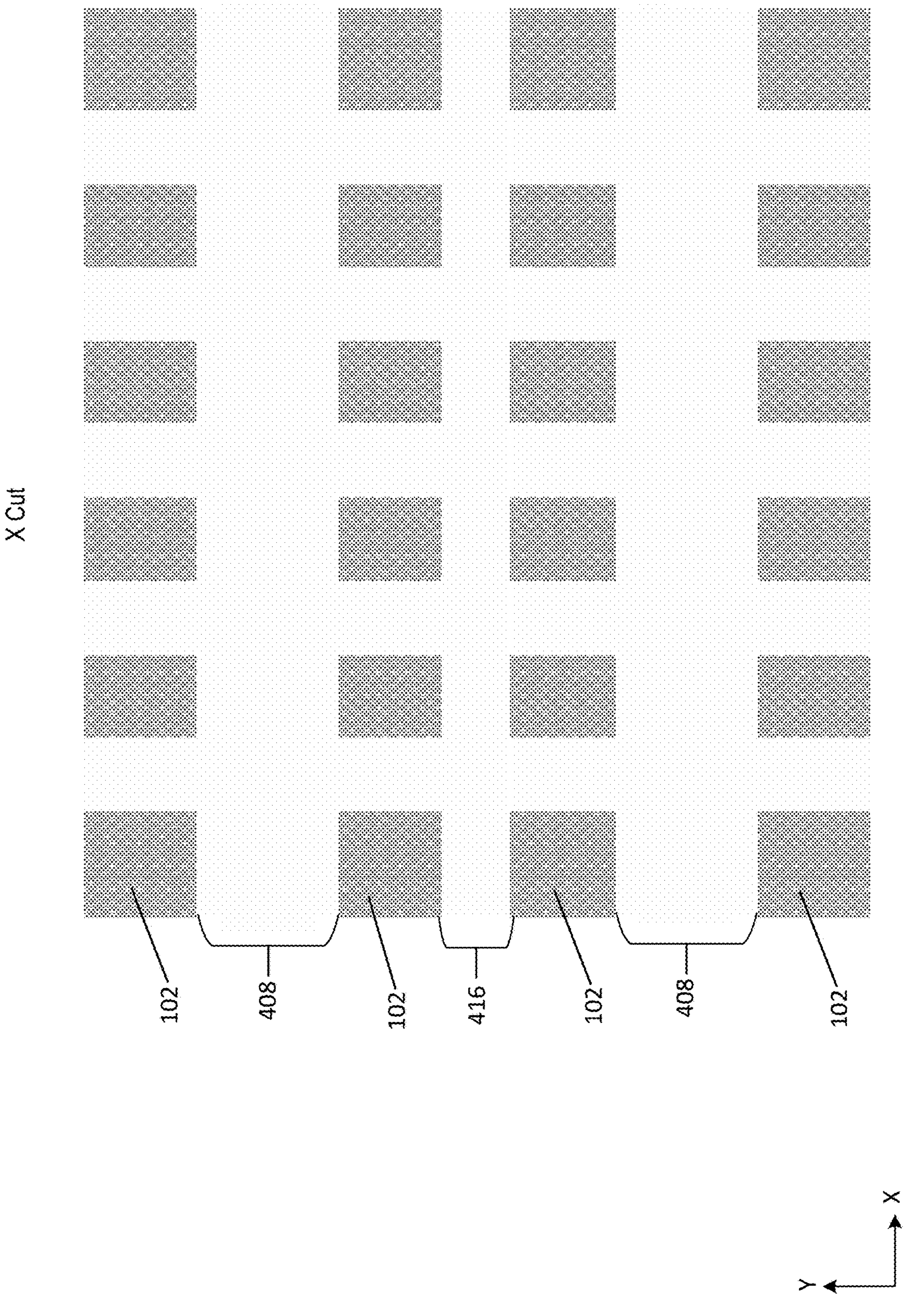
FIG. 4J is a top view of the structure of FIG. 4I taken across the X-cut line.
Figure 4K:
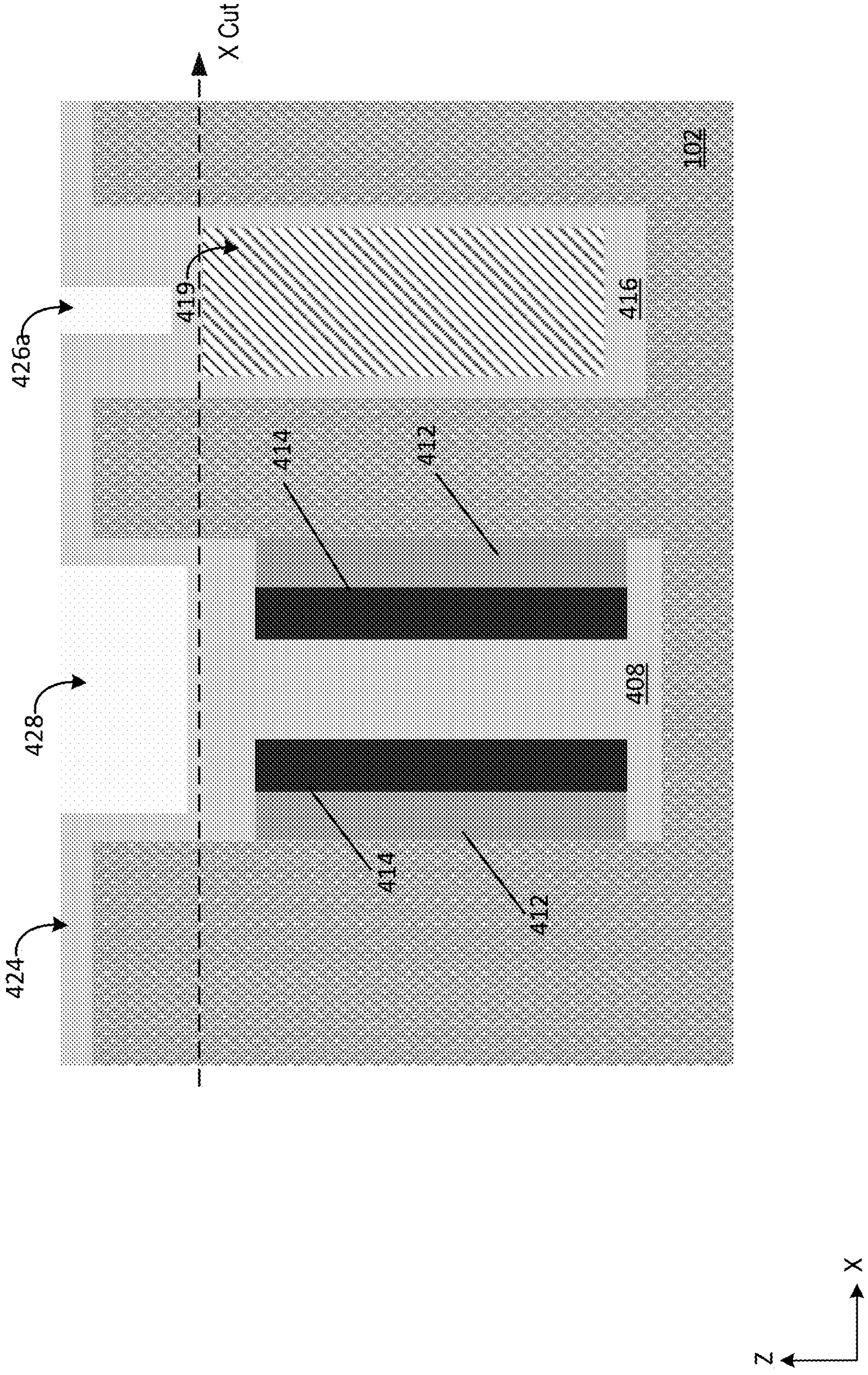
FIG. 4K is a cross-sectional view of a sixth intermediate structure showing the structure of FIG. 4I after a liner oxide deposition.
Figure 4L:
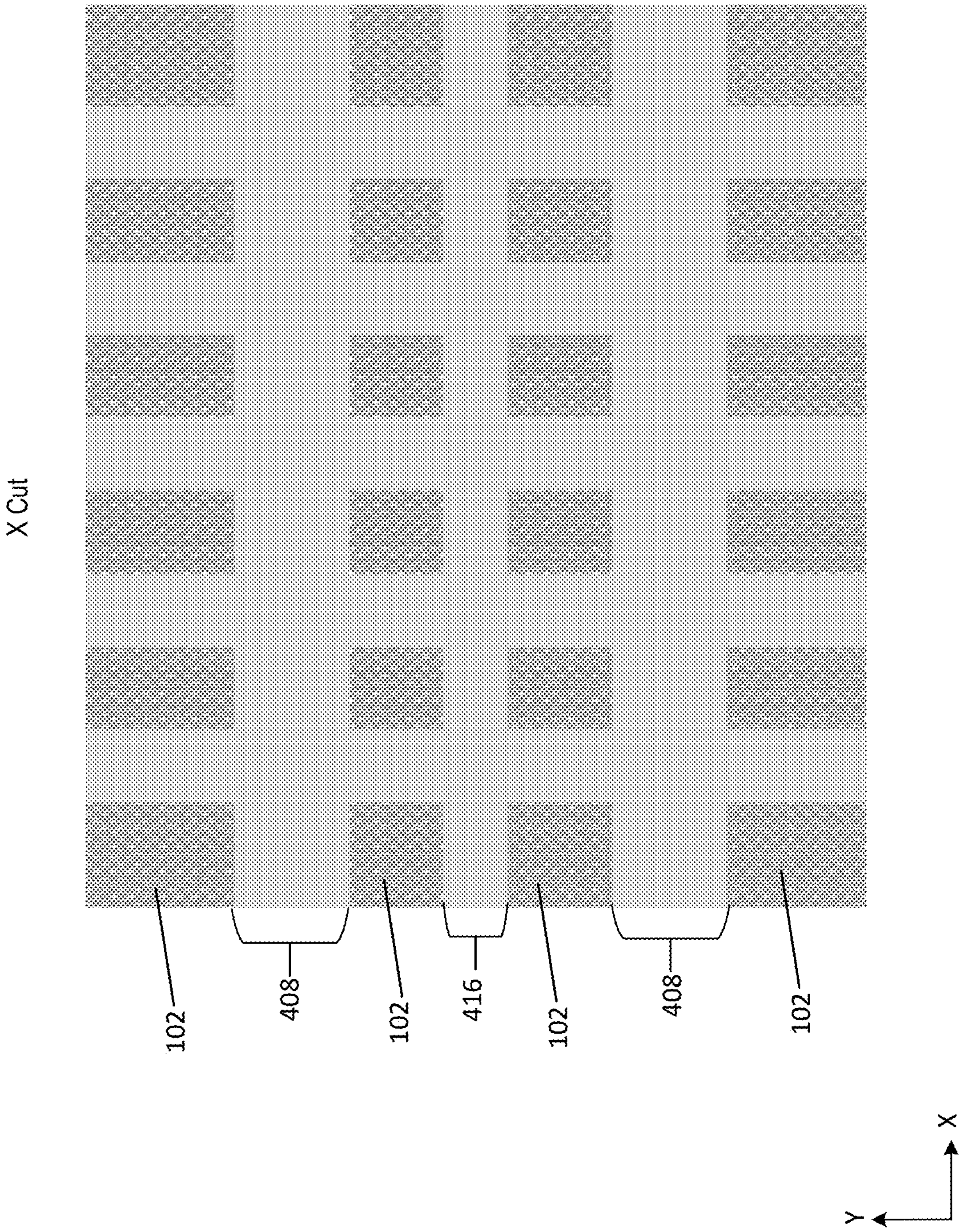
FIG. 4L is a top view of the structure of FIG. 4K taken across the X-cut line.
Figure 4M:
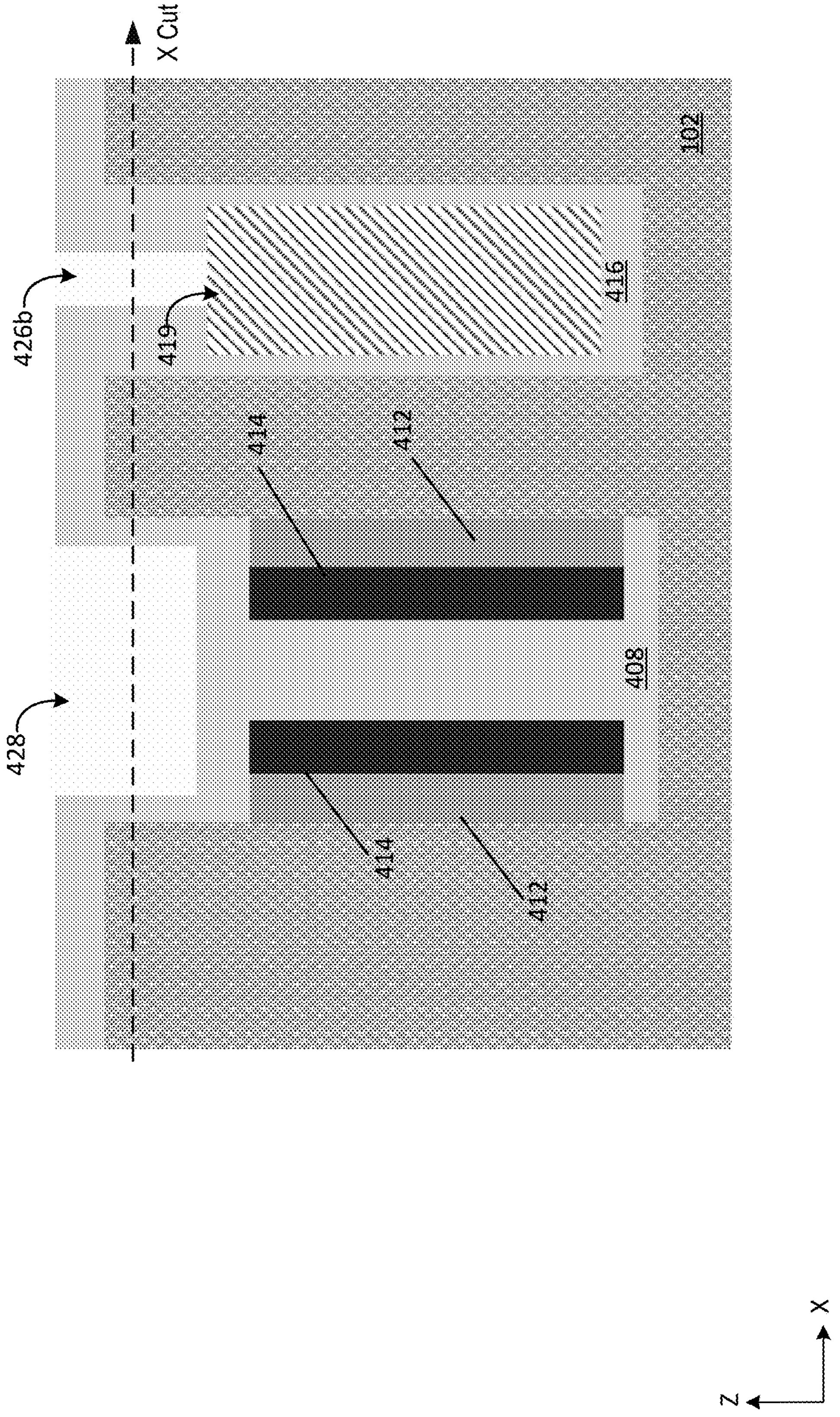
FIG. 4M is a cross-sectional view of a seventh intermediate structure showing the structure of FIG. 4K after a dielectric deposition.
Figure 4N:
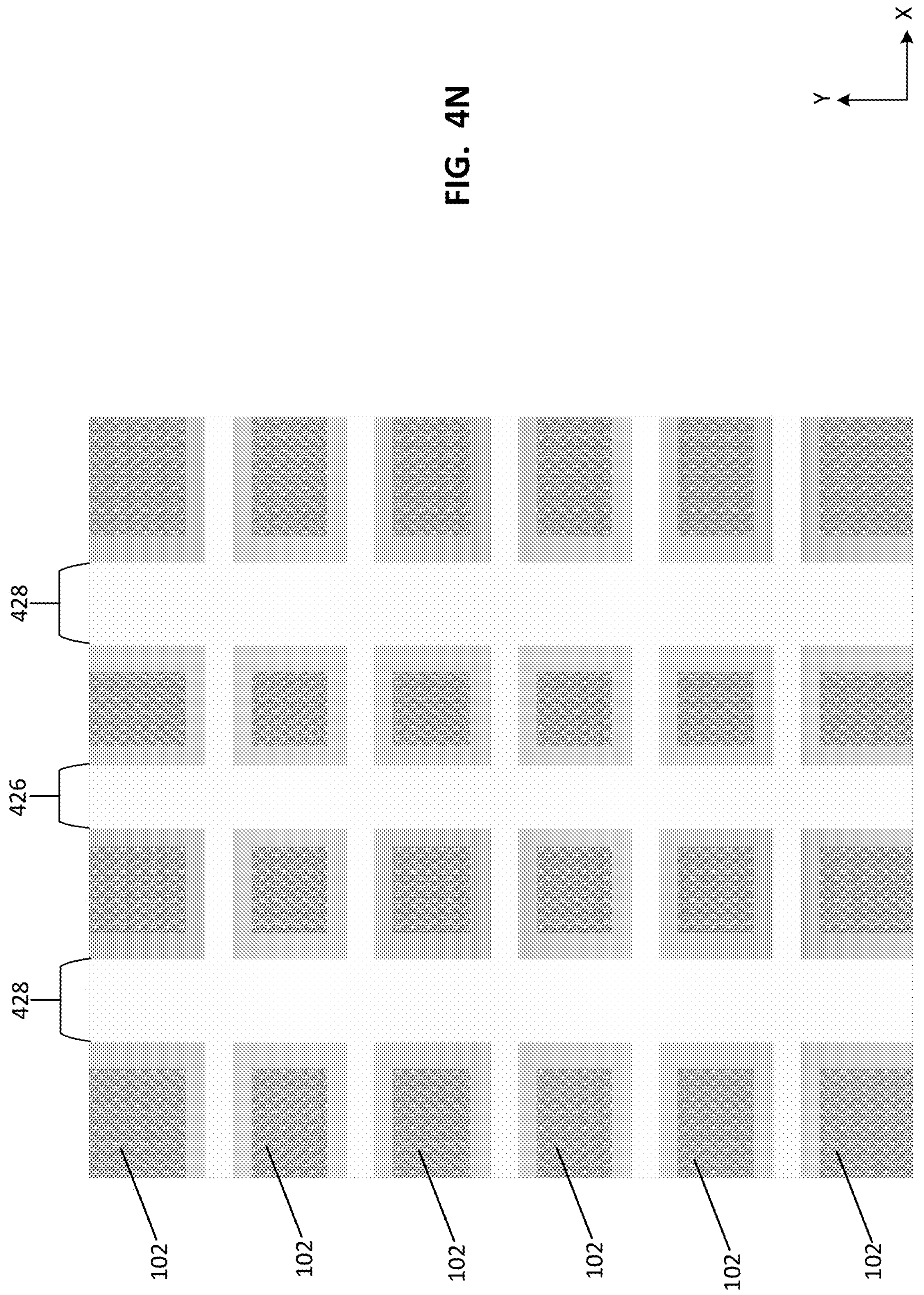
FIG. 4N is a top view of the structure of FIG. 4M taken across the X-cut line.
Figure 4P:
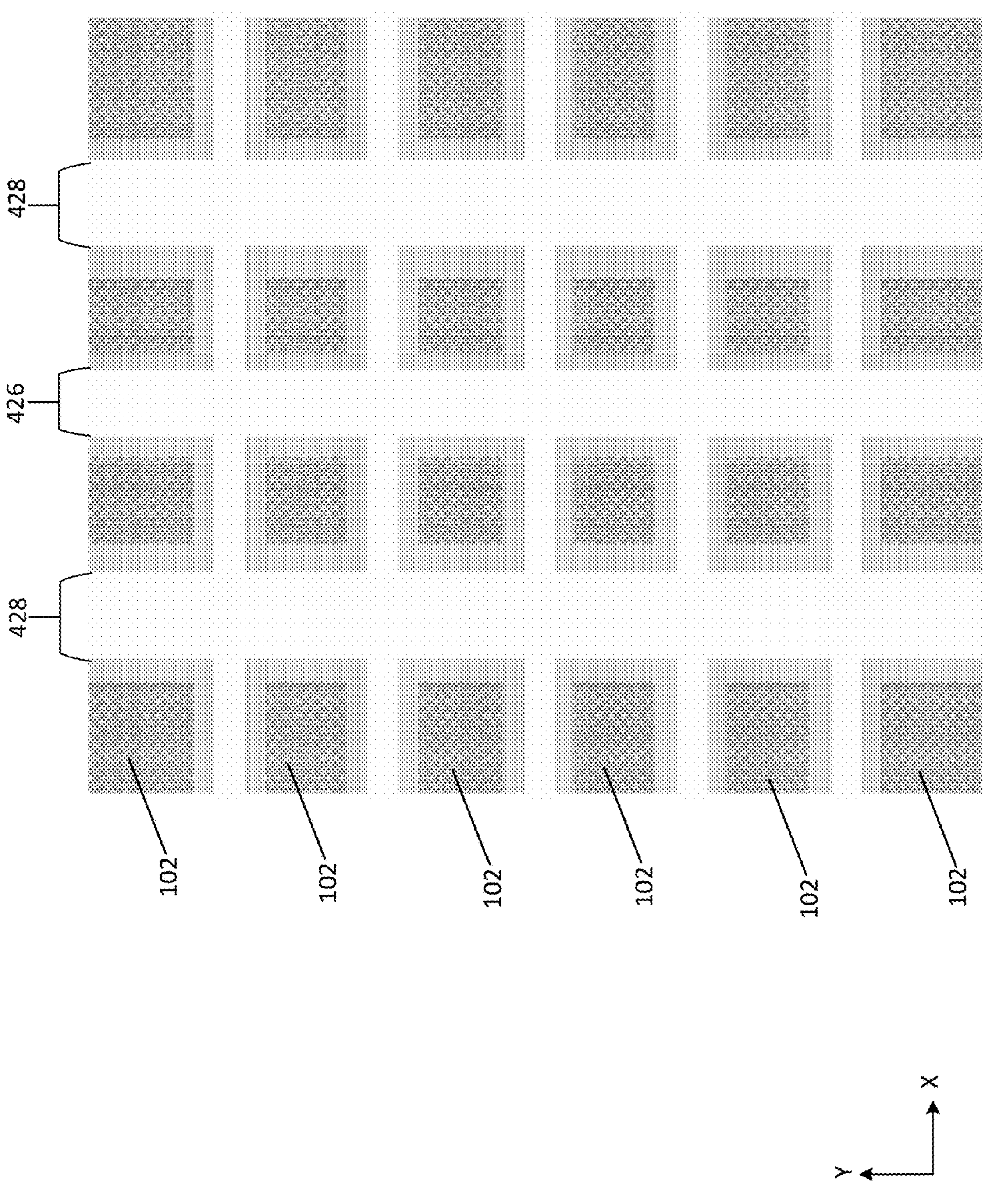
FIG. 4P is a top view of the structure of FIG. 4O taken across the X-cut line.
Figure 4Q:
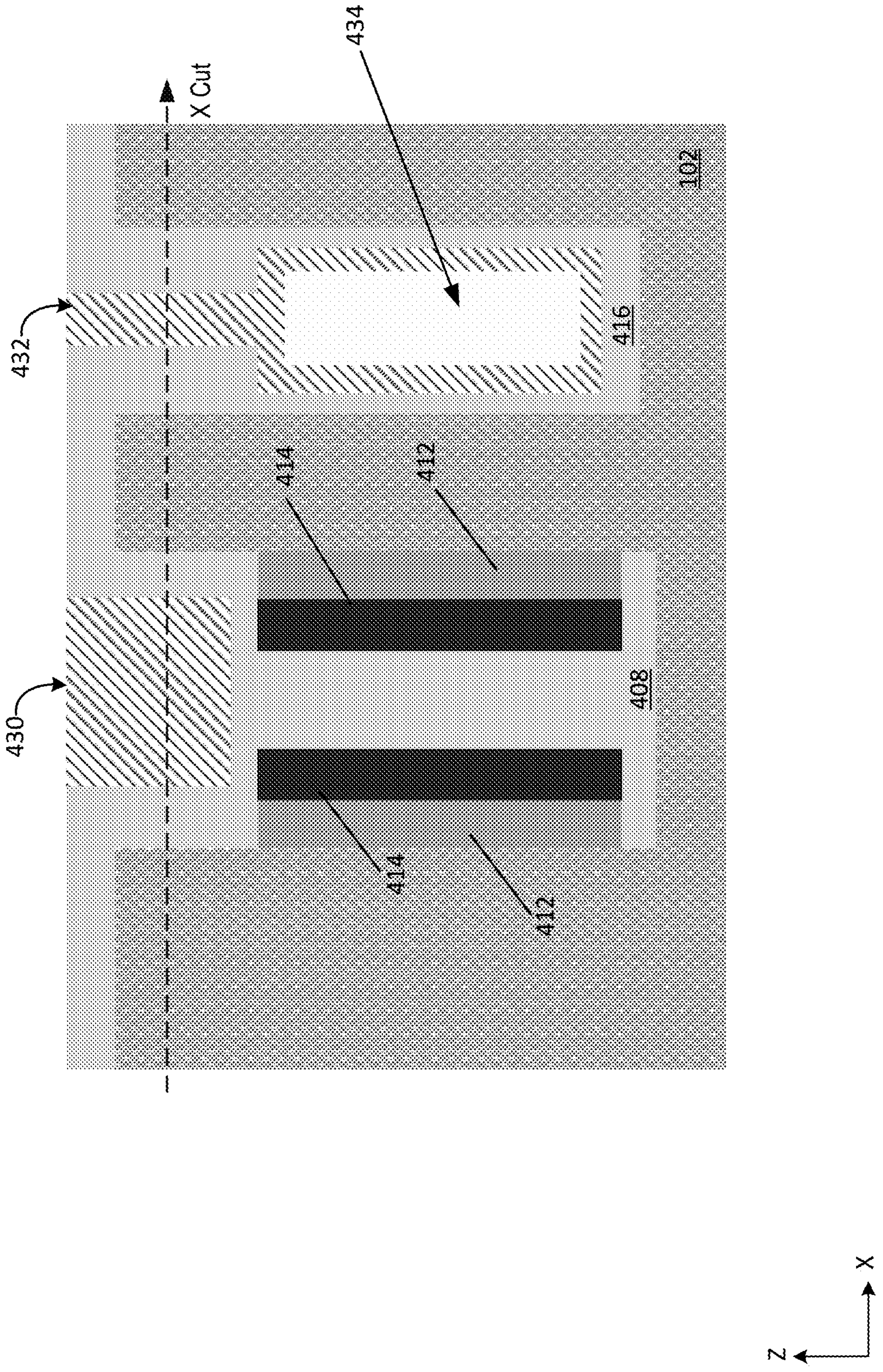
FIG. 4Q is a cross-sectional view of a ninth intermediate structure showing the structure of FIG. 4O after a silicon nitride deposition.
Figure 4R:
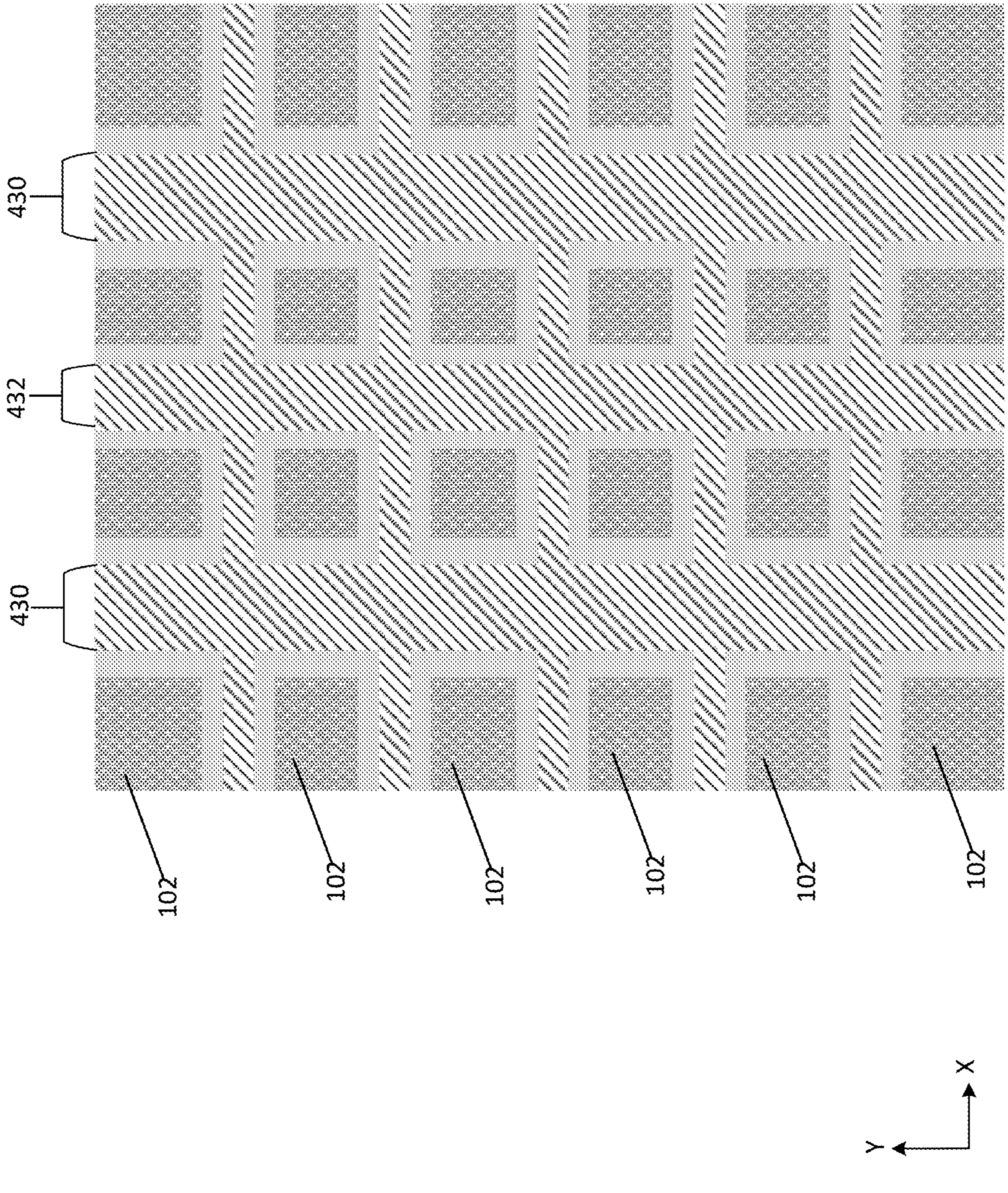
FIG. 4R is a top view of the structure of FIG. 4Q taken across the X-cut line.
Figure 4S:
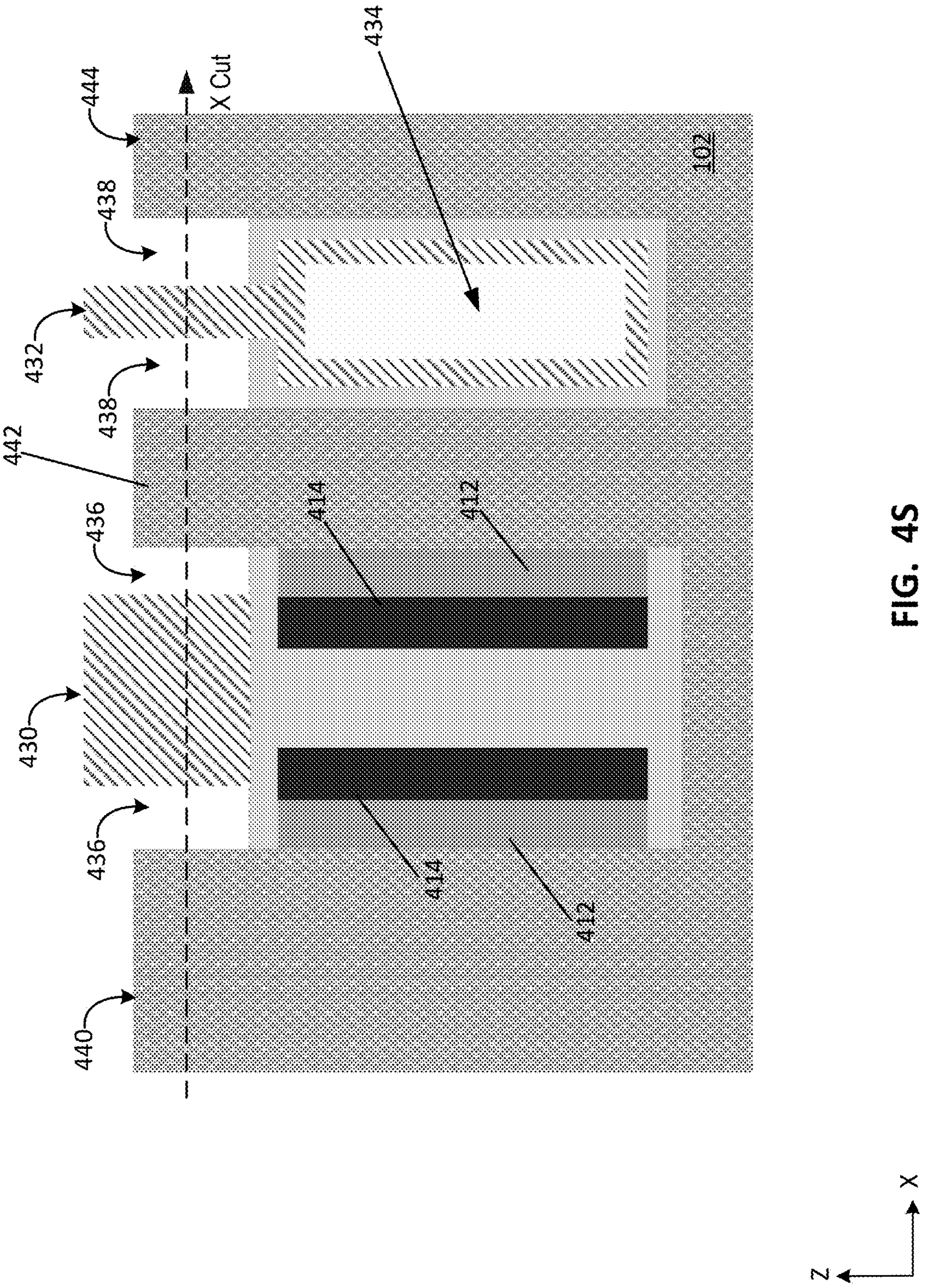
FIG. 4S is a cross-sectional view of a tenth intermediate structure showing the removal of a portion of the dielectric.
Figure 4T:
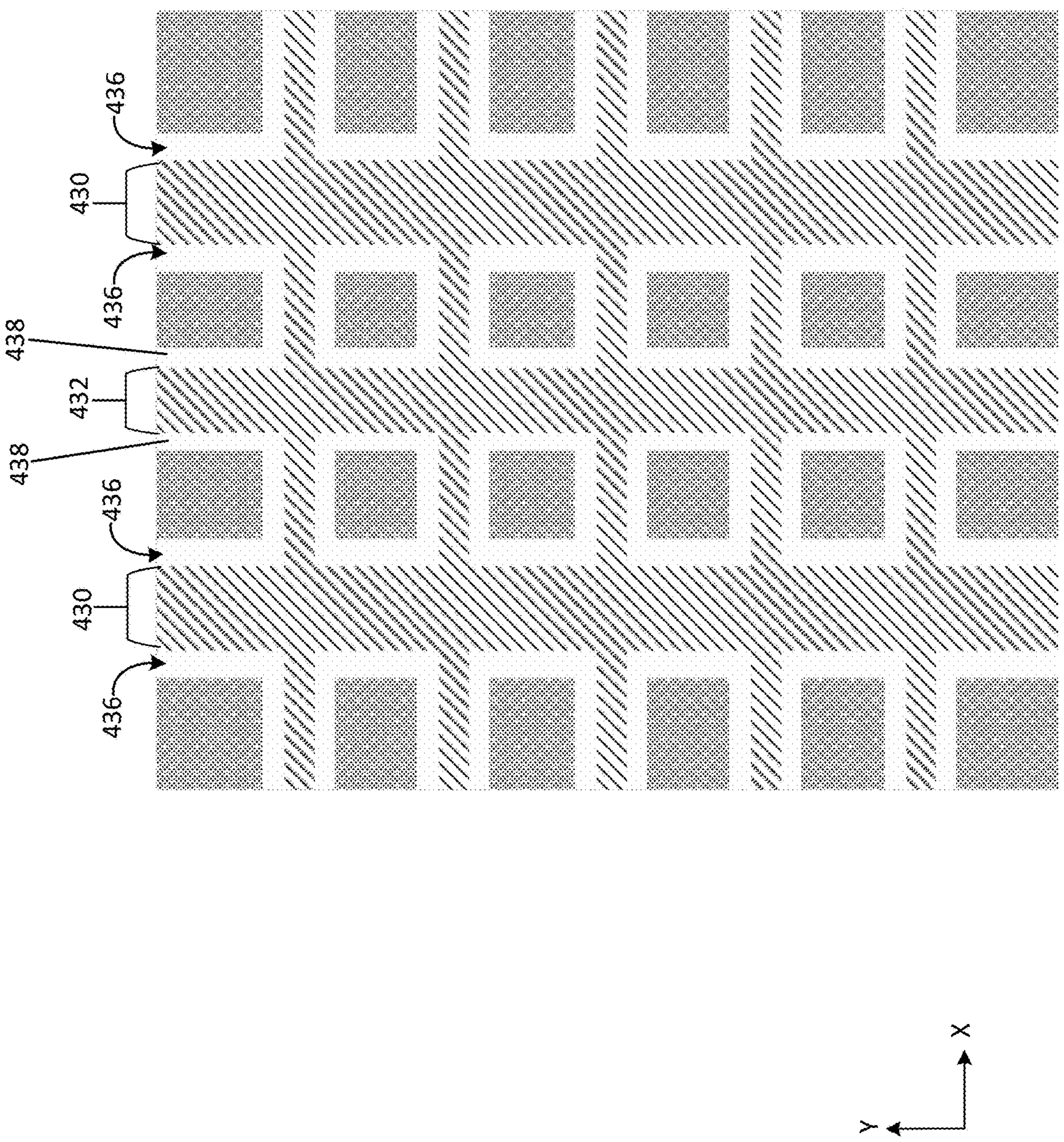
FIG. 4T is a top view of the structure of FIG. 4S taken across the X-cut line.
Figure 4U:
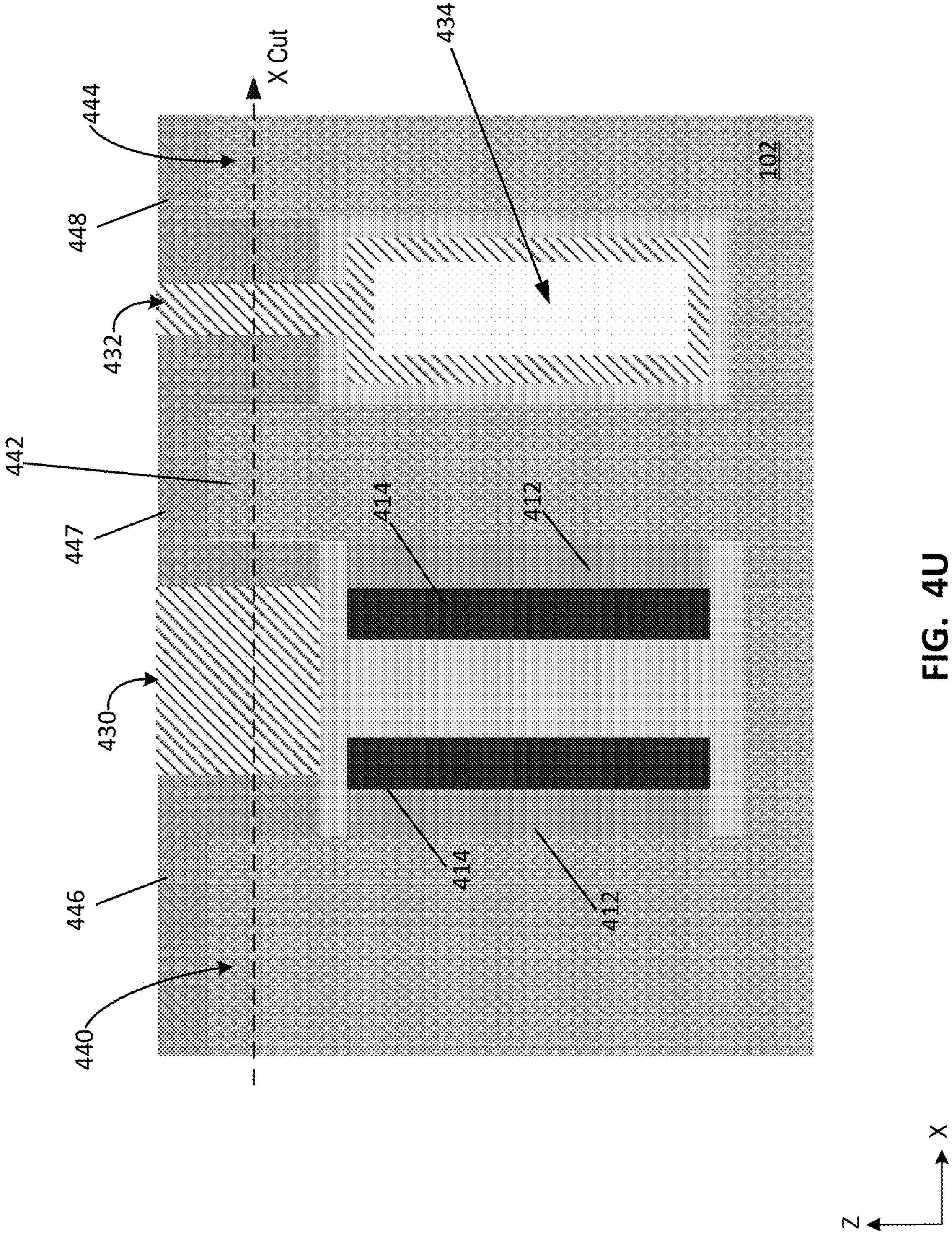
FIG. 4U is a cross-sectional view of the structure of FIG. 4S showing that the removed dielectric portion has been filled by the deposition of a polysilicon layer.
Figure 4W:
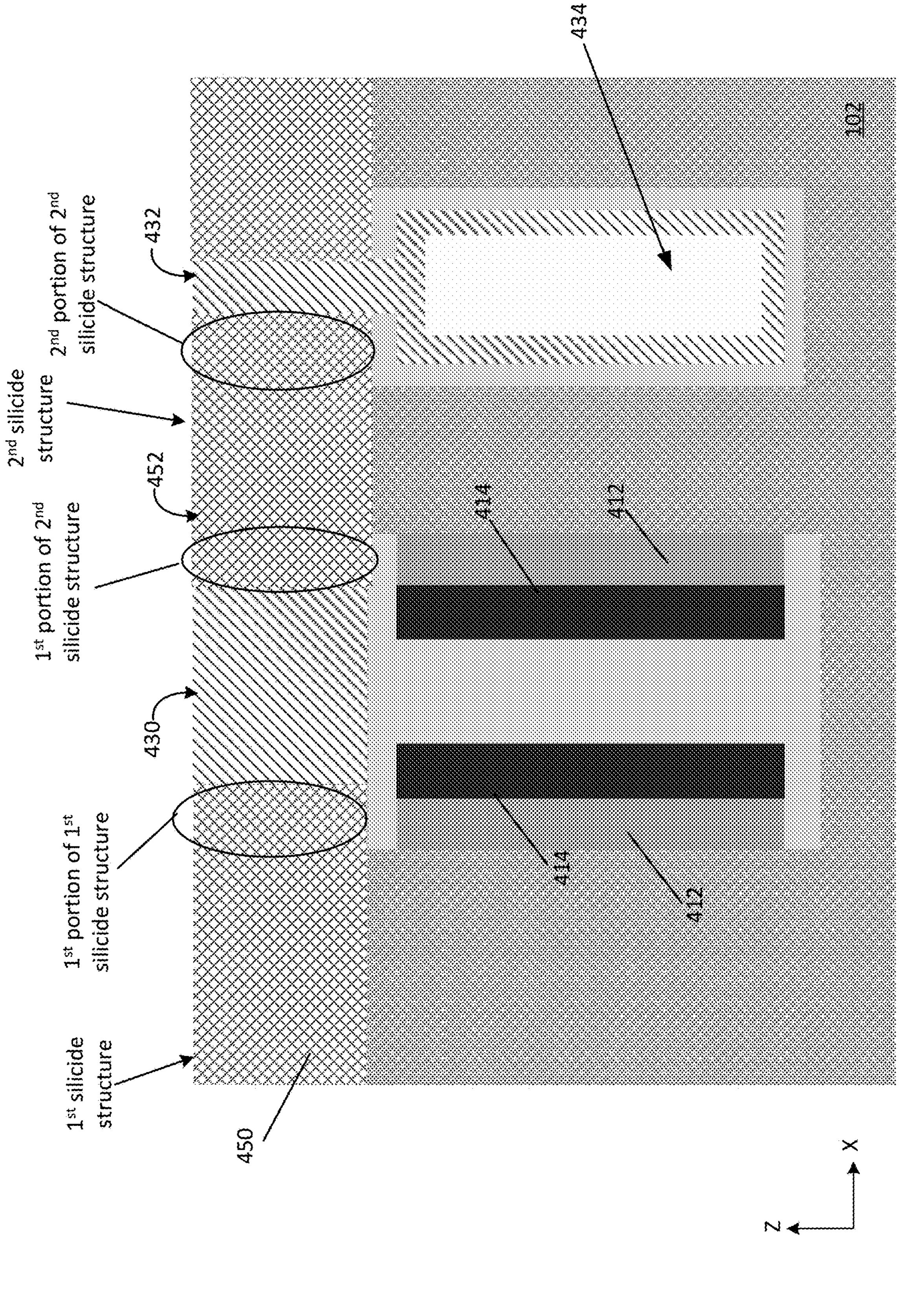
FIG. 4W is a cross-sectional view of the structure of FIG. 4U after the polysilicon layer, and portions of the semiconductor pillars under the polysilicon layer have been converted to a metal silicide.

FIGS. 4A-4W illustrate various intermediate structures formed during an illustrative alternative method of making a semiconductor device having enlarged metal silicide regions in accordance with this disclosure. The implementation of FIGS. 4A-4W illustrates a method of making a semiconductor device that includes vertically-oriented transistors and an air gap structure.

FIG. 4A is a cross-sectional view of a first intermediate structure 400 formed during the process of manufacturing a structure in accordance with this disclosure. It is noted that various implementations in accordance with this disclosure are compatible with CMOS processes. First intermediate structure 400 includes a semiconductor substrate 102 having a top surface 404, a bottom surface 406, and a trench 408. A dielectric material 410, such as but not limited to silicon dioxide, is used to fill trench 408 and surround the first and second vertically-oriented FETs. FIG. 4A further shows a first vertically-oriented field effect transistor (FET) and a second vertically-oriented FET disposed within trench 408.

Still referring to FIG. 4A, each FET has a gate dielectric 412, and a gate electrode 414. In some implementations, gate dielectric 412 may be silicon dioxide, and gate electrode 414 may be tungsten. Various implementations in accordance with this disclosure may use other materials to form gate dielectric 412, and gate electrode 414.

FIG. 4B is a top view of the structure of FIG. 4A taken across the X-cut line as shown in FIG. 4A. In the level of the X-cut shown in this view, the arrangement of semiconductor substrate 102 and dielectric material 410 in the x-y plane can be seen.

FIG. 4C is a cross-sectional view of a second intermediate structure formed during the process of manufacturing a structure in accordance with this disclosure. The second intermediate structure shown in FIG. 4C may be formed from first intermediate structure 400 by performing several processing steps. A trench 416 may be formed by forming a patterned masking layer and then etching away a portion of semiconductor substrate 102, forming a dielectric liner on the surfaces of trench 416, and filling the remainder of trench 416 with a dielectric material 418. In this illustrative implementation, dielectric material 418 has different etch characteristics than the dielectric liner of trench 416. In some implementations, the dielectric liner of trench 416 is silicon dioxide, and dielectric material 418 is silicon nitride.

FIG. 4D is a top view taken across the X-cut line of the structure of FIG. 4C. In the level of the X-cut shown in this view, the arrangement of semiconductor substrate 102, trench 408 (filled with dielectric material 410), and dielectric material 418 in the x-y plane can be seen. Although not visible at this X-cut level, it is noted that the first and second vertically-oriented FETs are disposed within trench 408 (as shown in FIGS. 4A and 4C) at a level below that shown in FIG. 4D.

FIG. 4E is a cross-sectional view of a third intermediate structure formed during the process of manufacturing a structure in accordance with this disclosure wherein a portion of dielectric material 418 has been removed, resulting in a dielectric structure 419 and an empty portion 420 of trench 416 disposed above dielectric structure 419. The removal of the aforementioned portion of dielectric material 418 may be accomplished by etching. In this illustrative implementation, dielectric structure 419 has different etch characteristics than the dielectric liner of trench 416. In some implementations, the dielectric liner of trench 416 is silicon dioxide, and dielectric structure 419 is silicon nitride.

FIG. 4F is a top view taken across the X-cut line of the structure of FIG. 4E. In the level of the X-cut shown in this view, the arrangement of semiconductor substrate 102, trench 408 (filled with dielectric material 410), and empty portion 420 in the x-y plane can be seen. Although not visible at this X-cut level, it is noted that the first and second vertically-oriented FETs are disposed within trench 408 (as shown in FIGS. 4A and 4C) at a level below that shown in FIG. 4F.

FIG. 4G is a cross-sectional view of a fourth intermediate structure formed during the process of manufacturing a structure in accordance with this disclosure wherein empty portion 420, created by the removal of a portion of dielectric material 418, is filled with a dielectric material. That is, FIG. 4G is the same as FIG. 4E, except for empty portion 420 being filled with a dielectric material. In this illustrative implementation, empty portion 420 is filled by depositing a dielectric material that is the same as the material of the dielectric liner of trench 416. Alternative implementations are not limited to filling empty portion 420 with a dielectric material that is the same as the material of the dielectric liner of trench 416.

FIG. 4H is a top view of the structure of FIG. 4G taken across the X-cut line. In the level of the X-cut shown in this view, the arrangement of semiconductor substrate 102, trench 408 (filled with dielectric material 410), and trench 416 (with a dielectric layer disposed over dielectric structure 419) in the x-y plane can be seen. Although not visible at this X-cut level, it is noted that the first and second vertically-oriented FETs are disposed within trench 408 (as shown in FIGS. 4A and 4C) at a level below that shown in FIG. 4H.

FIG. 4I is a cross-sectional view of a fifth intermediate structure formed by a dielectric recess operation of the process of manufacturing a structure in accordance with this disclosure. The fifth intermediate structure of FIG. 4I may be obtained from the fourth intermediate structure of FIG. 4G by removing a portion of the dielectric material from an upper region (i.e., at least the region above the vertically-oriented FETs) of trench 408, and removing a portion of the dielectric material from an upper region (i.e., at least the region above dielectric structure 419) of trench 416. This dielectric recess operation produces recesses 422. The dielectric recess operation may be a selective etch process that leaves dielectric structure 419 in place.

FIG. 4J is a top view of the structure of FIG. 4I taken across the X-cut line. In the level of the X-cut shown in this view, the arrangement of semiconductor substrate 102, trench 408 (wherein the first and second vertically-oriented FETs are located but not visible at this X-cut level), and trench 416 (where dielectric structure 419 is located) in the x-y plane can be seen.

FIG. 4K is a cross-sectional view of a sixth intermediate structure showing the structure of FIG. 4I after the deposition of a liner 424. Liner 424 is silicon dioxide in this illustrative implementation. Liner 424 covers the surfaces previously exposed by the dielectric recess operation (see FIG. 4I). It is noted that trench 416 is narrower in the x-direction than trench 408. As discussed above, a first vertically-oriented FET and a second vertically-oriented FET are disposed in trench 408. Therefore, in this illustrative implementation, trench 408 may be wider in the x-direction than trench 416 to accommodate the presence of the first and second vertically-oriented FETs. Because the width of trench 416 is less than that of trench 408, the dielectric deposition produces a recess 426*a* that is narrower than a recess 428 produced in trench 408. In other words, recess 426*a* has a higher aspect ratio than recess 428 Alternative implementations are not limited to the use of silicon dioxide as liner 424; however, the alternative dielectric material used for liner 424 should have different etch characteristics from those of dielectric structure 419 to enable a subsequent selective etching of dielectric structure 419 while leaving liner 424 in place.

FIG. 4L is a top view of the structure of FIG. 4K taken across the X-cut line shown in FIG. 4K. In the level of the X-cut shown in this view, the arrangement of semiconductor substrate 102, trenches 408 (wherein the vertically-oriented FETs are located but not visible at this X-cut level), and trench 416 (where dielectric structure 419 is located) in the x-y plane can be seen.

FIG. 4M is a cross-sectional view of a seventh intermediate structure showing the structure of FIG. 4K after a dielectric etch operation. This dielectric etch operation, which may be referred to as a "liner oxide punch," removes a portion of liner 424 that is disposed on a top surface of dielectric structure 419. In this way, recess 426*a* (of FIG. 4K) is transformed into recess 426*b*.

FIG. 4N is a top view of the structure of FIG. 4M taken across the X-cut line shown in FIG. M. In the level of the X-cut shown in this view, the arrangement of semiconductor substrate 102, recess 426*b*, and recess 428 in the x-y plane can be seen.

FIG. 4O is a cross-sectional view of an eighth intermediate structure showing the structure of FIG. 4M after removal of dielectric structure 419. In this illustrative implementation, dielectric structure 419 is silicon nitride, and it is surrounded by silicon dioxide. Thus, the difference in etch characteristics between silicon dioxide and silicon nitride enabled the removal by etching of dielectric structure 419 while leaving in place the silicon dioxide liner in trench 416. It is noted that prior to removing dielectric structure 419 by etching, a layer of dielectric material disposed between the bottom of recess 426*a* and the top of dielectric structure 419 should also be removed so that etchants can reach dielectric structure 419.

FIG. 4P is a top view of the structure of FIG. 4O taken across the X-cut line shown in FIG. 4O. In the level of the X-cut shown in this view, the arrangement of semiconductor substrate 102, recess 426*b*, and recess 428 in the x-y plane can be seen.

FIG. 4Q is a cross-sectional view of a ninth intermediate structure showing the structure of FIG. 4O after a silicon nitride deposition to form structure 430 and structure 432. In this illustrative implementation, structures 430 and 432 are both formed of silicon nitride. In alternative implementations, a material other than silicon nitride may be used to form structures 430 and 432, provided that the material has etch characteristics different from the dielectric material surrounding structures 430 and 432 so that the surrounding dielectric material may be selectively etched while leaving structures 430 and 432 in place.

Still referring to FIG. 4Q, structure 430 fills recess 428 (shown in FIG. 4O), and structure 432 fills recess 426 (shown in FIG. 4M) as well as providing a liner around an air gap 434 in trench 416.

FIG. 4R is a top view of the structure of FIG. 4Q taken across the X-cut line shown in FIG. 4Q. In the level of the X-cut shown in this view, the arrangement of semiconductor substrate 102, structure 430, and structure 432 in the x-y plane can be seen.

FIG. 4S is a cross-sectional view of a tenth intermediate structure showing the removal of a portion of the dielectric around structures 430 and 432, and from the top surfaces of semiconductor substrate 102. The removal of the dielectric around structure 430 produces recess 436. The removal of the dielectric around structure 432 produces recess 438. The removal of the aforementioned dielectric material may be achieved with a selective etch that leaves semiconductor substrate 102 and structures 430 and 432 in place. In this illustrative implementation, the dielectric material is silicon dioxide, semiconductor substrate 102 is single crystal silicon, and structures 430 and 432 are silicon nitride. Those skilled in the art will appreciate that the etch chemistries chosen for removal of the dielectric material surrounding structures 430 and 432 may depend on the material choices for semiconductor substrate 102, and structures 430 and 432 in order to leave those in place while removing the dielectric material.

Still referring to FIG. 4S, recess 436 exposes an upper side portion of a semiconductor post 440 and a first upper side portion of a semiconductor post 442. Recess 438 exposes a second upper side portion of semiconductor post 442 and an upper side portion of a semiconductor post 444.

FIG. 4T is a top view of the structure of FIG. 4S taken across the X-cut line shown in FIG. 4S. In the level of the X-cut shown in this view, the arrangement of recesses 436 and recesses 438, and structures 430 and 432 in the x-y plane can be seen.

FIG. 4U is a cross-sectional view of the structure of FIG. 4S showing that recesses 436 and 438 have been filled by depositing a layer of polysilicon. The polysilicon deposition, followed by planarization, produces polysilicon enlargement structures 446, 447, and 448. Polysilicon enlargement structures 446, 447, and 448, are separate from each other by structures 430 and 432, which in this illustrative implementation are formed of silicon nitride. In addition to filling recesses 436 and 438, polysilicon enlargement structures 446, 447, and 448 also cover the exposed top surfaces of semiconductor substrate 102, i.e., the top surfaces of semiconductor posts 440, 442, and 444 (see FIG. 4S). Polysilicon enlargement structures 446, 447, and 448 increase the top area of semiconductor posts 440, 442, and 444 in the x-y plane. Polysilicon is chosen because it can be combined, via a high-temperature operation, with a metal to form a metal silicide with a desirably low sheet resistance. Materials such as, but not limited to silicon germanium, or epitaxially grown single-crystal silicon may be used in place of polysilicon to produce metal silicides.

FIG. 4V is a top view of the structure of FIG. 4U taken across the X-cut line shown in FIG. 4U. In the level of the X-cut shown in this view, the arrangement of polysilicon enlargement structures 446, 447, 448, semiconductor posts 440, 442, 444, and structures 430 and 432 in the x-y plane can be seen.

FIG. 4W is a cross-sectional view of the structure of FIG. 4U after polysilicon enlargement structures 446, 447, 448, and portions of semiconductor posts (or pillars) 440, 442, and 444 under the polysilicon enlargement structures 446, 447, 448, have been converted to a metal silicide. Polysilicon enlargement structure 446 along with an underlying portion of semiconductor post 440 have been converted to a metal silicide structure 450. Polysilicon enlargement structure 447 along with an underlying portion of semiconductor post 442 have been converted to a metal silicide structure 452. In some implementations, a silicidation operation may include depositing a layer of metal on silicon, and heating the materials to form a metal silicide layer. The layer of a metal that is deposited may include, but is not limited to, titanium, cobalt, nickel, tungsten, platinum, and molybdenum, for example. By fabricating an enlarged metal silicide area, in accordance with this disclosure, the contact resistance to a source/drain terminal of a vertically-oriented FET may be reduced.

Figure 4X:
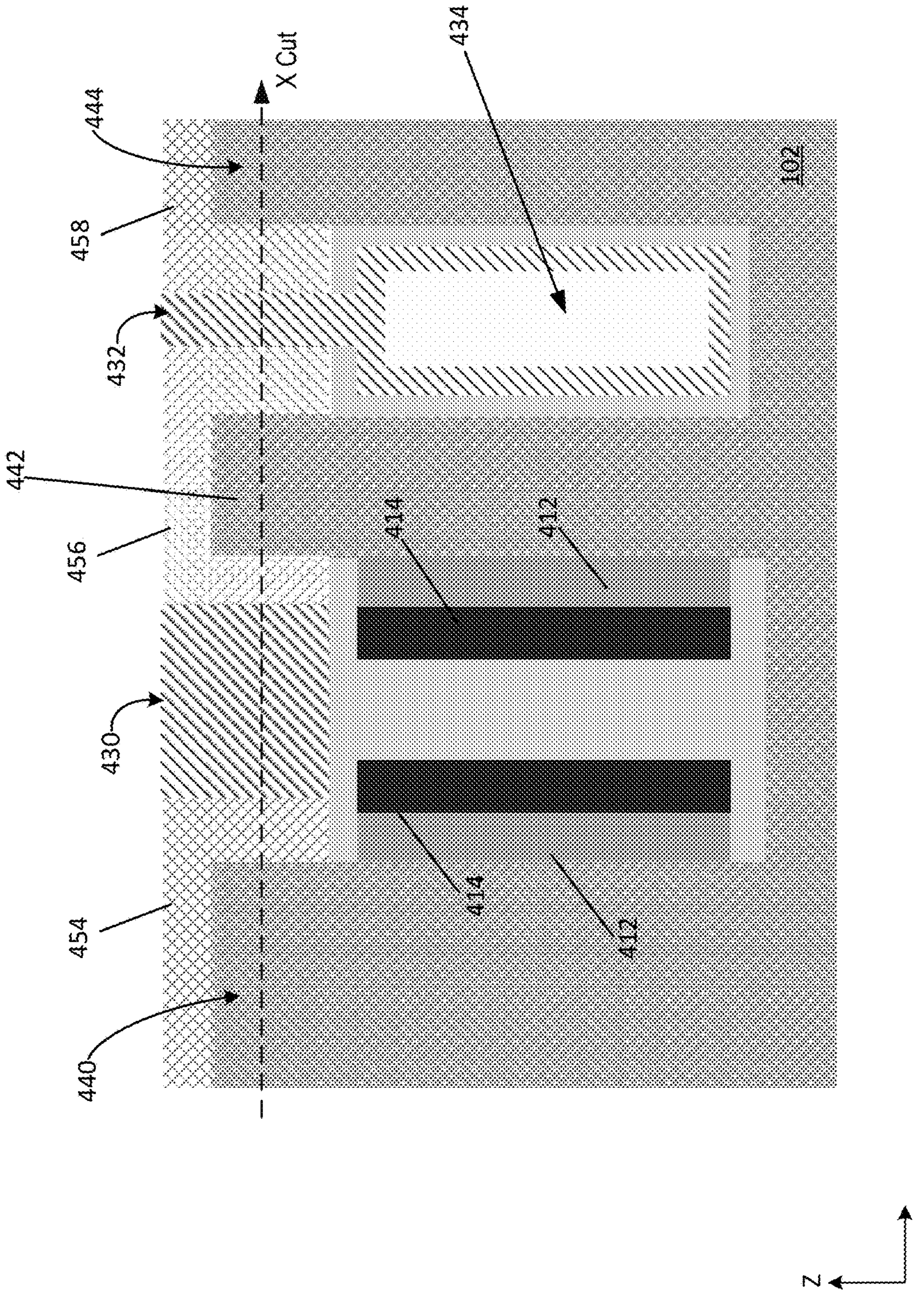
FIG. 4X is a cross-sectional view of the structure of FIG. 4U after the polysilicon layer has been converted to a metal silicide.

FIG. 4X is a cross-sectional view of the structure of FIG. 4U after polysilicon enlargement structures 446, 447, 448, and portions of semiconductor posts (or pillars) 440, 442, and 444 under the polysilicon enlargement structures 446, 447, 448, have been converted to a metal silicide. Polysilicon enlargement structure 446 has been converted to a metal silicide structure 454. Polysilicon enlargement structure 447 has been converted to a metal silicide structure 456. Polysilicon enlargement structure 448 has been converted to a metal silicide structure 458. In some implementations, a silicidation operation may include depositing a layer of metal on silicon, such as polysilicon enlargement structures 446, 447, 448, and heating the materials to form a metal silicide layer. The layer of a metal that is deposited may include, but is not limited to, titanium, cobalt, nickel, tungsten, platinum, and molybdenum, for example. By fabricating an enlarged metal silicide area, in accordance with this disclosure, the contact resistance to a source/drain terminal of a vertically-oriented FET may be reduced.

Figure 5:
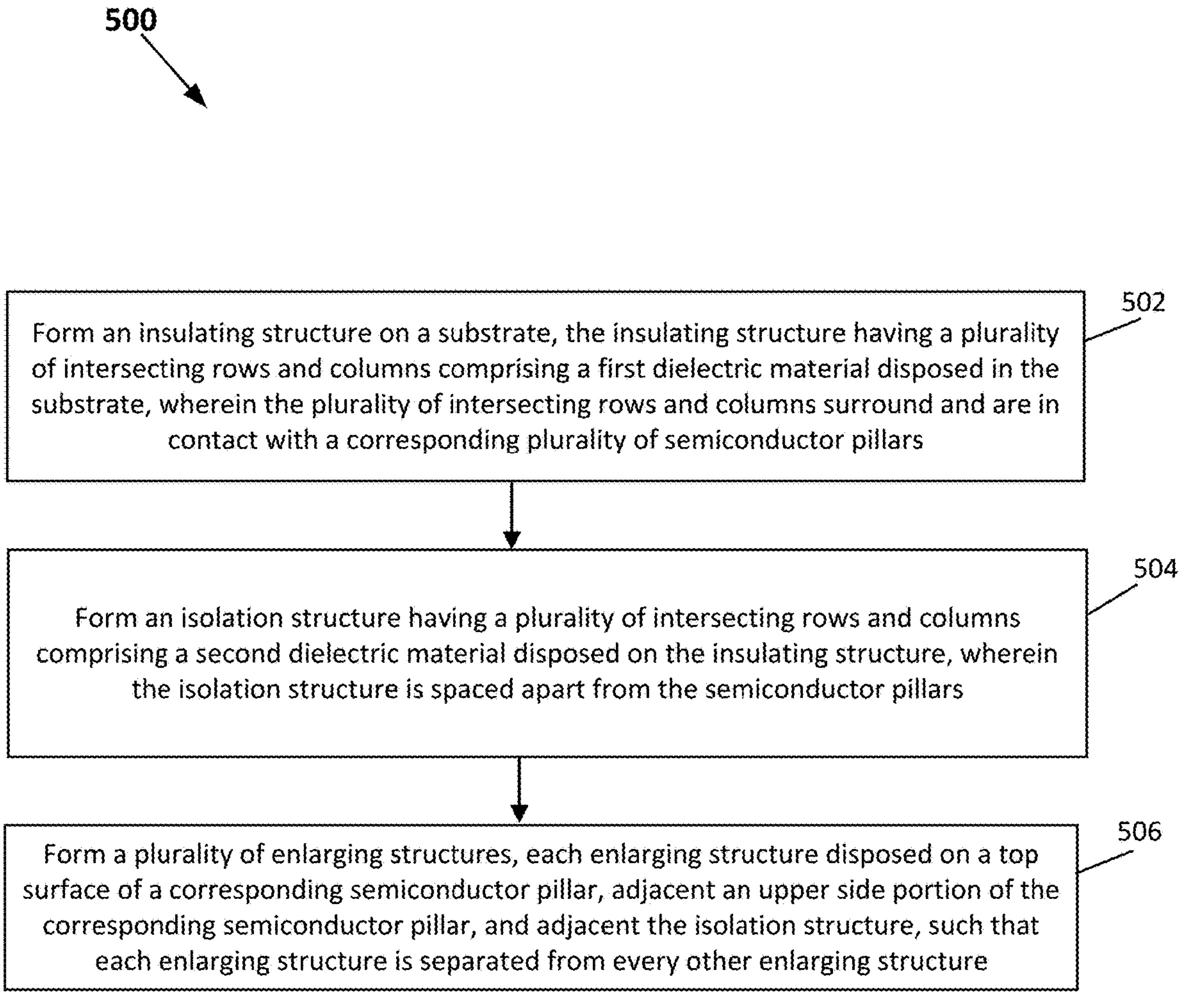
FIG. 5 is a flow diagram of an illustrative method of making a semiconductor device in accordance with this disclosure.

FIG. 5 is a flow diagram of an illustrative method 500 of making a semiconductor device in accordance with this disclosure. Method 500 includes forming, at 502, an insulating structure on a substrate, the insulating structure having a plurality of intersecting rows and columns comprising a first dielectric material disposed in the substrate, wherein the plurality of intersecting rows and columns surround and are in contact with a corresponding plurality of semiconductor pillars. Method 500 further includes forming, at 504, an isolation structure having a plurality of intersecting rows and columns comprising a second dielectric material disposed on the insulating structure, wherein the isolation structure is spaced apart from the semiconductor pillars. Method 500 still further includes forming, at 506, a plurality of enlarging structures, each enlarging structure disposed on a top surface of a corresponding semiconductor pillar, adjacent to an upper side portion of the corresponding semiconductor pillar, and adjacent to the isolation structure, such that each enlarging structure is separated from every other enlarging structure.

Figure 6:
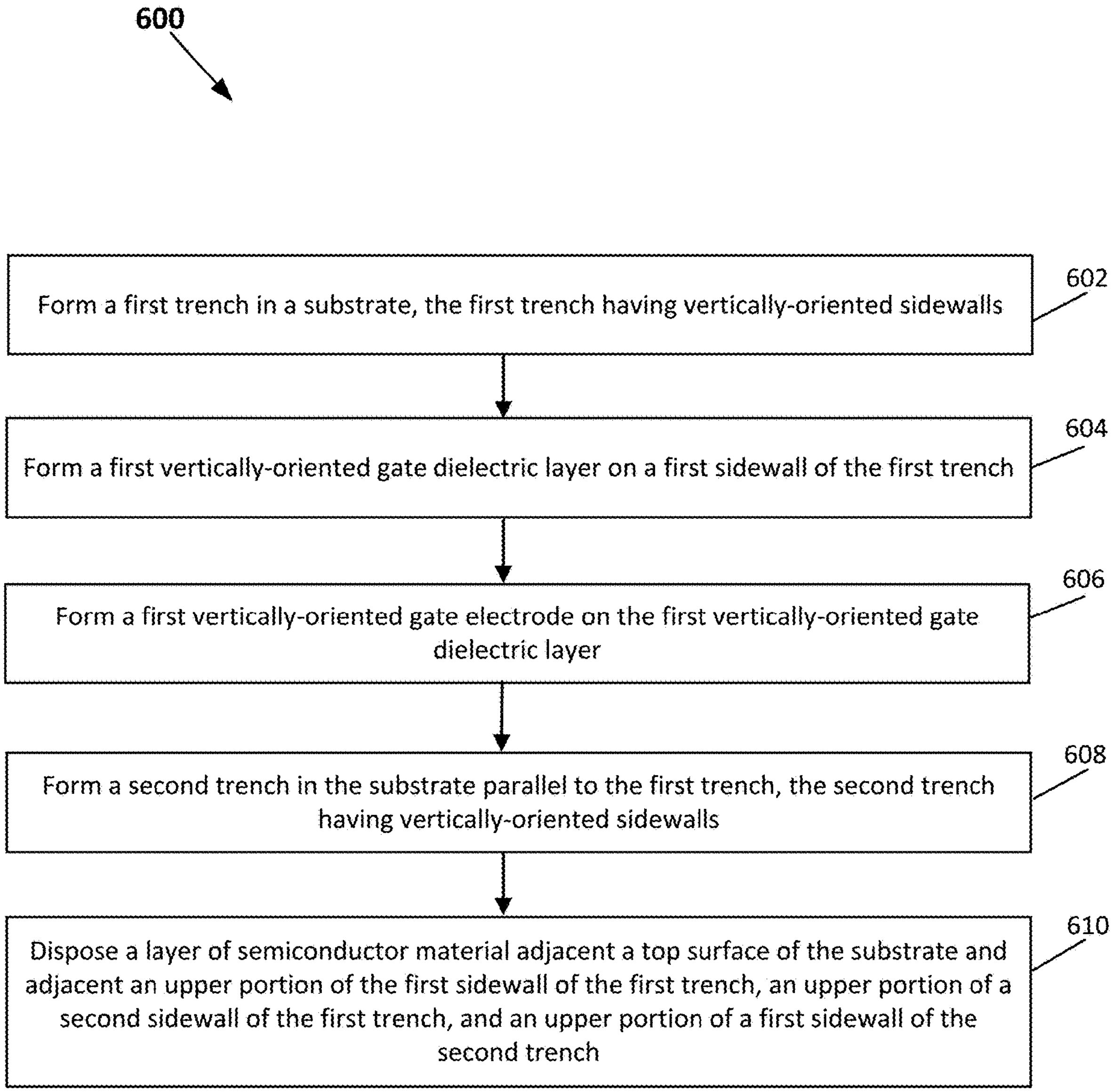
FIG. 6 is a flow diagram of an illustrative alternative method of making a semiconductor device in accordance with this disclosure.

FIG. 6 is a flow diagram of an illustrative alternative method 600 of making a semiconductor device in accordance with this disclosure. Method 600 includes forming, at 602, a first trench in a substrate, the first trench having vertically-oriented sidewalls, forming, at 604, a first vertically-oriented gate dielectric layer on a first sidewall of the first trench, and forming, at 606, a first vertically-oriented gate electrode on the first vertically-oriented gate dielectric layer. Method 600 further includes forming, at 608, a second trench in the substrate parallel to the first trench, the second trench having vertically-oriented sidewalls. Method 600 still further includes disposing, at 610, a layer of semiconductor material adjacent to a top surface of the substrate and adjacent to an upper portion of the first sidewall of the first trench, an upper portion of a second sidewall of the first trench, and an upper portion of a first sidewall of the second trench. In some implementations, the semiconductor material adjacent to the upper portion of the first sidewall of the first trench is not in direct contact with the semiconductor material adjacent to the upper portion of the second sidewall of the first trench.

Figure 7:
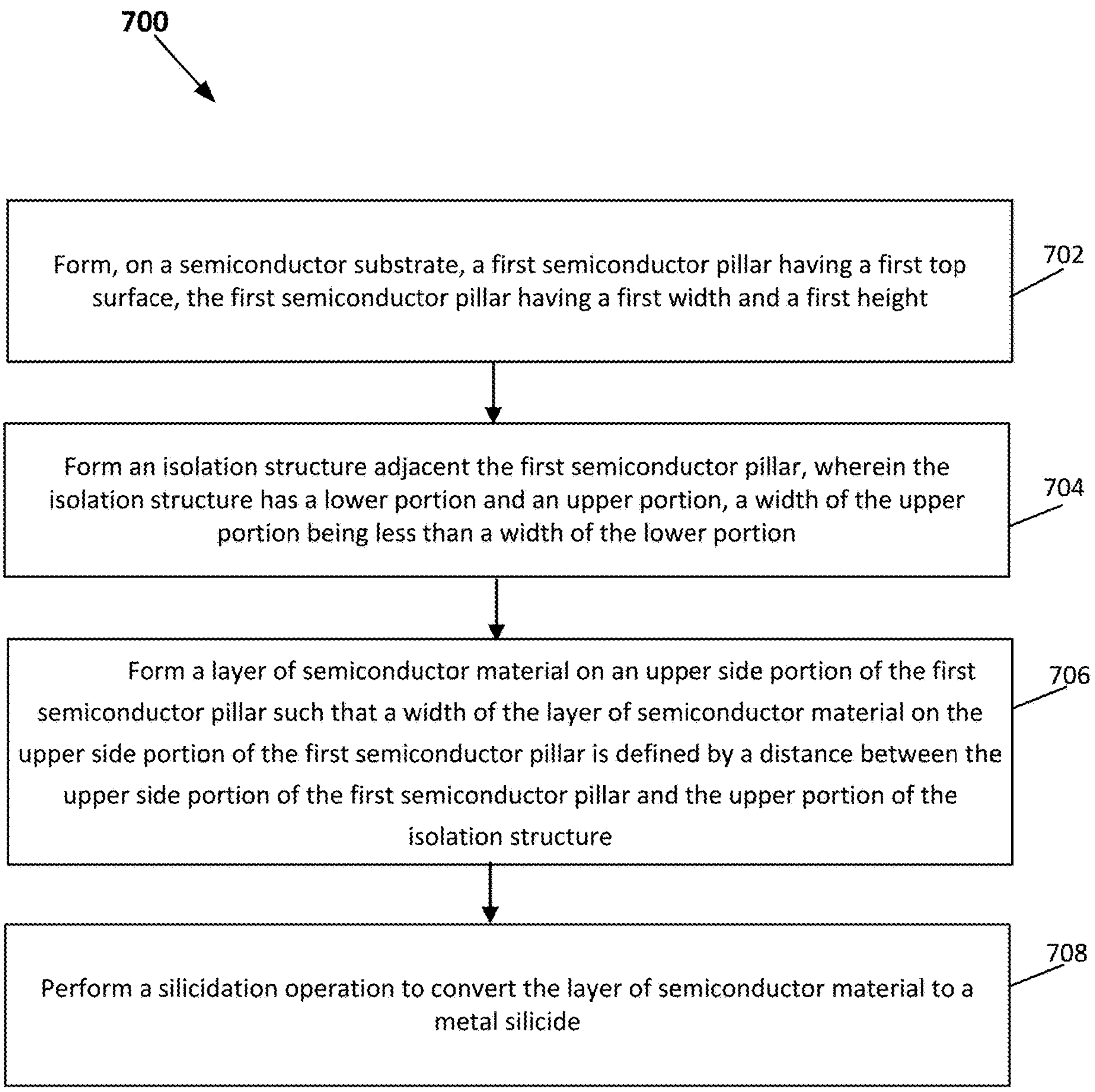
FIG. 7 is a flow diagram of another illustrative alternative method of making a semiconductor device in accordance with this disclosure.

FIG. 7 is a flow diagram of another illustrative alternative method 700 of making a semiconductor device in accordance with this disclosure. Method 700 includes forming, at 702, on a semiconductor substrate, a first semiconductor pillar having a first top surface, the first semiconductor pillar having a first width and a first height, and forming, at 704, an isolation structure adjacent to the first semiconductor pillar, wherein the isolation structure has a lower portion and an upper portion, a width of the upper portion being less than a width of the lower portion. Method 700 further includes forming, at 706, a layer of semiconductor material on an upper side portion of the first semiconductor pillar such that a width of the layer of semiconductor material on the upper side portion of the first semiconductor pillar is defined by a distance between the upper side portion of the first semiconductor pillar and the upper portion of the isolation structure. Method 700 may further include performing, at 708, a silicidation operation to convert the layer of semiconductor material to a metal silicide.

Still referring to FIG. 7, in some implementations, a silicidation operation may include depositing a layer of metal on silicon, and heating the materials to form a metal silicide layer. The layer of a metal that is deposited may include, but is not limited to, titanium, cobalt, tungsten, nickel, platinum, and molybdenum, for example. Heating, at least the metal and the silicon is performed to produce a metal silicide layer. The processes and reaction kinetics of silicidation are known in this field, and therefore specifics such as deposition techniques, layer thicknesses, and heating temperatures are not discussed further herein.

Figure 8:
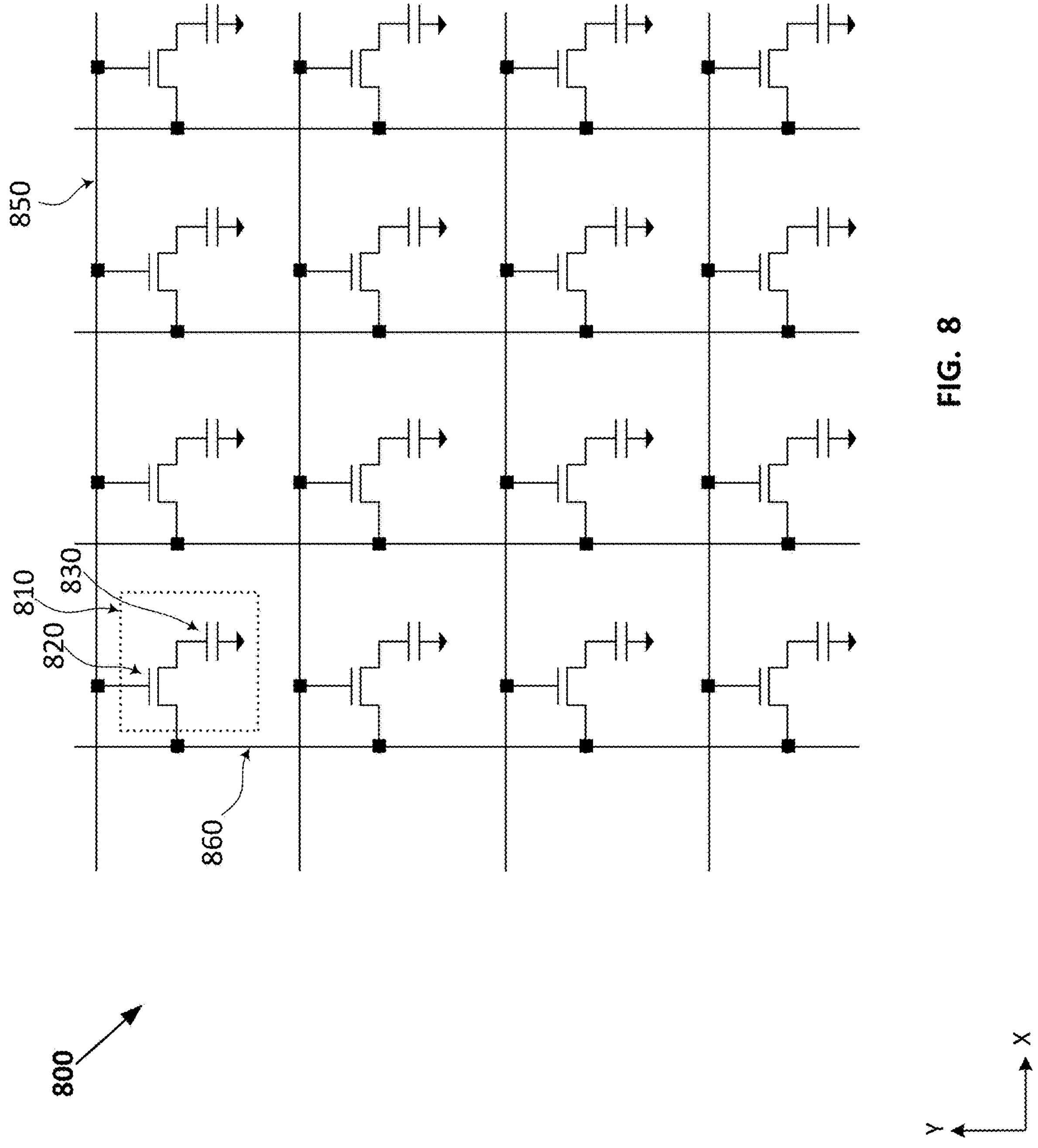
FIG. 8 is a schematic diagram of an illustrative array of dynamic memory cells.

FIG. 8 is a schematic diagram of an illustrative array 800 of dynamic memory cells 810. Each dynamic memory cell in array 800 includes a field effect transistor (FET) 820 and a capacitor 830. The dynamic memory cells 810 are arranged in rows and columns to form a two-dimensional array, i.e., array 800. In the example of FIG. 8, array 800 has four rows and four columns. Thus, the four-by-four arrangement of illustrative array 800 provides sixteen dynamic memory cells 810. Various arrays, in accordance with this disclosure, may be made in any combination of rows and columns, and the illustrative four-by-four array shown in FIG. 8, is not a limitation on the size of an array 800 in accordance with this disclosure.

Still referring to FIG. 8, a gate terminal of FET 820 is coupled to a word line 850, a first source/drain (S/D) terminal of FET 820 is coupled to a bit line 860, a second S/D terminal of FET 820 is coupled to a first terminal of capacitor 830, and a second terminal of capacitor 830 is coupled to a ground node. This arrangement is sometimes referred to as a "1T1C" memory cell, also known as a one-transistor, one-capacitor memory cell. In a 1T1C memory cell, there is one transistor and one capacitor per memory cell. The transistor acts as the access device, controlling the flow of charge to and from the capacitor. The capacitor is used to store and hold the charge, representing the data stored in the memory cell. The basic operation of a 1T1C memory cell involves two main states, i.e., the charged state and the discharged state. The charged state may represent a "1" bit, and the discharged state may represent a "0" bit. During a write operation, the transistor is used to couple the capacitor to a voltage source or ground via a bit line, allowing charge to be transferred onto or discharged from the capacitor. This write operation modifies the charge stored in the capacitor, thereby storing the desired data. During a read operation, the transistor is used to couple the capacitor to a sense amplifier via the bit line, which detects and amplifies the charge stored in the capacitor. The amplified signal is then interpreted as the stored data.

It will be appreciated by those skilled in the art that alternative dynamic memory cell circuit arrangements are possible, and implementations in accordance with this disclosure are not limited to 1T1C memory cells.

Figure 9:
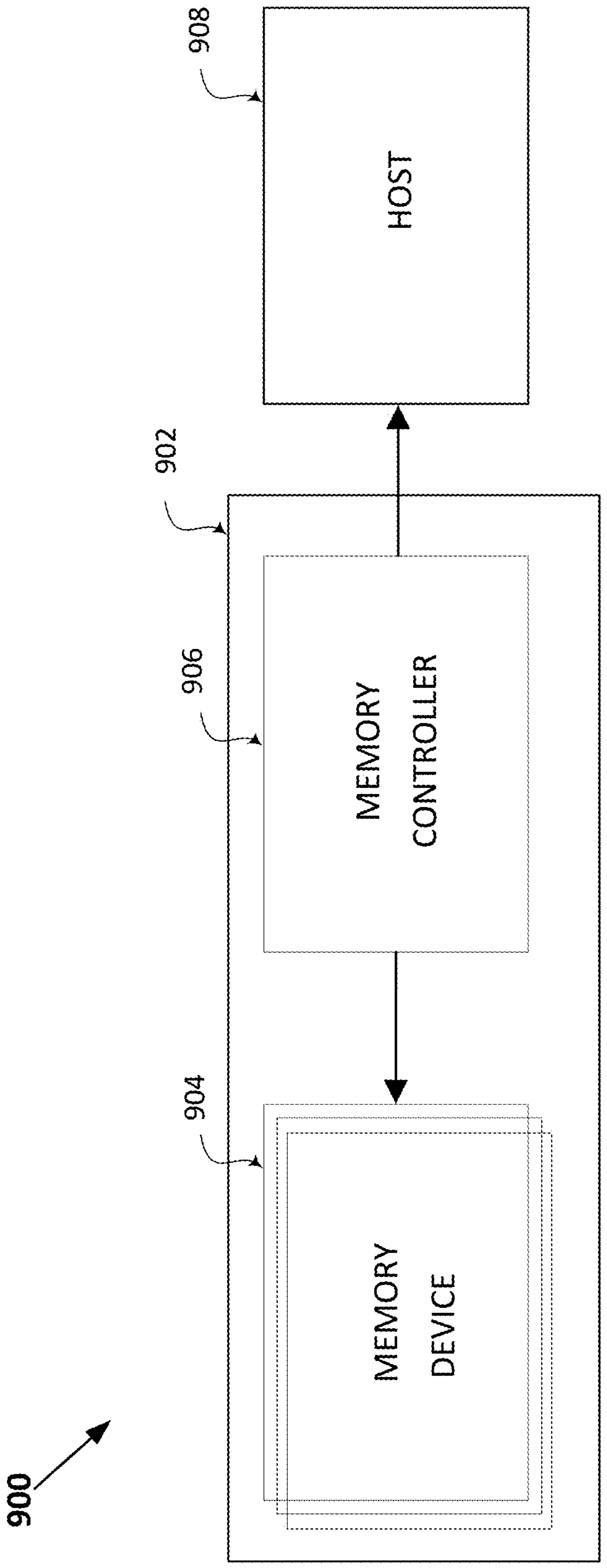
FIG. 9 is a block diagram of a memory system.

FIG. 9 is a block diagram of an illustrative system 900. System 900 includes a memory system 902 that includes one or more memory devices 904, and a memory controller 906 that is coupled to memory devices 904. System 900 further includes a host 908. Host 908 may be a computational resource such as, but not limited to, a computer, personal computer, a server, a microprocessor system, a microcontroller system, an industrial control system, and so on. In illustrative system 900, memory controller 906 communicates with both memory devices 904 and host 908. Memory controller 906 provides control signals to memory devices 904, transfers data to be written from host 908 to memory devices 904, and transfers data to be read from memory devices 904 to host 908. In some systems, transferring data from memory devices 904 to host 908 is referred to as a "load" operation, and transferring data from host 908 to memory device 904 is referred to as a "store" operation.

The foregoing description of the specific implementations will so reveal the general nature of the present disclosure that others can, by applying knowledge within the skill of the art, readily modify and/or adapt for various applications of such specific implementations, without undue experimentation, and without departing from the general concept of the present disclosure. Therefore, such adaptations and modifications are intended to be within the meaning and range of equivalents of the disclosed implementations, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Implementations of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all implementations of the present disclosure as contemplated by the inventor(s), and thus, are not intended to limit the present disclosure and the subjoined claims in any way.

The breadth and scope of the present disclosure should not be limited by any of the above-described illustrative implementations, but should be defined only in accordance with the subjoined claims and their equivalents.

Although specific configurations and arrangements are discussed, it should be understood that this is done for illustrative purposes only. As such, other configurations and arrangements can be used without departing from the scope of the present disclosure. Also, the subject matter as described in the present disclosure can also be used in a variety of other applications. Functional and structural features as described in the present disclosures can be combined, adjusted, modified, and rearranged with one another and in ways that are consistent with the scope of the present disclosure.

What is claimed is:

1. A structure, comprising:

a first vertically-oriented semiconductor pillar having one or more sidewalls, and a top surface, the first vertically-oriented semiconductor pillar having a first width;

a first dielectric material abutted to the one or more sidewalls of the first vertically-oriented semiconductor pillar;

a second vertically-oriented semiconductor pillar having one or more sidewalls, and a top surface;

a first conductive structure having a first surface, and having a second width that is greater than the first width, the first conductive structure disposed such that a second portion of its first surface is in contact with the top surface of the first vertically-oriented semiconductor pillar;

a second conductive structure is disposed on the top surface of the second vertically-oriented semiconductor pillar; and a first dielectric plug disposed between the first conductive structure and the second conductive structure, wherein a first portion of the first surface of the first conductive structure extends laterally beyond the top surface of the first vertically-oriented semiconductor pillar, and the first portion of the first surface is disposed on the first dielectric material;

a top surface of the first dielectric plug is coplanar with a top surface of the first conductive structure; and a bottom surface of the first dielectric plug is in contact with a top surface of the first dielectric material.

2. The structure of claim 1, wherein the first vertically-oriented semiconductor pillar is integral with a semiconductor substrate.

3. The structure of claim 2, wherein the second vertically-oriented semiconductor pillar is abutted on at least one of its one or more sidewalls by at least the first dielectric material, wherein a first portion of the second conductive structure is disposed on the top surface of the second vertically-oriented semiconductor pillar, and is in contact therewith, wherein the first conductive structure comprises a first metal silicide structure, and the second conductive structure comprises a second metal silicide structure.

4. The structure of claim 3, wherein the first dielectric plug is disposed between the first metal silicide structure and the second metal silicide structure.

5. The structure of claim 4, wherein the first dielectric plug comprises silicon nitride.

6. The structure of claim 3, wherein the first metal silicide structure has an area that is greater than an area of the top surface of the first vertically-oriented semiconductor pillar, and the second metal silicide structure has an area that is greater than the top surface of the second vertically-oriented semiconductor pillar.

7. The structure of claim 6, wherein the first metal silicide structure has a resistivity that is less than a resistivity of the first vertically-oriented semiconductor pillar, and the second metal silicide structure has a resistivity that is less than a resistivity of the second vertically-oriented semiconductor pillar.

8. The structure of claim 3, wherein the first dielectric plug is disposed on the first dielectric material.

9. A structure, comprising:

a first vertically-oriented semiconductor pillar, a second vertically-oriented semiconductor pillar, and a third vertically-oriented semiconductor pillar, the first, second, and third vertically-oriented semiconductor pillars each having at least one sidewall, and each having a corresponding top surface;

a first vertically-oriented gate structure disposed adjacent to the at least one sidewall of the first vertically-oriented semiconductor pillar;

a first dielectric structure having a top surface, comprising a first dielectric material disposed adjacent to the first vertically-oriented gate structure;

a second dielectric structure comprising a second dielectric material disposed adjacent to the top surface of the first dielectric structure; and a first metal silicide structure, a first portion of which is disposed above a first portion of the top surface of the first dielectric structure, and a second portion of which is in electrical contact with the first vertically-oriented semiconductor pillar, wherein a top surface of the second dielectric structure is coplanar with a top surface of the first metal silicide structure.

10. The structure of claim 9, further comprising:

a second vertically-oriented gate structure disposed adjacent to the at least one sidewall of the second vertically-oriented semiconductor pillar; and a third dielectric structure comprising a first lining layer and a second lining layer, wherein the first lining layer is disposed adjacent a first sidewall of the second vertically-oriented semiconductor pillar and is further disposed adjacent to a first sidewall of the third vertically-oriented semiconductor pillar, and the second lining layer is disposed adjacent to the first lining layer.

11. The structure of claim 10, wherein the first vertically-oriented gate structure and the second vertically-oriented gate structure are disposed between the first vertically-oriented semiconductor pillar and the second vertically-oriented semiconductor pillar.

12. The structure of claim 9, wherein the first metal silicide structure is in contact with the top surface and the at least one sidewall of the first vertically-oriented semiconductor pillar.

13. A structure, comprising:

a first vertically-oriented semiconductor pillar having one or more sidewalls, and a top surface, the first vertically-oriented semiconductor pillar having a first width;

a first dielectric material abutted to the one or more sidewalls of the first vertically-oriented semiconductor pillar;

a first dielectric plug on the first dielectric material; and a first conductive structure having a first surface, and having a second width that is greater than the first width, the first conductive structure disposed such that a second portion of its first surface is in contact with the top surface of the first vertically-oriented semiconductor pillar, wherein a first portion of the first surface of the first conductive structure extends laterally beyond the top surface of the first vertically-oriented semiconductor pillar, and the first portion of the first surface is disposed on the first dielectric material, wherein the first conductive structure is in contact with the top surface and the one or more sidewalls of the first vertically-oriented semiconductor pillar; and a bottom surface of the first dielectric plug is in contact with a top surface of the first dielectric material.

14. The structure of claim 13, wherein the first vertically-oriented semiconductor pillar is integral with a semiconductor substrate.

15. The structure of claim 13, further comprising:

a second vertically-oriented semiconductor pillar having one or more sidewalls, and a top surface, wherein the second vertically-oriented semiconductor pillar is abutted on at least one of its one or more sidewalls by at least the first dielectric material, wherein a first portion of a second conductive structure is disposed on the top surface of the second vertically-oriented semiconductor pillar, and is in contact therewith, wherein the first conductive structure comprises a first metal silicide structure, and the second conductive structure comprises a second metal silicide structure.

16. The structure of claim 15, wherein the first dielectric plug is disposed between the first metal silicide structure and the second metal silicide structure.

17. The structure of claim 16, wherein the first dielectric plug comprises silicon nitride.

18. The structure of claim 15, wherein the first metal silicide structure has an area that is greater than an area of the top surface of the first vertically-oriented semiconductor pillar, and the second metal silicide structure has an area that is greater than the top surface of the second vertically-oriented semiconductor pillar.

19. The structure of claim 18, wherein the first metal silicide structure has a resistivity that is less than a resistivity of the first vertically-oriented semiconductor pillar, and the second metal silicide structure has a resistivity that is less than a resistivity of the second vertically-oriented semiconductor pillar.

20. The structure of claim 15, wherein a first dielectric plug is disposed on the first dielectric material.

* * * * *